(12) United States Patent
Sakaike et al.

(10) Patent No.: US 10,103,155 B2
(45) Date of Patent: Oct. 16, 2018

(54) SEMICONDUCTOR MEMORY DEVICE

(71) Applicant: TOSHIBA MEMORY CORPORATION, Minato-ku (JP)

(72) Inventors: Kohei Sakaike, Yokkaichi (JP); Toshiyuki Iwamoto, Mie (JP); Tatsuya Kato, Yokkaichi (JP); Keisuke Kikutani, Yokkaichi (JP); Fumitaka Arai, Yokkaichi (JP); Satoshi Nagashima, Yokkaichi (JP); Koichi Sakata, Yokkaichi (JP); Yuta Watanabe, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/449,481

(22) Filed: Mar. 3, 2017

(65) Prior Publication Data

US 2017/0263615 A1    Sep. 14, 2017

Related U.S. Application Data

(60) Provisional application No. 62/305,783, filed on Mar. 9, 2016.

(51) Int. Cl.
*H01L 27/11519* (2017.01)
*H01L 27/11524* (2017.01)
*H01L 27/11556* (2017.01)

(52) U.S. Cl.
CPC .. *H01L 27/11519* (2013.01); *H01L 27/11524* (2013.01); *H01L 27/11556* (2013.01)

(58) Field of Classification Search
CPC ......... H01L 27/11519; H01L 27/11524; H01L 27/11556
See application file for complete search history.

(56) References Cited

U.S. PATENT DOCUMENTS 7,820,516 B2    10/2010    Yang et al.
8,084,819 B2    12/2011    Kim et al.
(Continued)

FOREIGN PATENT DOCUMENTS

JP    2008-10868    1/2008
JP    2010-157734    7/2010
(Continued)

*Primary Examiner* — Mark Prenty
(74) *Attorney, Agent, or Firm* — Oblon, McClelland, Maier & Neustadt, L.L.P.

(57) ABSTRACT

A semiconductor memory device according to an embodiment, includes a first semiconductor member, a second semiconductor member, an insulating member, a plurality of electrode films, a first electrode, and a second electrode. The first semiconductor member and the second semiconductor member are separated in a first direction and extending in a second direction. The second direction crosses the first direction. The insulating member is provided between the first semiconductor member and the second semiconductor member. The plurality of electrode films are arranged to be separated from each other along the second direction. Each of the electrode films surrounds the first semiconductor member, the second semiconductor member, and the insulating member when viewed from the second direction. The first electrode is provided between the first semiconductor member and the electrode film. The second electrode is provided between the second semiconductor member and the electrode film.

21 Claims, 62 Drawing Sheets

(56) References Cited

U.S. PATENT DOCUMENTS

| | | | |
|---|---|---|---|
| 8,330,208 B2 | 12/2012 | Alsmeier et al. | |
| 8,361,862 B2 | 1/2013 | Fukuzumi et al. | |
| 8,436,414 B2 | 5/2013 | Tanaka et al. | |
| 8,952,441 B2 | 2/2015 | Sakuma et al. | |
| 9,012,971 B2 | 4/2015 | Seo et al. | |
| 9,166,032 B1 * | 10/2015 | Higuchi | H01L 27/11556 |
| 9,553,103 B2 * | 1/2017 | Sakui | H01L 29/7889 |
| 2013/0221423 A1 | 8/2013 | Kawasaki et al. | |

FOREIGN PATENT DOCUMENTS

| | | |
|---|---|---|
| JP | 2010-192569 | 9/2010 |
| JP | 2010-205904 | 9/2010 |
| JP | 2013-534058 | 8/2013 |
| JP | 2013-182949 | 9/2013 |
| JP | 2013-239622 | 11/2013 |
| JP | 2014-96466 | 5/2014 |

* cited by examiner

SEMICONDUCTOR MEMORY DEVICE

CROSS-REFERENCE TO RELATED APPLICATIONS

This application is based upon and claims the benefit of priority from U.S. Provisional Patent Application 62/305,783, filed on Mar. 9, 2016; the entire contents of which are incorporated herein by reference.

FIELD

Embodiments relate to a semiconductor memory device.

BACKGROUND

In recent years, a stacked type semiconductor memory device has been proposed in which memory cells are integrated three-dimensionally. In such a stacked type semiconductor memory device, a stacked body in which electrode films and insulating films are stacked alternately on a semiconductor substrate is provided; and semiconductor members that extend in the stacking direction are provided. Then, memory cells are formed at each crossing portion of the electrode films and the semiconductor members. In such a stacked type semiconductor memory device as well, even higher integration is desirable.

DETAILED DESCRIPTION

A semiconductor memory device according to an embodiment, includes a first semiconductor member, a second semiconductor member, an insulating member, a plurality of electrode films, a first electrode, and a second electrode. The first semiconductor member and the second semiconductor member are separated in a first direction and extending in a second direction. The second direction crosses the first direction. The insulating member is provided between the first semiconductor member and the second semiconductor member. The plurality of electrode films are arranged to be separated from each other along the second direction. Each of the electrode films surrounds the first semiconductor member, the second semiconductor member, and the insulating member when viewed from the second direction. The first electrode is provided between the first semiconductor member and the electrode film. The second electrode is provided between the second semiconductor member and the electrode film.

First Embodiment

First, a first embodiment will be described.

Figure 1:
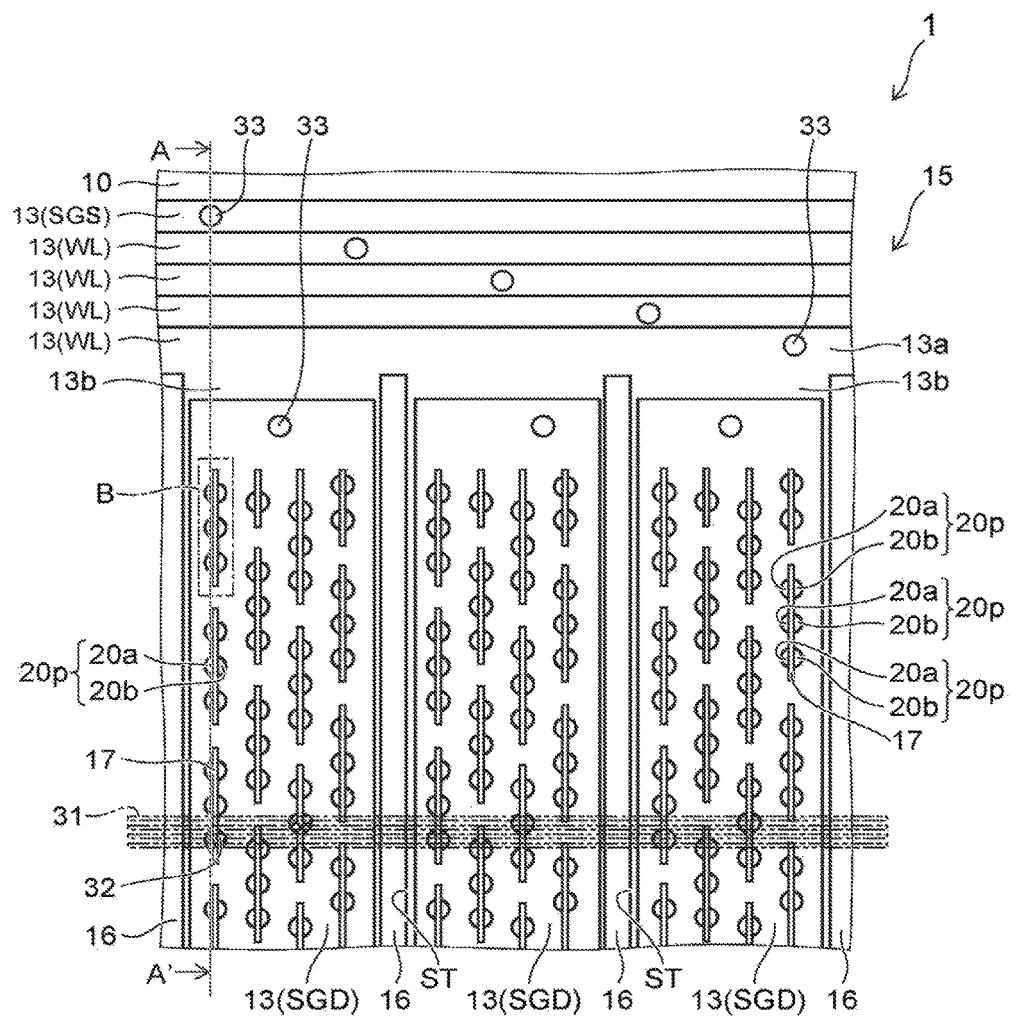
FIG. 1 is a plan view showing a semiconductor memory device according to a first embodiment.

FIG. 1 is a plan view showing a semiconductor memory device according to the embodiment.

Figure 2:
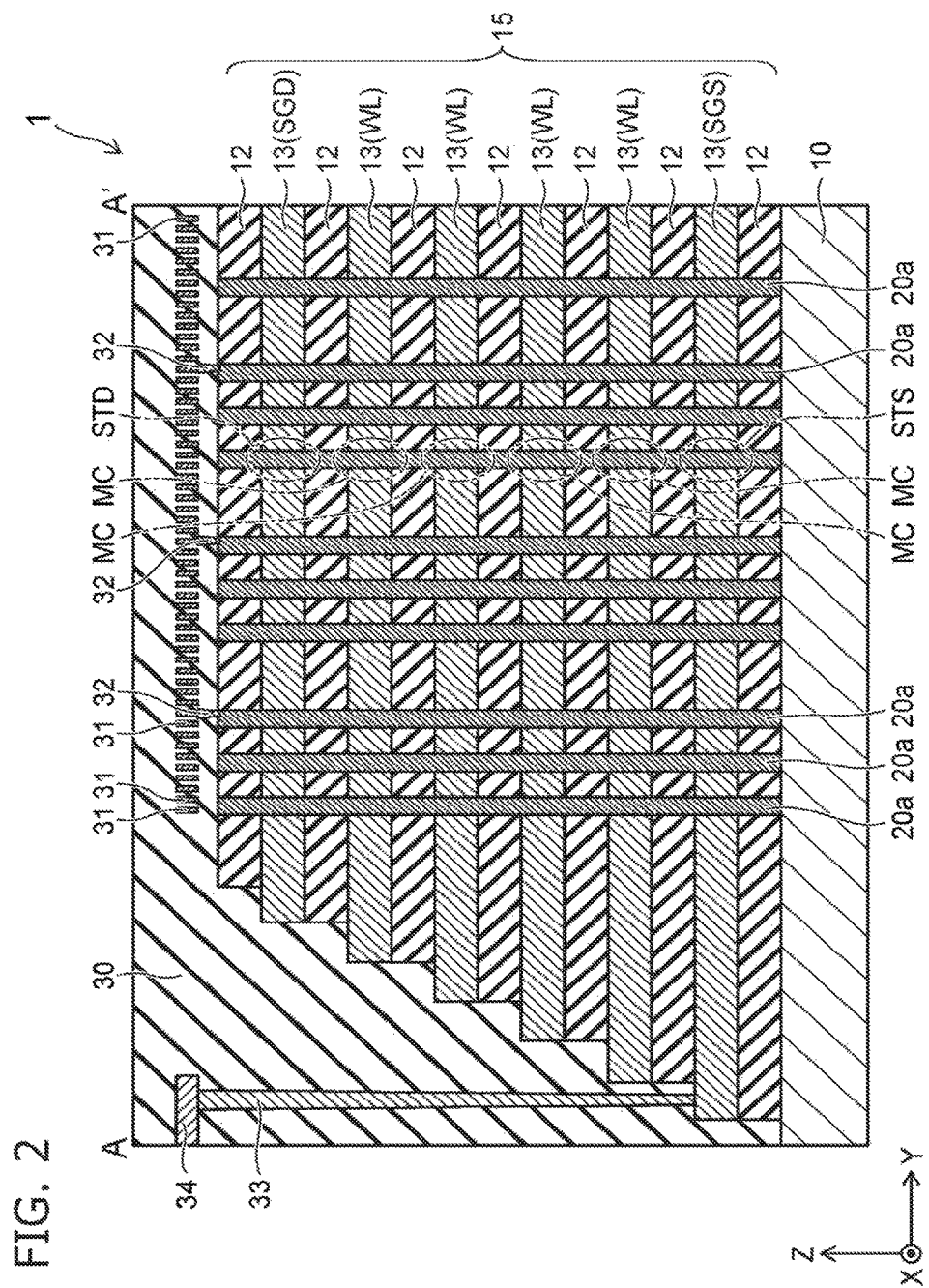
FIG. 2 is a cross-sectional view along line A-A' shown in FIG. 1.

FIG. 2 is a cross-sectional view along line A-A' shown in FIG. 1.

Figure 3:
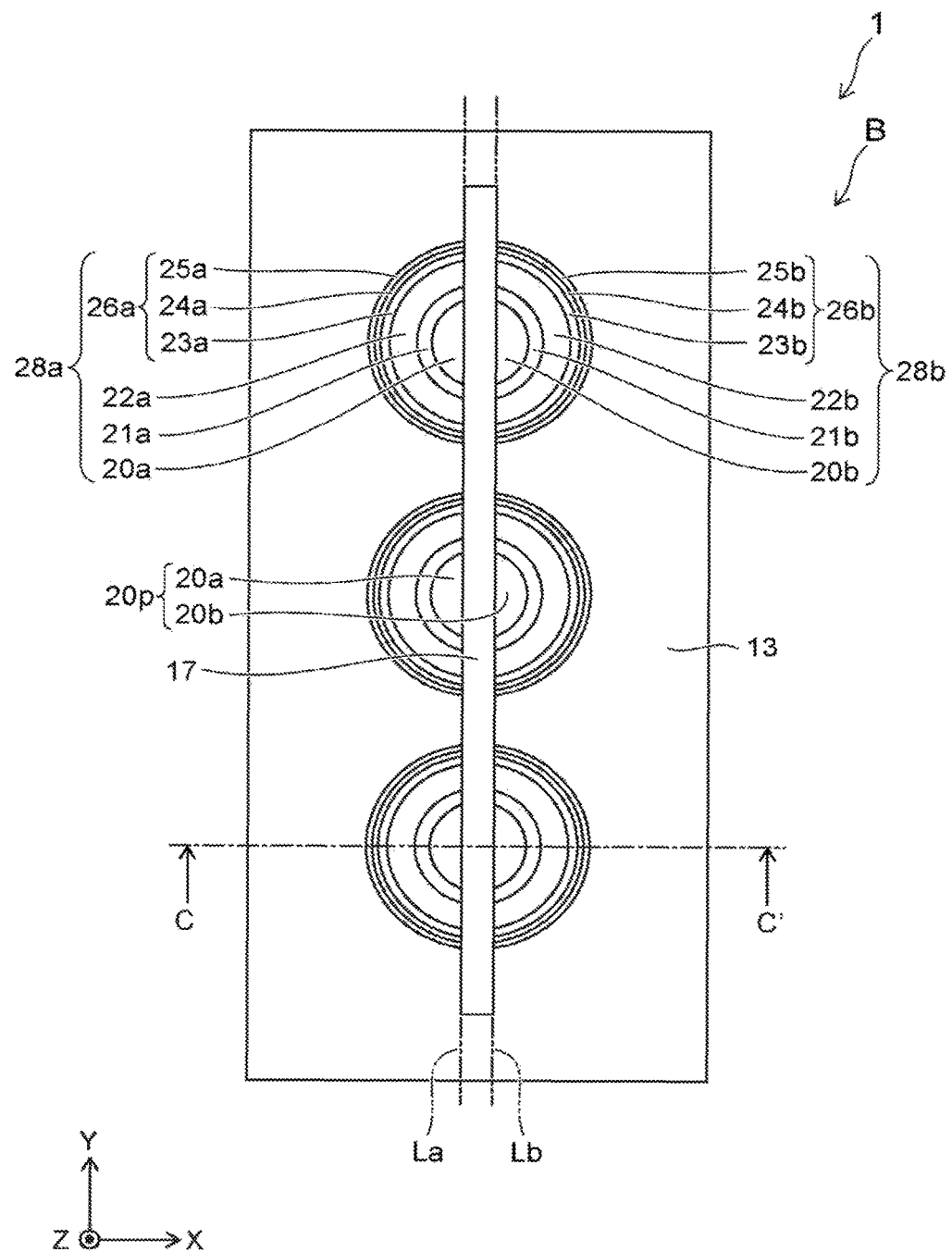
FIG. 3 is a plan view showing region B of FIG. 1.

FIG. 3 is a plan view showing region B of FIG. 1.

Figure 4:
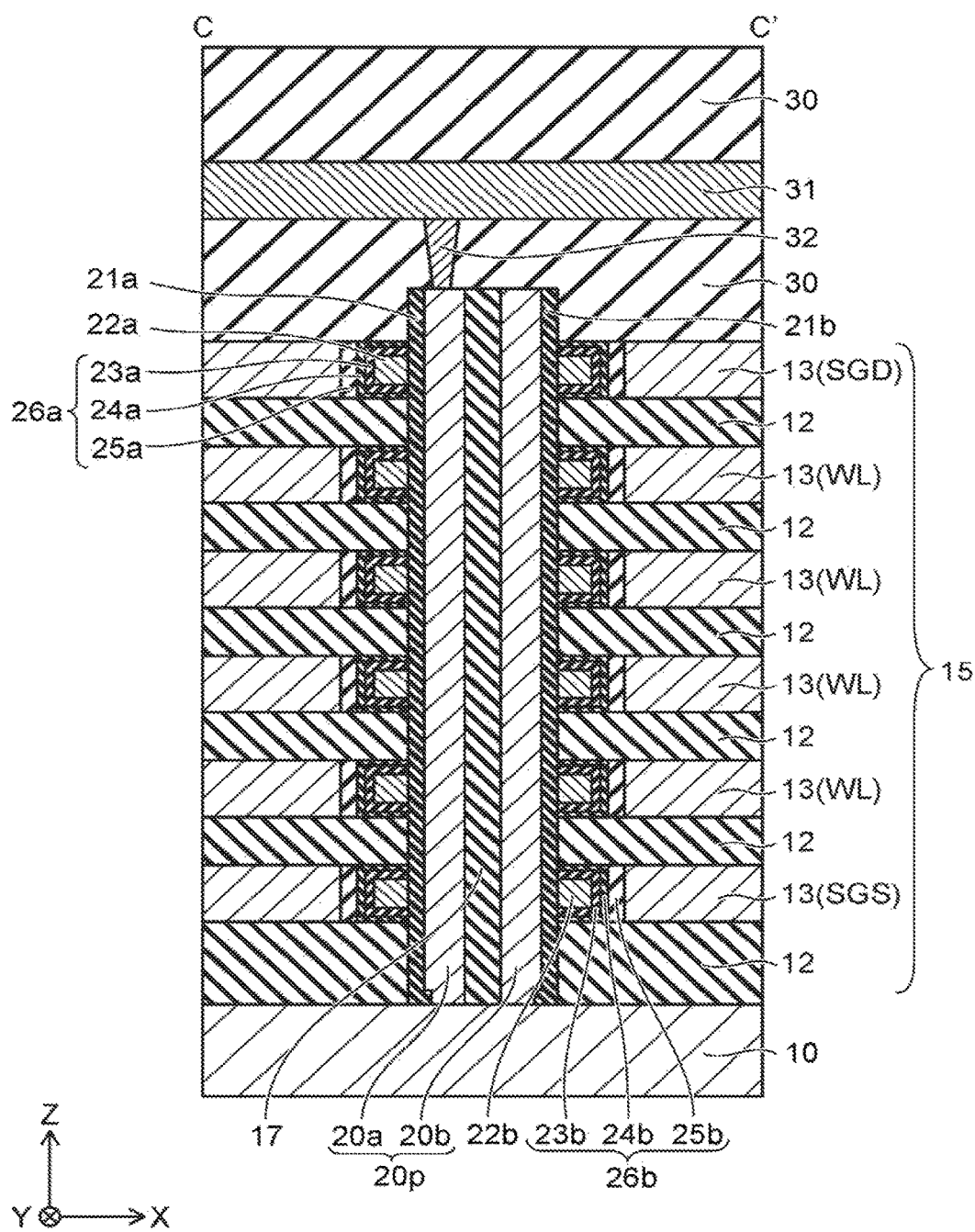
FIG. 4 is a cross-sectional view along line C-C' shown in FIG. 3.

FIG. 4 is a cross-sectional view along line C-C' shown in FIG. 3.

As shown in FIG. 1 and FIG. 2, a silicon substrate 10 is provided in the semiconductor memory device 1 according to the embodiment. For example, the silicon substrate 10 is formed of a monocrystal of silicon (Si). A stacked body 15 is provided on the silicon substrate 10.

In the specification hereinbelow, an XYZ orthogonal coordinate system is employed for convenience of description. A direction connecting the silicon substrate 10 and the stacked body 15 is taken as a "Z-direction;" and two mutually-orthogonal directions orthogonal to the Z-direction are taken as an "X-direction" and a "Y-direction." Also, for the Z-direction, although a direction from the silicon substrate 10 toward the stacked body 15 also is called "up," and the reverse direction also is called "down," these notations are for convenience and are independent of the direction of gravity.

In the stacked body 15, insulating films 12 and electrode films 13 are stacked alternately along the Z-direction. For example, the insulating films 12 are formed of an insulating material such as silicon oxide (SiO), etc.; and, for example, the electrode films 13 are formed of a conductive material such as tungsten (W), etc. An air gap may be formed inside the insulating films 12. The configurations of the two Y-direction end portions of the stacked body 15 are stairstep configurations in which a step is formed every electrode film 13.

Multiple insulating plates 16 are provided to be separated from each other in the X-direction inside the stacked body 15. The configurations of the insulating plates 16 are plate configurations spreading along the YZ plane. For the insulating plate 16, the length in the Y-direction is the longest; the length in the Z-direction is next longest; and the length in the X-direction is the shortest. For example, the insulating plate 16 is formed of an insulating material such as silicon oxide, etc. Among the electrode films 13 included in the stacked body 15, the electrode film 13 of one level or multiple levels from the upper side is divided by the insulating plates 16 and used as multiple upper selection gate lines SGD extending in the Y-direction. In the embodiment, one electrode film 13 of the uppermost level is used as the upper selection gate lines SGD. The other electrode films 13 are not divided completely by the insulating plates 16 and have comb-shaped configurations. In other words, in each of the electrode films 13, one base portion 13a that extends in the X-direction and multiple fingers 13b that extend in the Y-direction are provided as one body. Among these electrode films 13 having the comb-shaped configurations, the electrode film 13 of one level or multiple levels from the lower side is used as a lower selection gate line SGS; and the other electrode films 13 are used as word lines WL. In the embodiment, one electrode film 13 of the lowermost level is used as the lower selection gate line SGS.

Silicon pillars 20a and 20b that extend in the Z-direction each are multiply provided inside the stacked body 15. For example, the silicon pillars 20a and 20b are made of polysilicon; and the configurations of the silicon pillars 20a and 20b substantially are semicircular columns or inverted truncated semicircular cones. The lower ends of the silicon pillars 20a and 20b are connected to the silicon substrate 10.

A pair 20p is formed of one silicon pillar 20a and one silicon pillar 20b. The silicon pillar 20a and the silicon pillar 20b that belong to one pair 20p are separated from each other in the X-direction. The configurations of the silicon pillars 20a and 20b substantially are mutually-different portions of one circular column or inverted truncated circular cone. In other words, when viewed from the Z-direction, the outer edge of the silicon pillar 20a and the outer edge of the silicon pillar 20b belonging to one pair 20p are different portions, i.e., different circular arcs, of one circle.

The pairs 20p are arranged along multiple columns extending in the Y-direction. In each of the fingers 13b, for example, four columns of the pairs 20p are provided; and the positions in the Y-direction of the pairs 20p are different between the columns.

An insulating member 17 is provided between the silicon pillar 20a and the silicon pillar 20b belonging to the pair 20p. The configuration of the insulating member 17 is a rectangular configuration spreading along the YZ plane. The length in the Y-direction of the insulating member 17 is longer than the length in the X-direction. The one insulating member 17 pierces multiple pairs 20p, e.g., three pairs 20p, arranged to be continuous along the Y-direction. Accordingly, the finger 13b of the electrode film 13 is pierced by the multiple insulating members 17.

The electrode film 13 is interposed between the insulating members 17 adjacent to each other in the Y-direction. Therefore, when viewed from the Z-direction, one insulating member 17 and three pairs of the silicon pillars 20a and 20b having the insulating member 17 interposed between the silicon pillars 20a and 20b are surrounded with the electrode film 13. The multiple insulating members 17 that pierce one finger 13b are arranged along multiple columns extending in the Y-direction. The positions of the insulating members 17 in the Y-direction are different from each other between the columns.

Multiple bit lines 31 that extend in the X-direction are provided on the stacked body 15. Each of the bit lines 31 is connected to the silicon pillar 20a or 20b via a plug 32. In other words, the silicon pillars 20a and 20b that belong to the same pair 20p are connected to mutually-different bit lines 31.

Contacts 33 and draw-out interconnects 34 are provided on a Y-direction end portion of the stacked body 15. The lower ends of the contacts 33 are connected to the Y-direction end portions of the upper selection gate lines SGD and the base portions 13a of the electrode films 13 used as the word lines WL and the lower selection gate line SGS; and the upper ends of the contacts 33 are connected to the draw-out interconnects 34.

An inter-layer insulating film 30 that is made of, for example, silicon oxide is provided on the silicon substrate 10 to cover the stacked body 15, the plugs 32, the bit lines 31, the contacts 33, and the draw-out interconnects 34. In FIG. 1, the inter-layer insulating film 30 and the draw-out interconnects 34 are not illustrated for easier viewing of the drawing. Also, only some of the bit lines 31 are shown by double dot-dash lines. Also, only some of the plugs 32 are shown.

As shown in FIG. 3 and FIG. 4, a tunneling insulating film 21a is provided on the side surface of the silicon pillar 20a facing the electrode films 13. The configuration of the tunneling insulating film 21a is a substantially semicircular tube. Although the tunneling insulating film 21a normally is insulative, the tunneling insulating film 21a is a film in which a tunneling current flows when a prescribed voltage within the range of the drive voltage of the semiconductor memory device 1 is applied. For example, the tunneling insulating film 21a may be a single-layer silicon oxide film, or may be an ONO film in which a silicon oxide layer, a silicon nitride layer, and a silicon oxide layer are stacked in this order.

A floating gate electrode 22a is provided between the insulating films 12 adjacent to each other in the Z-direction in the region between the tunneling insulating film 21a and the electrode film 13. The configuration of the floating gate electrode 22a is a substantially semicircular ring configuration and is disposed on the two Y-direction sides of the silicon pillar 20a and on the side of the silicon pillar 20a opposite to the silicon pillar 20b in the X-direction. The multiple floating gate electrodes 22a are provided along the Z-direction on the side surfaces of one silicon pillar 20a and the tunneling insulating film 21a provided on the side surface of the one silicon pillar 20a. For example, the floating gate electrode 22a is formed of polysilicon.

A silicon nitride layer 23a is provided on the upper surface of the floating gate electrode 22a, on the lower surface of the floating gate electrode 22a, and on the side surface of the floating gate electrode 22a facing the electrode film 13; and a hafnium silicon oxide layer (a HfSiO layer) 24a is provided on the upper surface of the silicon nitride layer 23a, on the lower surface of the silicon nitride layer 23a, and on the side surface of the silicon nitride layer 23a facing the electrode film 13. A silicon oxide layer 25a is provided on the side surface of the hafnium silicon oxide layer 24a facing the electrode film 13. A blocking insulating film 26a includes the silicon nitride layer 23a, the hafnium silicon oxide layer 24a, and the silicon oxide layer 25a. The blocking insulating film 26a is a film in which a current substantially does not flow even when a voltage within the range of the drive voltage of the semiconductor memory device 1 is applied. A columnar body 28a includes the silicon pillar 20a, the tunneling insulating film 21a, the multiple floating gate electrodes 22a, and the multiple blocking insulating films 26a.

Similarly, a tunneling insulating film 21b, a floating gate electrode 22b, a silicon oxide layer 23b, a hafnium silicon oxide layer 24b, and a silicon oxide layer 25b are provided between the silicon pillar 20b and the electrode film 13; and a blocking insulating film 26b includes the silicon oxide layer 23b, the hafnium silicon oxide layer 24b, and the silicon oxide layer 25b. A columnar body 28b includes the silicon pillar 20b, the tunneling insulating film 21b, the multiple floating gate electrodes 22b, and the multiple blocking insulating films 26b. For easier viewing of the drawings, the tunneling insulating films 21a and 21b, the floating gate electrodes 22a and 22b, and the blocking insulating films 26a and 26b are not illustrated in FIG. 1 and FIG. 2. The blocking insulating films 26a and 26b may be five-layer films of (SiN/SiO/SiN/SiO/SiN). The composition ratio is, for example, $(Si_3N_4/SiO_2/Si_3N_4/SiO_2/Si_3N_4)$.

The configurations of the floating gate electrodes 22a and 22b are mutually-different portions of one circular ring. In other words, when viewed from the Z-direction, one pair of the outer edge of the floating gate electrode 22a on the electrode film 13 side and the outer edge of the floating gate electrode 22b on the electrode film 13 side is different portions, i.e., different circular arcs, of one circle. Also, the configurations of the blocking insulating films 26a and 26b are mutually-different portions of one circular ring and are substantially semicircular ring configurations having C-shaped cross sections surrounding the floating gate electrodes 22a and 22b from three directions. In other words, when viewed from the Z-direction, one pair of the outer edge of the blocking insulating film 26a on the electrode film 13 side and the outer edge of the blocking insulating film 26b on the electrode film 13 side is different portions, i.e., different circular arcs, of one circle.

When viewed from the Z-direction, the interface between the silicon pillar 20a and the insulating member 17, the interface between the floating gate electrode 22a and the insulating member 17, and the interface between the blocking insulating film 26a and the insulating member 17 are positioned on one straight line La. Also, the interface between the silicon pillar 20b and the insulating member 17, the interface between the floating gate electrode 22b and the insulating member 17, and the interface between the blocking insulating film 26b and the insulating member 17 are positioned on one other straight line Lb.

As shown in FIG. 2, an upper selection gate transistor STD is configured at each crossing portion between the upper selection gate line SGD and the silicon pillar 20a or 20b. A lower selection gate transistor STS is configured at each crossing portion between the lower selection gate line SGS and the silicon pillar 20a or 20b. Memory cell transistors MC are configured at each crossing portion between the word lines WL and the silicon pillar 20a or 20b. The floating gate electrodes 22a and 22b function as charge storage members of the memory cell transistors MC. Thereby, a NAND string is formed by the multiple memory cell transistors MC being connected in series along the silicon pillar 20a or 20b and by the lower selection gate transistor STS and the upper selection gate transistor STD being connected to the two ends of the silicon pillar 20a or 20b.

A method for manufacturing the semiconductor memory device according to the embodiment will now be described.

FIG. 5A to FIG. 12B are cross-sectional views showing the method for manufacturing the semiconductor memory device according to the embodiment.

Figure 5A:
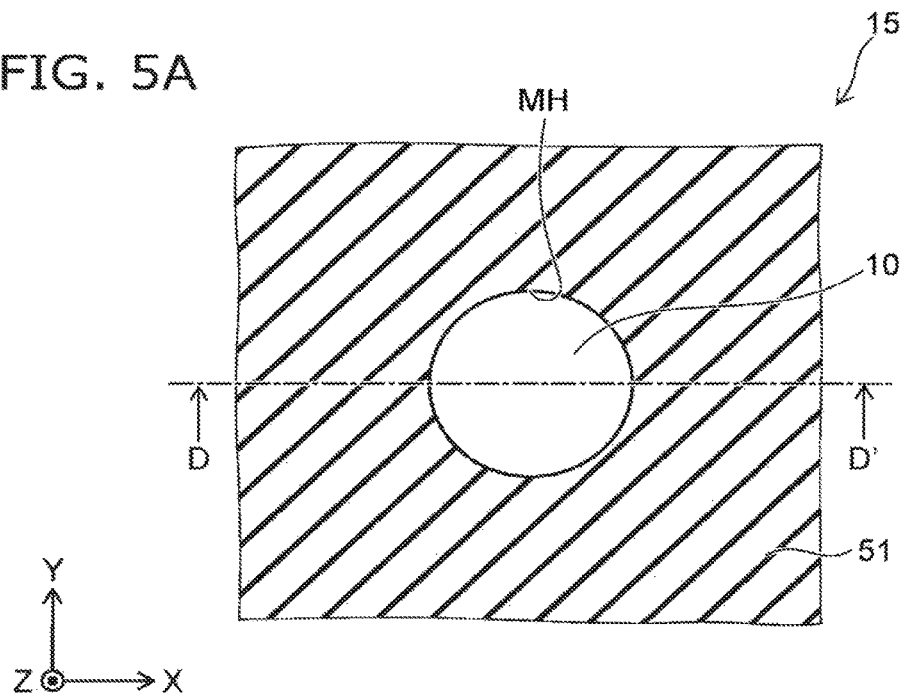
FIG. 5A to FIG. 12B are cross-sectional views showing a method for manufacturing a semiconductor memory device according to the first embodiment.
Figure 5B:
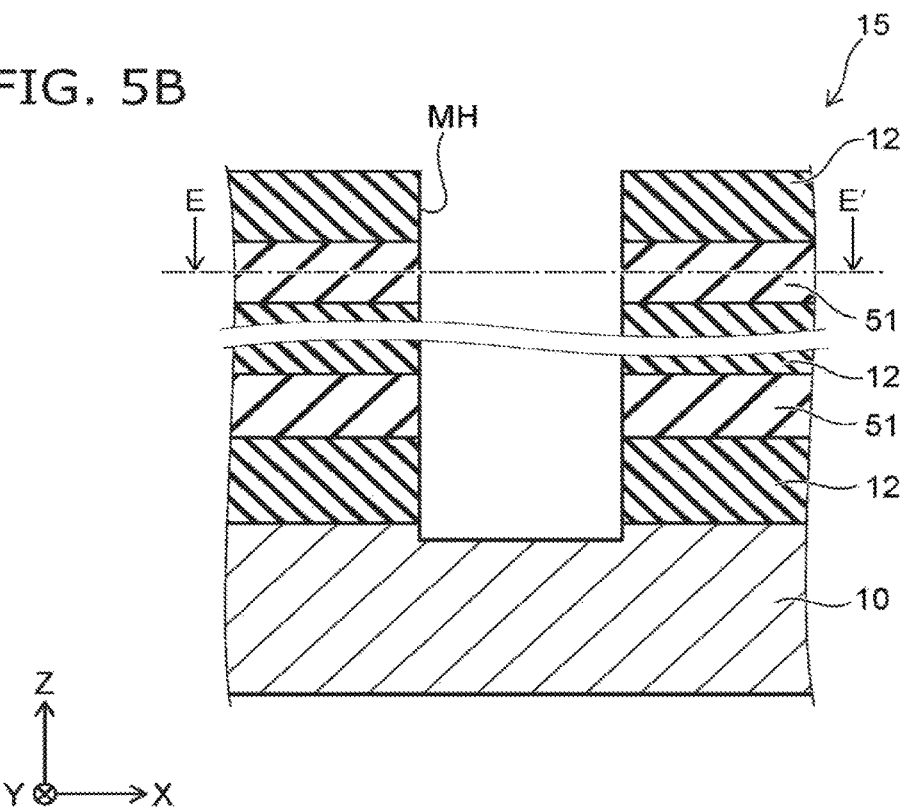

FIG. 5A and FIG. 5B show the same process; FIG. 5B is a cross-sectional view along line D-D' shown in FIG. 5A; and FIG. 5A is a cross-sectional view along line E-E' shown in FIG. 5B. This is similar for FIG. 6A to FIG. 12B as well.

First, as shown in FIG. 5A and FIG. 5B, the stacked body 15 is formed by forming the insulating films 12 and sacrificial films 51 alternately on the silicon substrate 10. At this time, the uppermost level is the insulating film 12. For example, the insulating films 12 are formed by depositing silicon oxide (SiO, e.g., $SiO_2$); and, for example, the sacrificial films 51 are formed by depositing silicon nitride (SiN, e.g., $Si_3N_4$). Then, the end portion of the stacked body 15 is patterned into a stairstep configuration. Then, for example, a memory hole MH is formed in the stacked body 15 by lithography and RIE (Reactive Ion Etching).

Figure 6A:
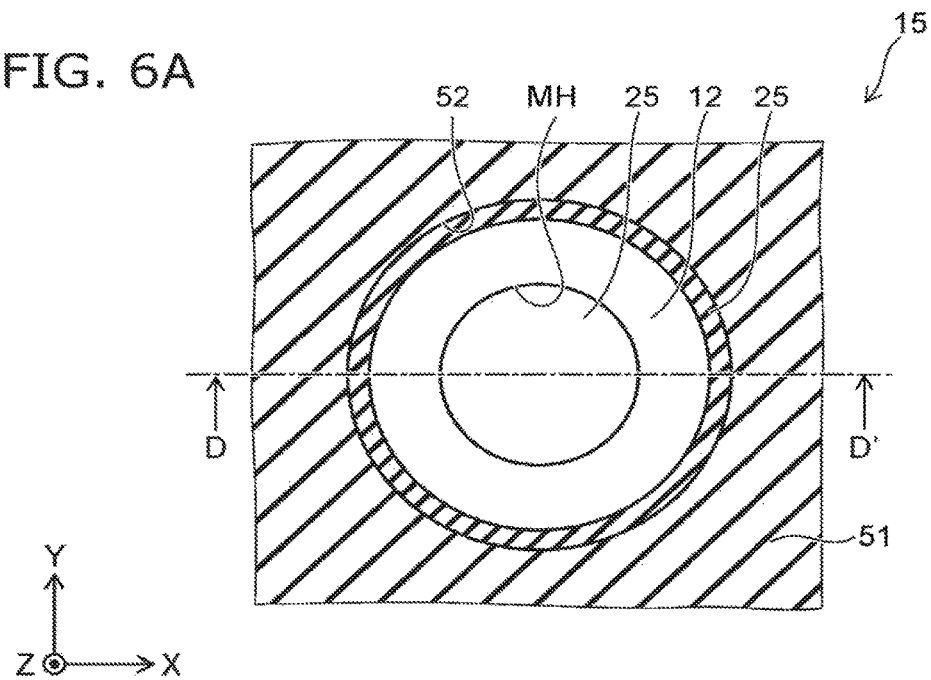
Figure 6B:
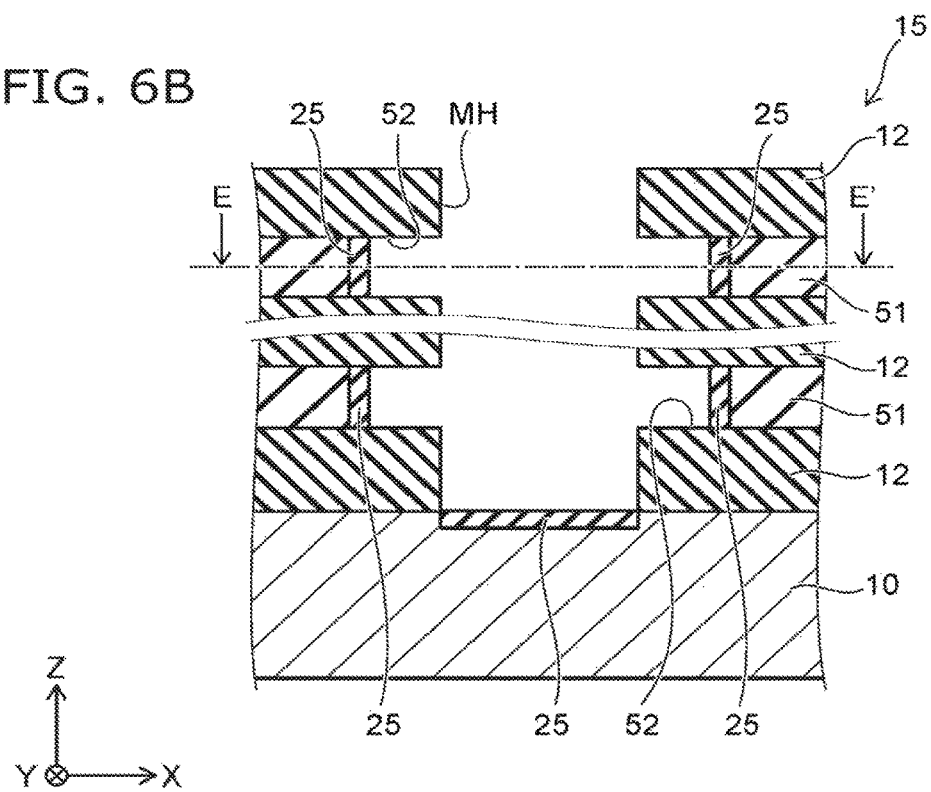

Then, as shown in FIG. 6A and FIG. 6B, the sacrificial films 51 are recessed via the memory hole MH. For example, wet etching is performed using hot phosphoric acid as the etchant. Thereby, recesses 52 that have circular ring configurations are formed in the regions of the inner surface of the memory hole MH where the sacrificial films 51 are exposed.

Then, oxidation treatment is performed. Thereby, at the back surfaces of the recesses 52, the sacrificial films 51 are oxidized; and silicon oxide layers 25 are formed. The silicon oxide layer 25 is formed also in the exposed region of the silicon substrate 10 at the bottom surface of the memory hole MH.

Figure 7A:
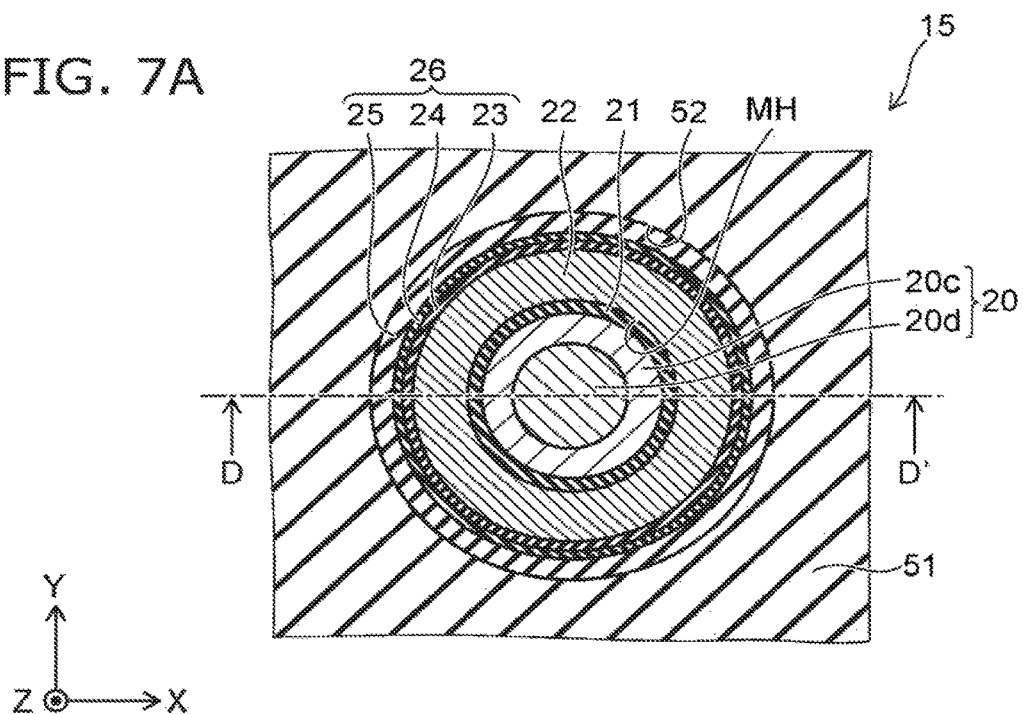
Figure 7B:
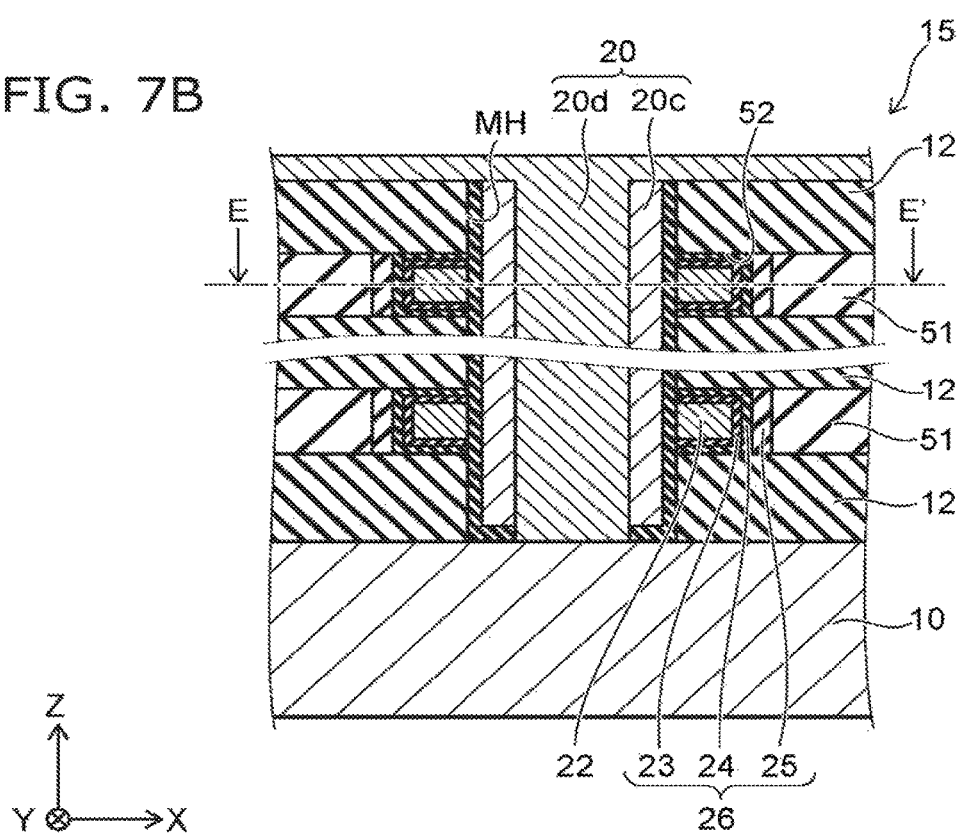

Then, as shown in FIG. 7A and FIG. 7B, a hafnium silicon oxide layer 24 is formed on the memory hole MH and the inner surfaces of the recesses 52 by depositing hafnium silicon oxide (HfSiO) on the entire surface. Then, a silicon nitride layer 23 is formed on the surface of the hafnium silicon oxide layer 24 by depositing silicon nitride on the entire surface. Then, a silicon film 22 is formed on the surface of the silicon nitride layer 23 by depositing silicon.

Then, by performing etching, the portions of the silicon film 22, the silicon nitride layer 23, the hafnium silicon oxide layer 24, and the silicon oxide layer 25 formed inside the memory hole MH are removed while causing the portions of the silicon film 22, the silicon nitride layer 23, the hafnium silicon oxide layer 24, and the silicon oxide layer 25 formed inside the recesses 52 to remain. For example, the etching can be wet etching, dry etching, or CDE (Chemical Dry Etching). Thereby, the silicon film 22, the silicon nitride layer 23, and the hafnium silicon oxide layer 24 are divided every recess 52; and the silicon oxide layer 25 that is formed on the bottom surface of the memory hole MH is removed. A blocking insulating film 26 is formed of the silicon nitride layer 23, the hafnium silicon oxide layer 24, and the silicon oxide layer 25 inside each of the recesses 52.

Then, a tunneling insulating film 21 is formed on the inner surface of the memory hole MH. Then, a cover silicon layer 20c is formed on the surface of the tunneling insulating film 21 by depositing silicon. Then, the silicon substrate 10 is exposed by removing the cover silicon layer 20c and the tunneling insulating film 21 that are on the bottom surface of the memory hole MH by performing anisotropic etching such as RIE, etc. Then, body silicon 20d is filled into the memory hole MH by depositing silicon. A silicon pillar 20 is formed of the cover silicon layer 20c and the body silicon 20d. At this stage, the configuration of the silicon pillar 20 is substantially a circular column or an inverted truncated circular cone. In the drawings and the description hereinafter, the cover silicon layer 20c and the body silicon 20d are treated as one body of the silicon pillar 20 without differentiating.

Figure 8A:
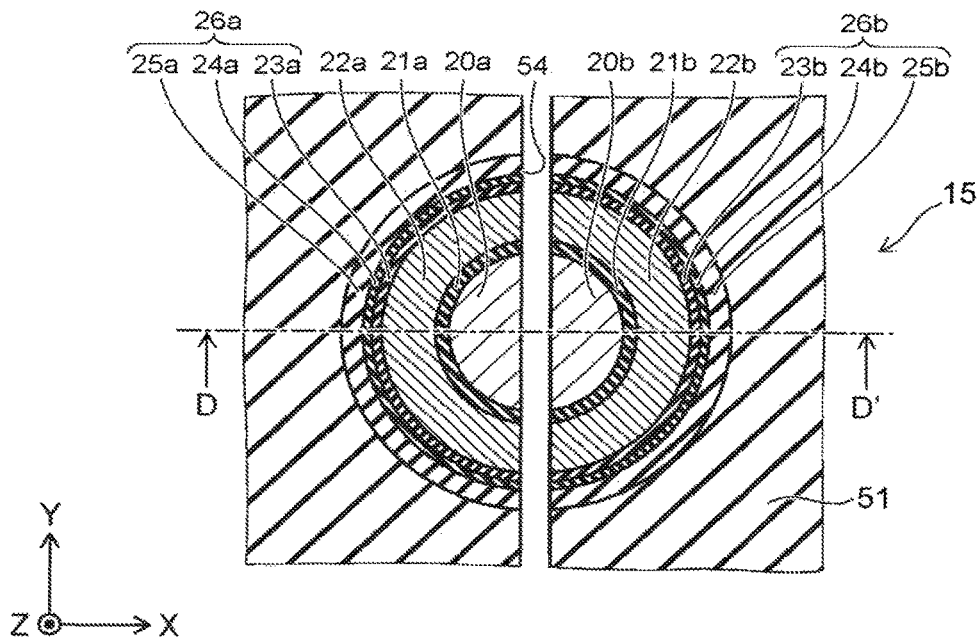
Figure 8B:
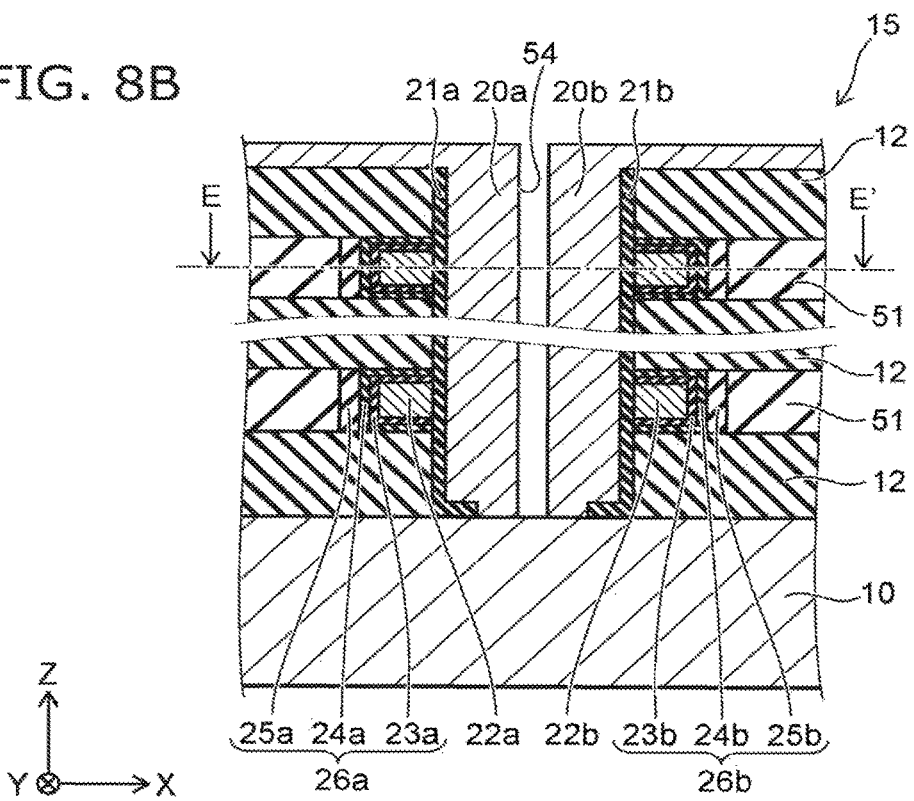

Then, as shown in FIG. 8A and FIG. 8B, a trench 54 that extends in the Y-direction is formed to divide the multiple, e.g., three, silicon pillars 20 arranged along the Y-direction. At this time, portions that include the central axes of the silicon pillars 20 are removed by the formation of the trench 54. The trench 54 pierces the stacked body 15 in the Z-direction and reaches the silicon substrate 10. The trench 54 is multiply formed in the XY plane so that each of the silicon pillars 20 is divided by one of the trenches 54.

Thereby, each of the silicon pillars 20 is subdivided into the silicon pillars 20a and 20b. The silicon pillars 20a and 20b that are formed from one silicon pillar 20 are included in the pair 20p. Similarly, the tunneling insulating film 21 is subdivided into the tunneling insulating films 21a and 21b; the silicon film 22 is subdivided into the floating gate electrodes 22a and 22b; and the blocking insulating film 26 is subdivided into the blocking insulating films 26a and 26b. However, the sacrificial films 51 and the insulating films 12 are caused to remain between the trenches 54 adjacent to each other in the Y-direction.

Figure 9A:
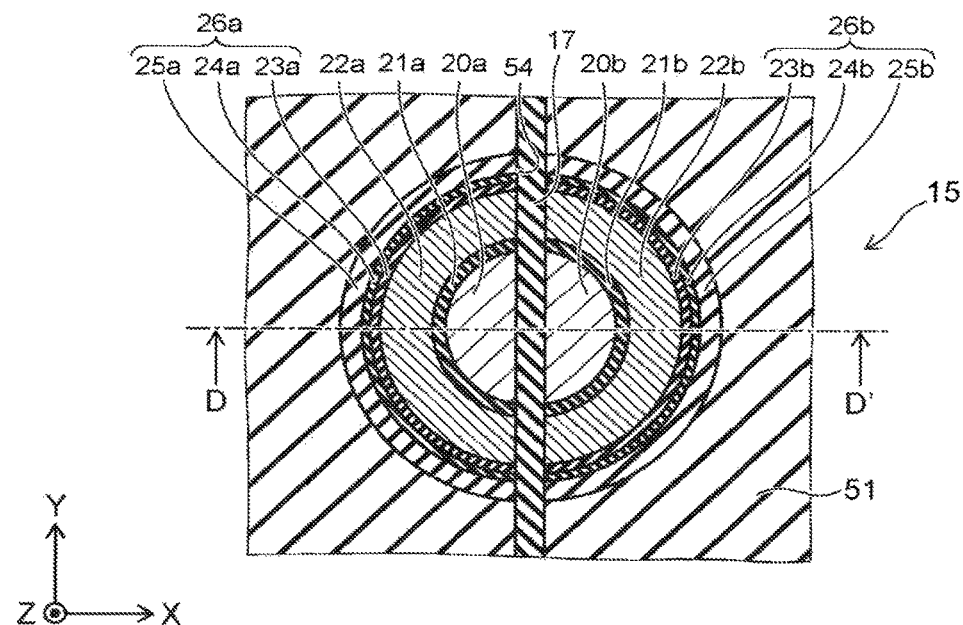
Figure 9B:
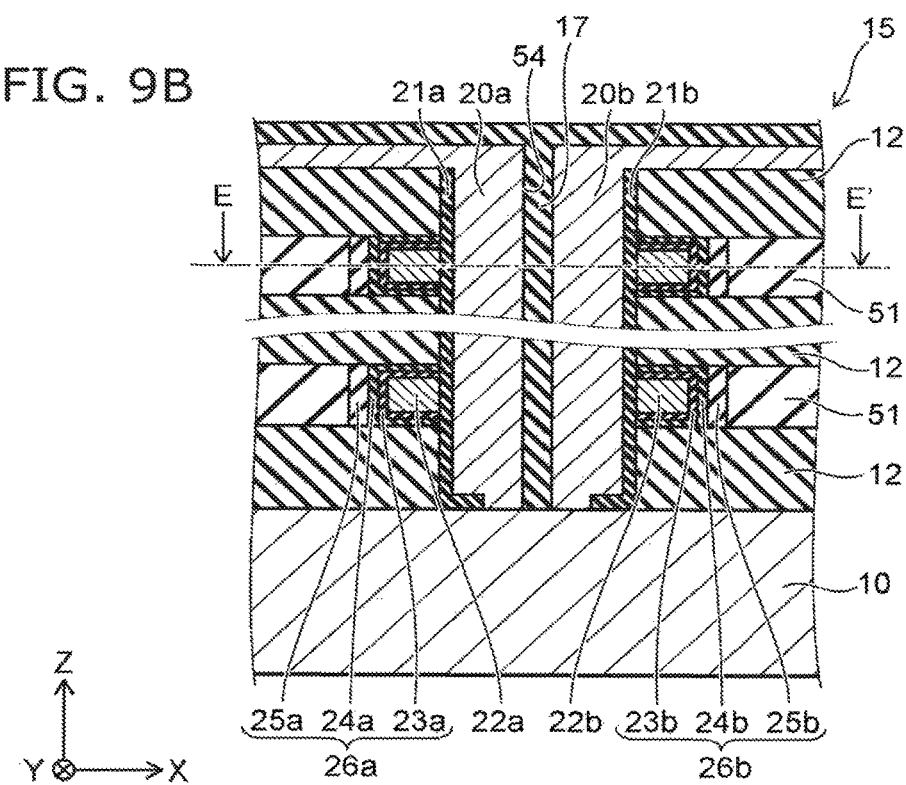

Then, as shown in FIG. 9A and FIG. 9B, the insulating member 17 is formed inside the trench 54 by depositing silicon oxide onto the entire surface.

Figure 10A:
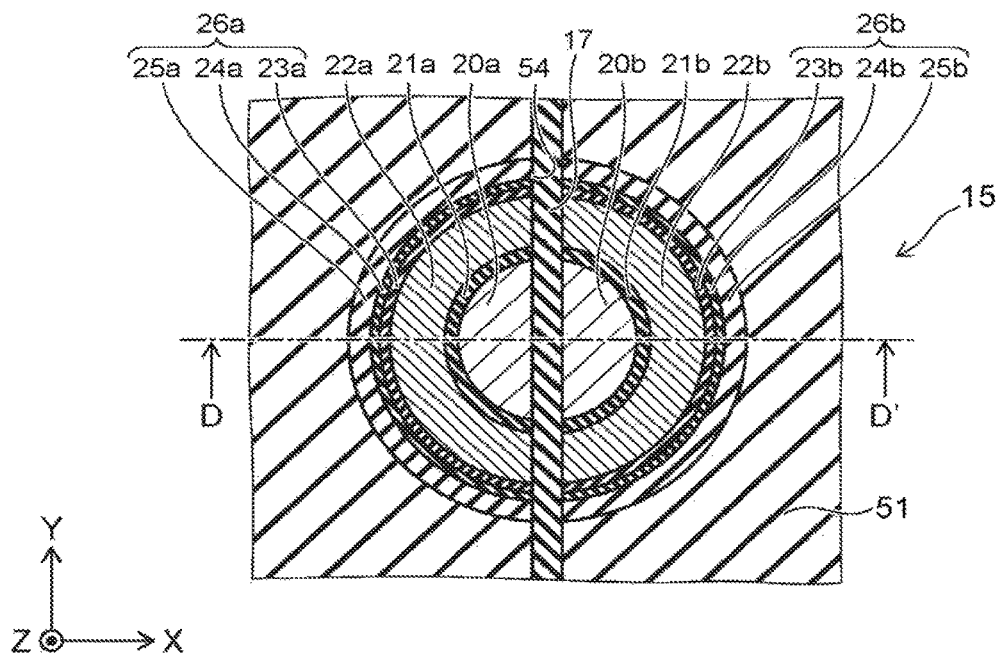
Figure 10B:
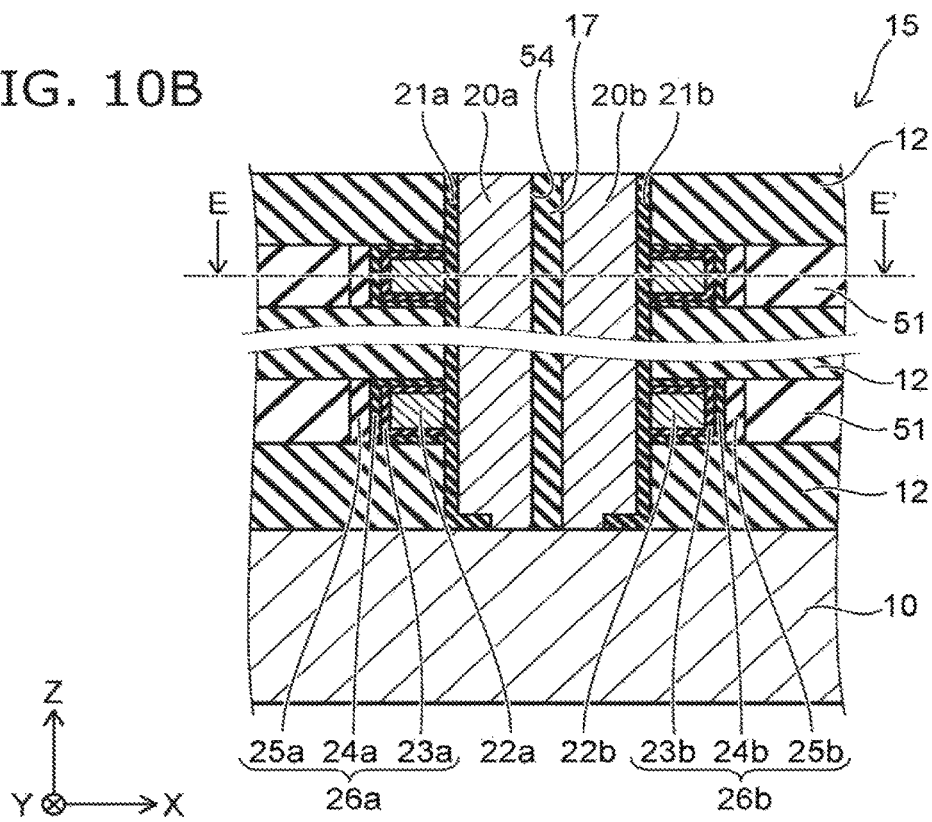

Then, as shown in FIG. 10A and FIG. 10B, the silicon oxide and the silicon that are deposited on the upper surface of the stacked body 15 are removed by performing etch-back.

Figure 11A:
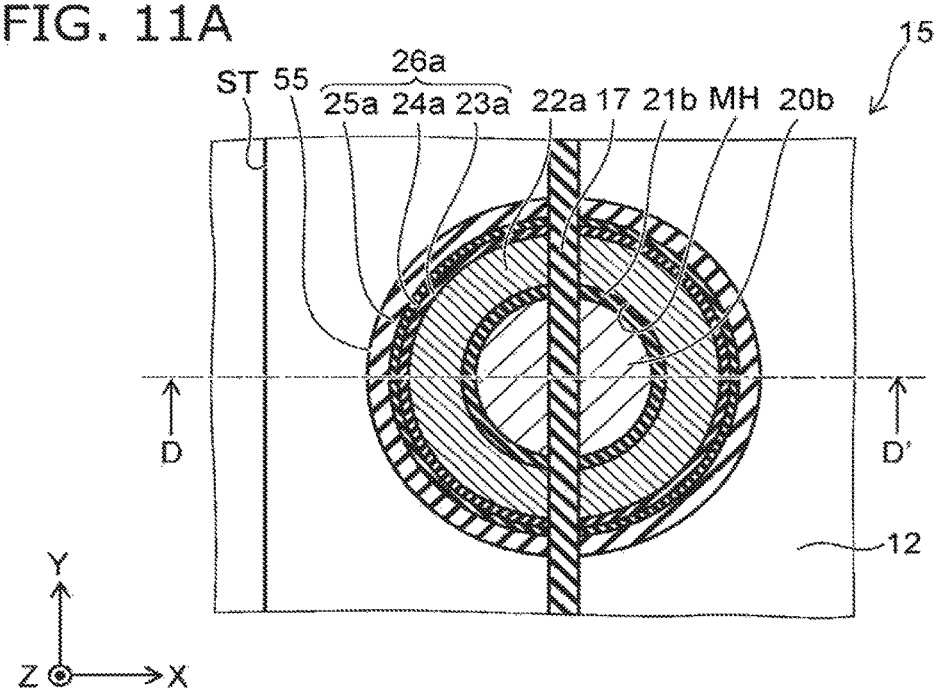
Figure 11B:
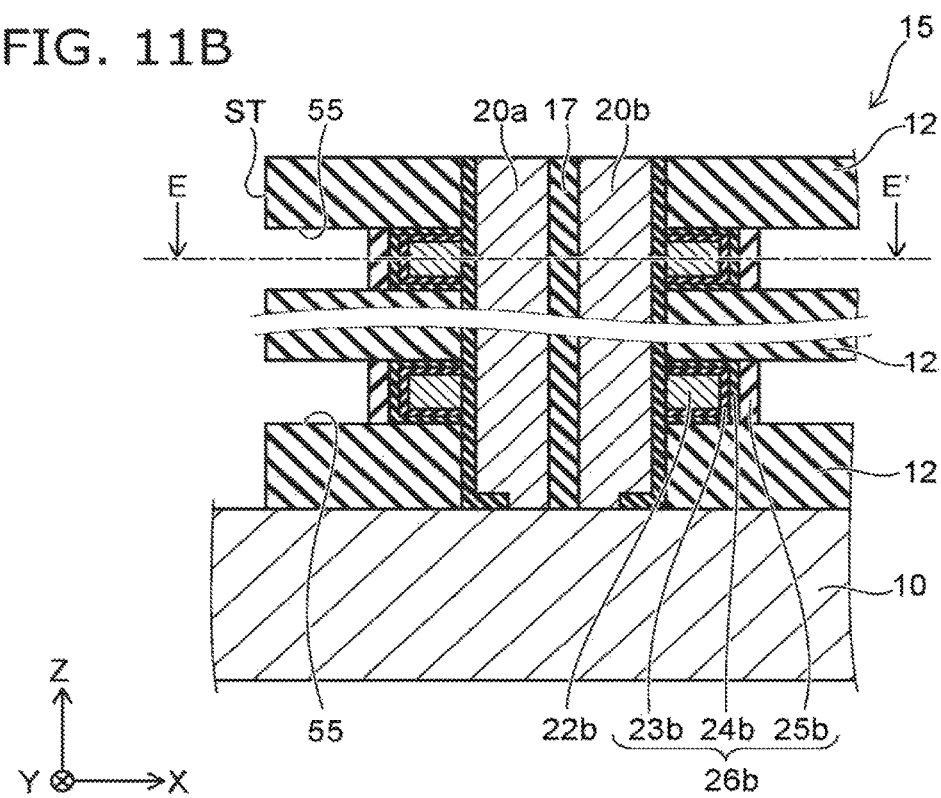

Then, as shown in FIG. 11A and FIG. 11B, a slit ST that extends in the Y-direction is formed in a portion of the stacked body 15 where the silicon pillars 20a and 20b are not provided. The slit ST reaches the silicon substrate 10.

Then, the sacrificial films 51 (referring to FIG. 10B) are etched and removed via the slit ST. For example, wet etching is performed using hot phosphoric acid as the etchant. At this time, the etchant penetrates by passing between the insulating members 17 adjacent to each other in the Y-direction. Thereby, the portions of the sacrificial films 51 between the slits ST on two sides of the insulating member 17 also are etched. The etching reaches the silicon oxide layers 25a and 25b and the insulating member 17 and stops. As a result, a space 55 is formed between the insulating films 12 adjacent to each other in the Z-direction.

Figure 12A:
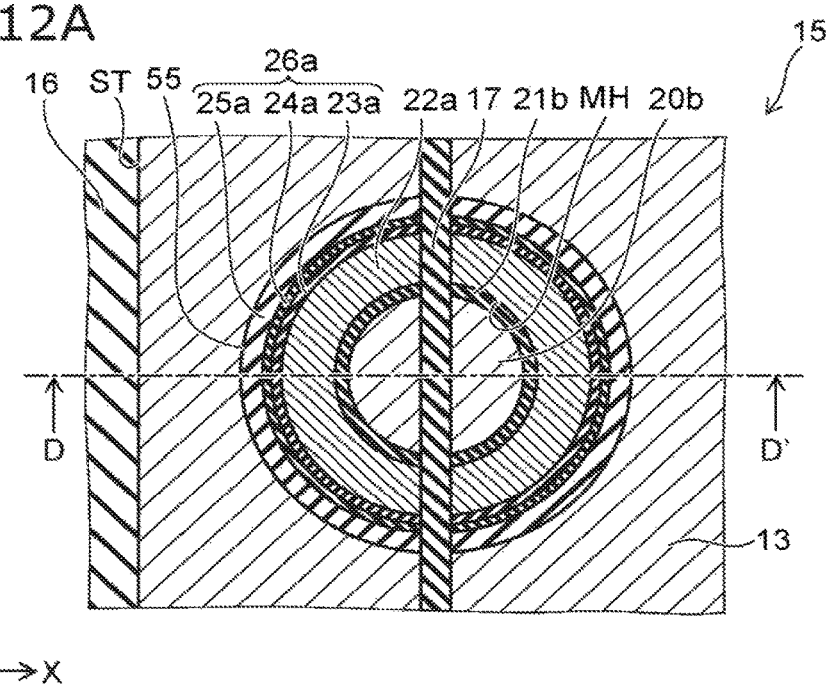
Figure 12B:
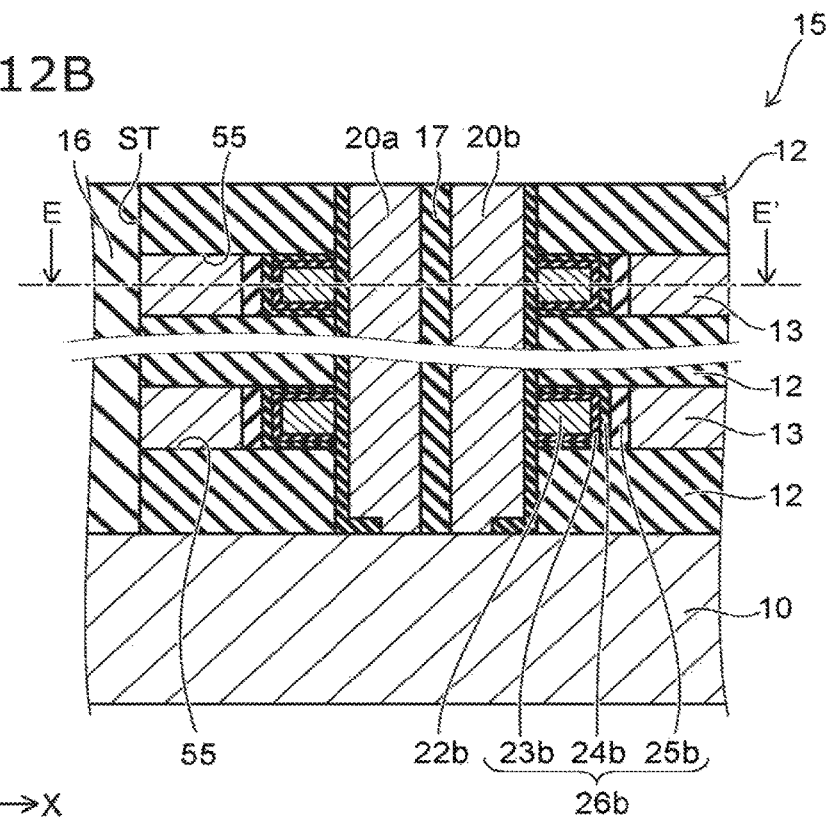

Then, as shown in FIGS. 12A and 12B, for example, a conductive material such as tungsten or the like is deposited by CVD (Chemical Vapor Deposition). At this time, the source gas that is used in the CVD penetrates inside the spaces 55 via the slit ST, passes between the insulating members 17 adjacent to each other in the Y-direction, and penetrates the entire interiors of the spaces 55. Thereby, the interiors of the spaces 55 are filled with tungsten; and the electrode film 13 is formed.

Then, by performing etching, the portion of the electrode film 13 deposited inside the slit ST is removed; and the electrode film 13 is divided every space 55. Then, the insulating plate 16 is formed by filling silicon oxide into the slit ST.

Then, as shown in FIG. 2, the lower portion of the inter-layer insulating film 30 is formed on the silicon substrate 10 by depositing silicon oxide on the entire surface. The lower portion of the inter-layer insulating film 30 buries the stacked body 15. Then, the plugs 32 and the contacts 33 are formed inside the lower portion of the inter-layer insulating film 30. Then, the bit lines 31 and the draw-out interconnects 34 are formed on the lower portion of the inter-layer insulating film 30. Then, the bit lines 31 and the draw-out interconnects 34 are buried and the upper portion of the inter-layer insulating film 30 is formed by depositing silicon oxide. Thus, the semiconductor memory device 1 according to the embodiment is manufactured.

Effects of the embodiment will now be described.

According to the embodiment, in the formation process of the trenches 54 shown in FIG. 8A and FIG. 8B, the trenches 54 are separated from each other in the Y-direction. Thereby, in the removal process of the sacrificial films 51 shown in FIG. 11A and FIG. 11B, the etchant passes through the gap between the insulating members 17 and penetrates to the opposite side of the insulating members 17. Also, in the filling process of the electrode film 13 shown in FIG. 12A and FIG. 12B, the source gas passes through the gap between the insulating members 17 and penetrates to the opposite side of the insulating members 17. As a result, the number of the slits ST can be set to be fewer than the number of columns of the insulating members 17 extending in the Y-direction. Thereby, the integration of the memory cell transistors MC can be increased.

Also, in the embodiment, the silicon pillar 20 is subdivided into the semicircular columnar silicon pillars 20a and 20b by, for example, forming the circular columnar silicon pillar 20 in the process shown in FIG. 7A and FIG. 7B and by forming the trenches 54 in the process shown in FIG. 8A and FIG. 8B. The silicon pillar 20a and the silicon pillar 20b are connected to mutually-different bit lines 31. As a result, even in the case where the silicon pillar 20a and silicon pillar 20b belonging to the pair 20p are surrounded with the same electrode film 13, currents can be caused to flow separately in the silicon pillar 20a and the silicon pillar 20b. As a result, the memory cell transistors MC that are formed at the silicon pillar 20a and the memory cell transistors MC that are formed at the silicon pillar 20b can be driven independently from each other.

Second Embodiment

A second embodiment will now be described.

Figure 13:
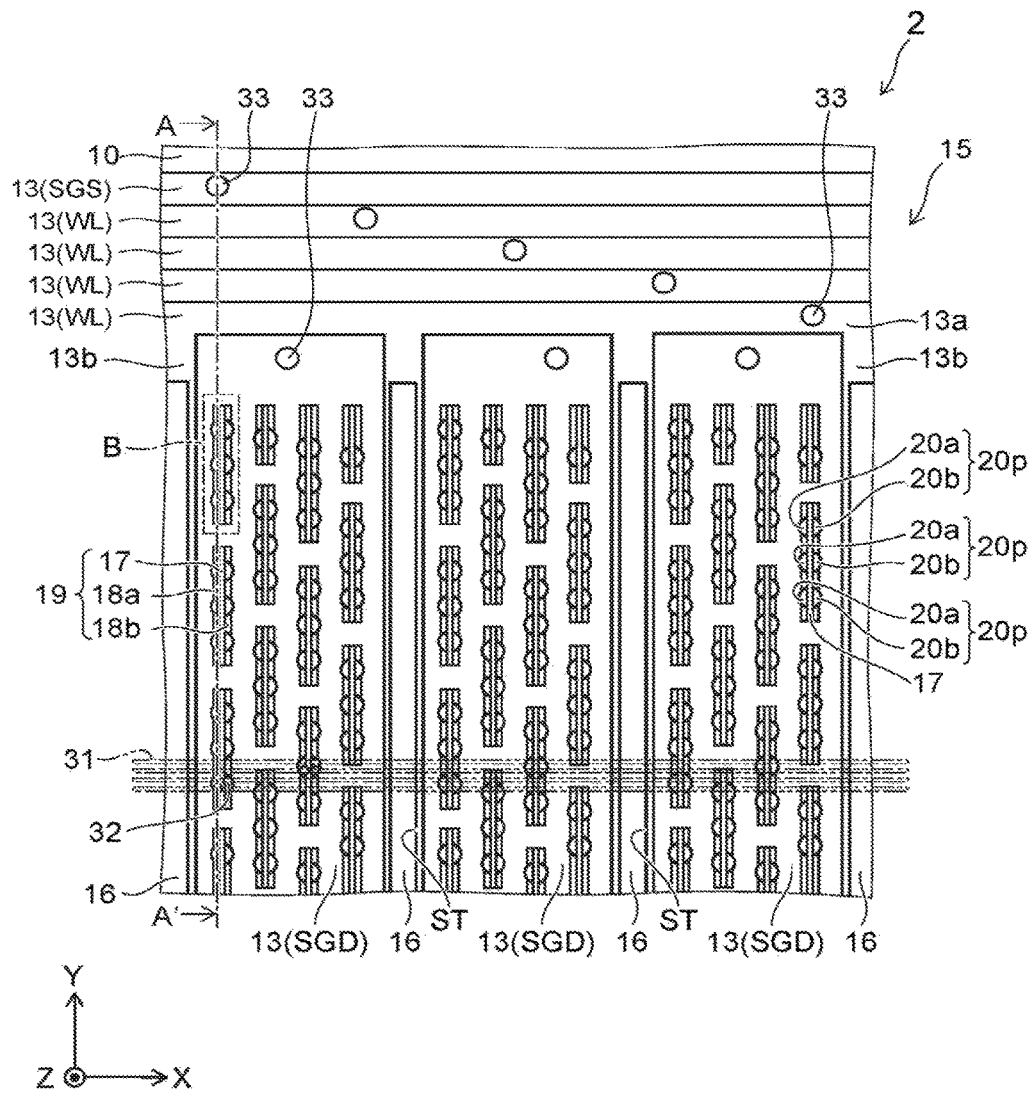
FIG. 13 is a plan view showing a semiconductor memory device according to a second embodiment.

FIG. 13 is a plan view showing a semiconductor memory device according to the embodiment.

Figure 14:
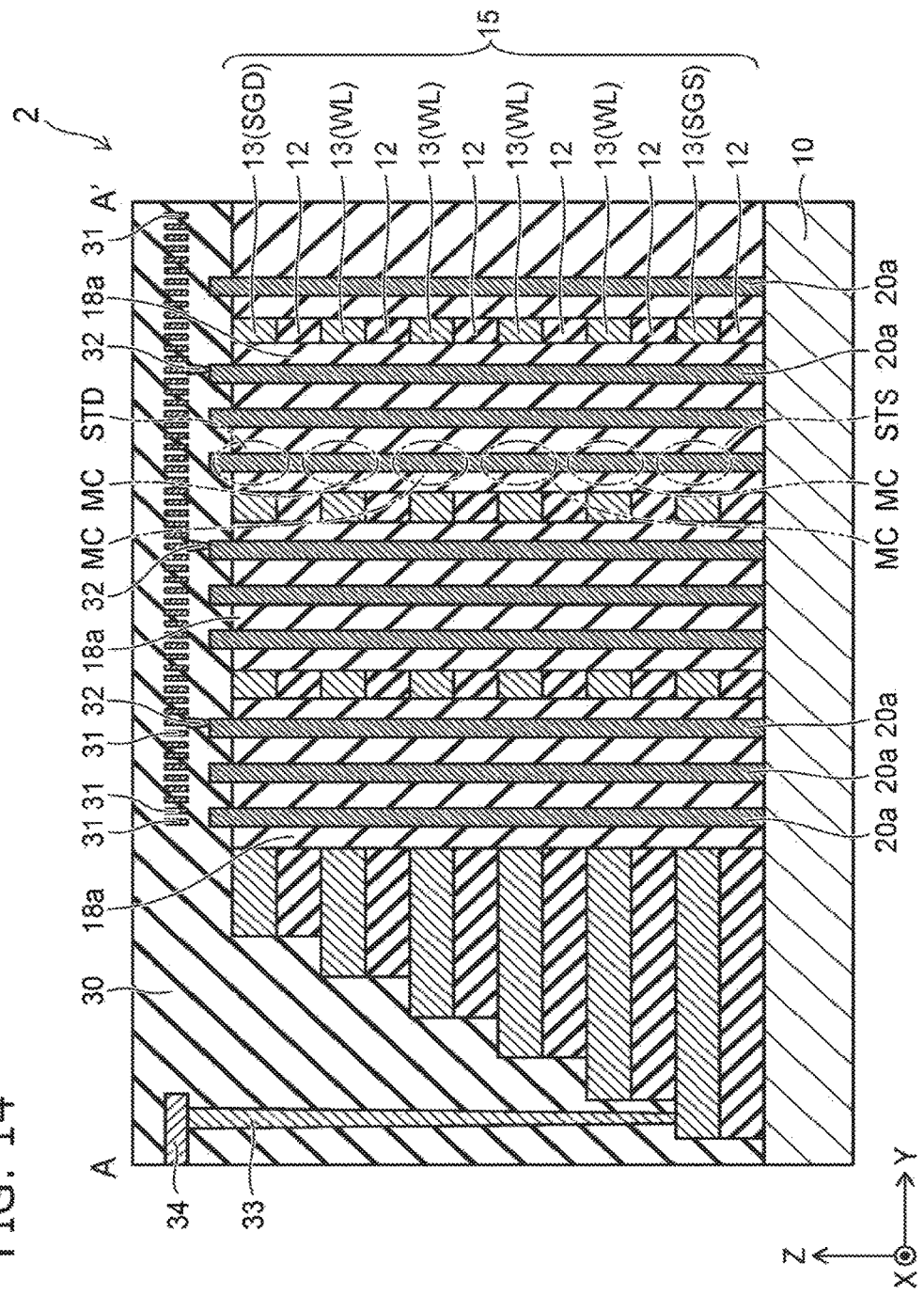
FIG. 14 is a cross-sectional view along line A-A' shown in FIG. 13.

FIG. 14 is a cross-sectional view along line A-A' shown in FIG. 13.

Figure 15:
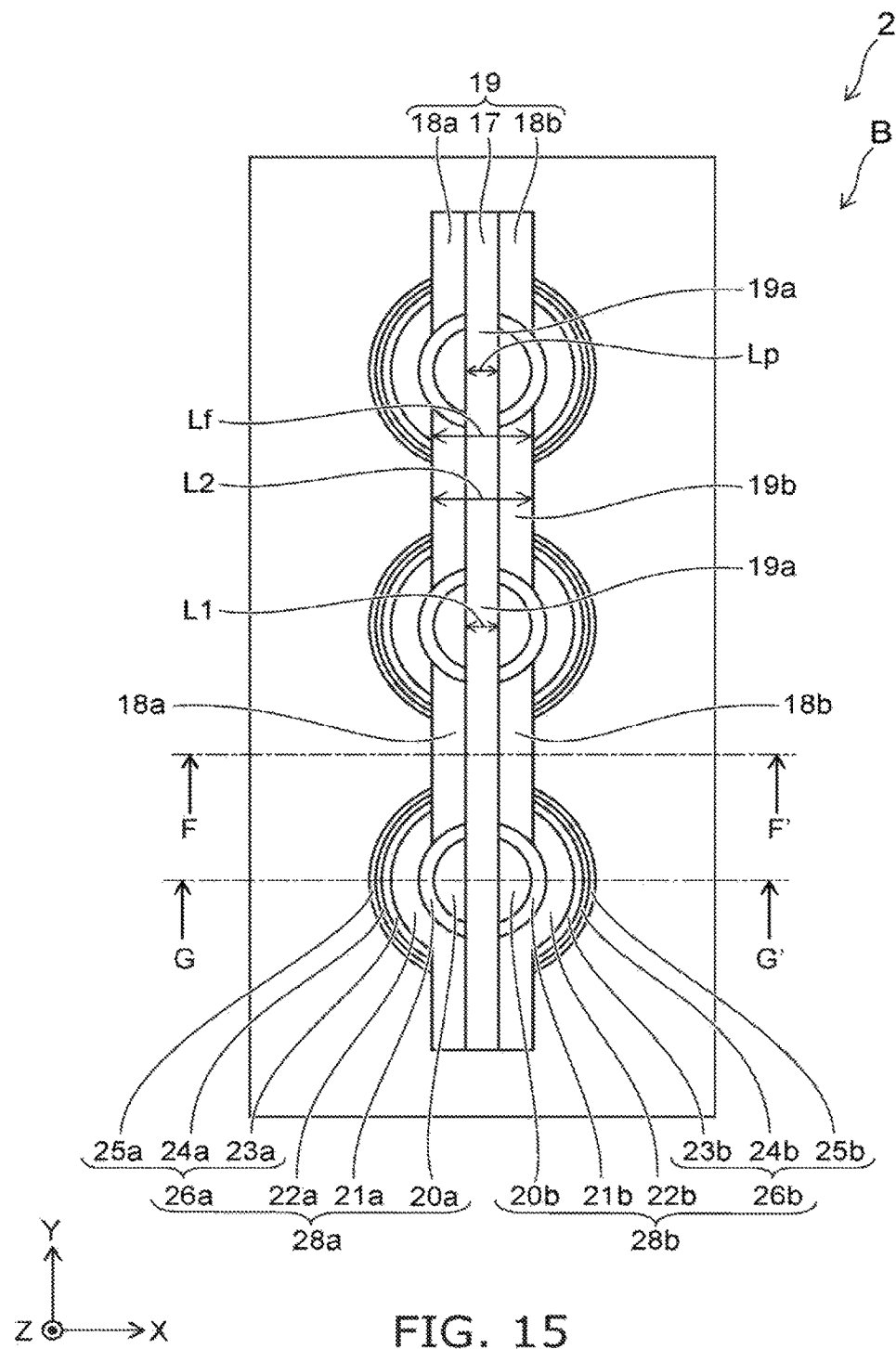
FIG. 15 is a plan view showing region B of FIG. 13.

FIG. 15 is a plan view showing region B of FIG. 13.

Figure 16A:
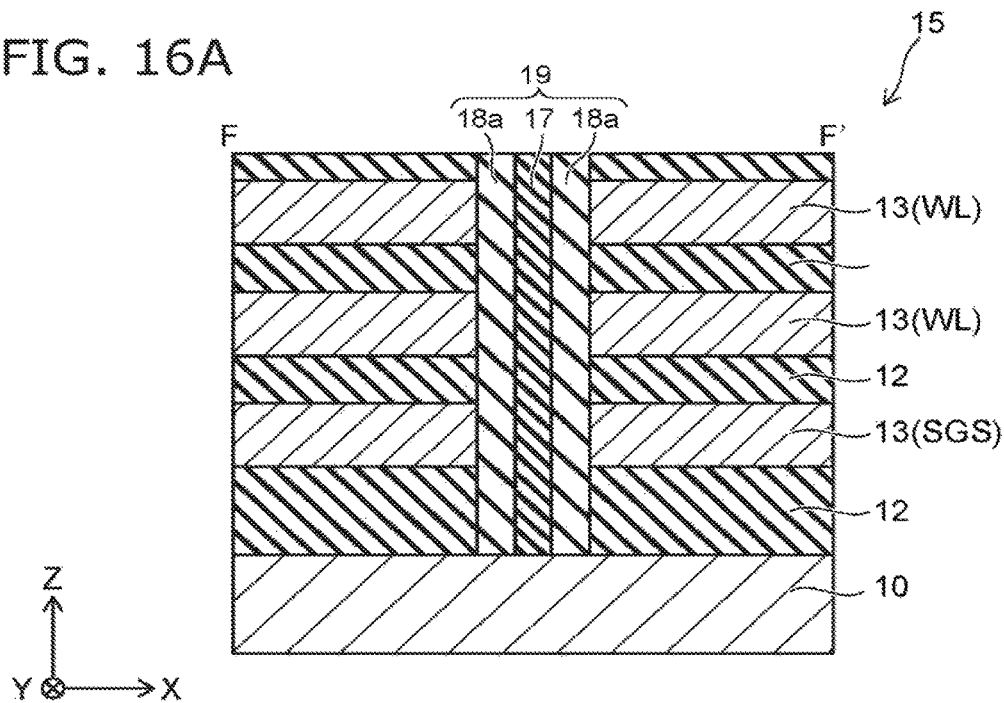
FIG. 16A is a cross-sectional view along line F-F' shown in FIG. 15.
Figure 16B:
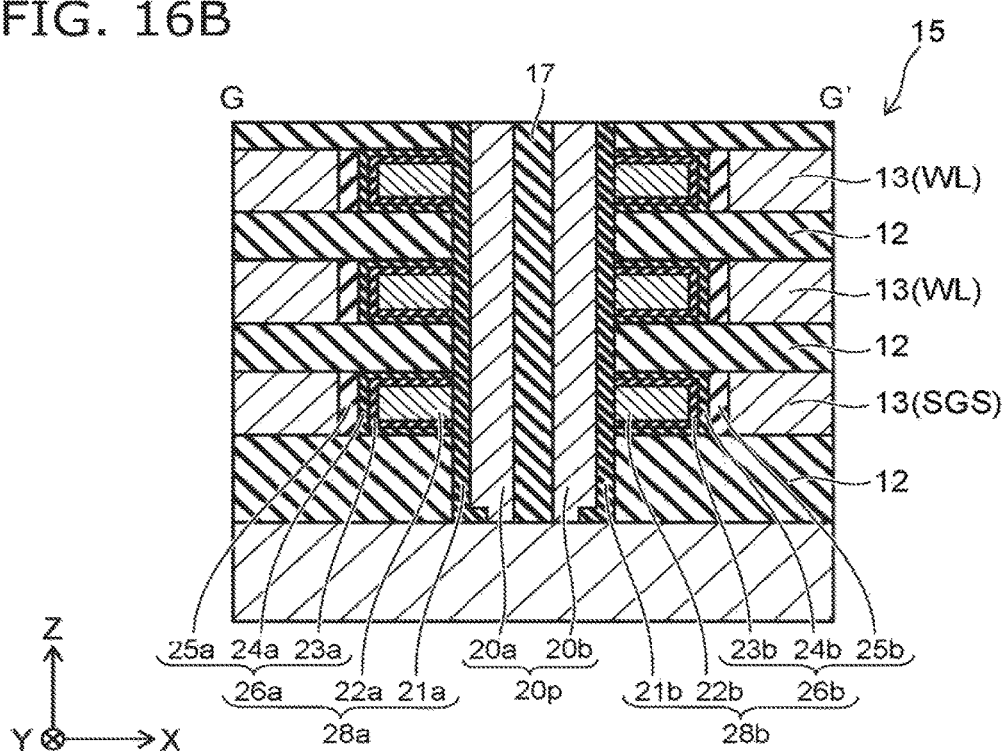
FIG. 16B is a cross-sectional view along line G-G' shown in FIG. 15.

FIG. 16A is a cross-sectional view along line F-F' shown in FIG. 15; and FIG. 16B is a cross-sectional view along line G-G' shown in FIG. 15.

As shown in FIG. 13 to FIG. 16B, in the semiconductor memory device 2 according to the embodiment, an insulating member 18a that is made of, for example, silicon oxide is provided on a region of the side surface of the insulating member 17 facing one of the X-directions where the side surface is not covered with the silicon pillars 20a and the tunneling insulating films 21a. In the Y-direction, the insulating member 18a is disposed between the mutually-adjacent tunneling insulating films 21a. The columnar body 28a includes the silicon pillar 20a, the tunneling insulating film 21a, the floating gate electrodes 22a, and the blocking insulating films 26a. In the X-direction, the length of the insulating member 18a is shorter than the length of the columnar body 28a and longer than the length of the silicon pillar 20a.

Similarly, an insulating member 18b that is made of the same material as the insulating member 18a is provided on a region of the side surface of the insulating member 17 facing the other of the X-directions where the side surface is not covered with the silicon pillars 20b and the tunneling insulating films 21b. In the Y-direction, the insulating member 18b is disposed between the mutually-adjacent tunneling insulating films 21b. The columnar body 28b includes the silicon pillar 20b, the tunneling insulating film 21b, the floating gate electrodes 22b, and the blocking insulating films 26b. In the X-direction, the length of the insulating member 18b is shorter than the length of the columnar body 28b and longer than the length of the silicon pillar 20b.

Therefore, for an insulating member 19 that includes the insulating member 17 and the insulating members 18a and 18b, when the portion disposed between the silicon pillar 20a and the silicon pillar 20b is taken as a portion 19a, and the portion disposed between the portions 19a adjacent to each other in the Y-direction is taken as a portion 19b, the portion 19a includes only the insulating member 17; and the portion 19b includes the insulating members 17, 18a, and 18b. Therefore, a length L2 of the portion 19b in the X-direction is longer than a length L1 of the portion 19a in the X-direction. In other words, L2>L1. Also, a distance Lf between the floating gate electrode 22a and the floating gate electrode 22b is longer than a distance Lp between the silicon pillar 20a and the silicon pillar 20b. In other words, Lf>Lp.

A method for manufacturing the semiconductor memory device according to the embodiment will now be described.

FIG. 17A to FIG. 23B are cross-sectional views showing the method for manufacturing the semiconductor memory device according to the embodiment.

Figure 17A:
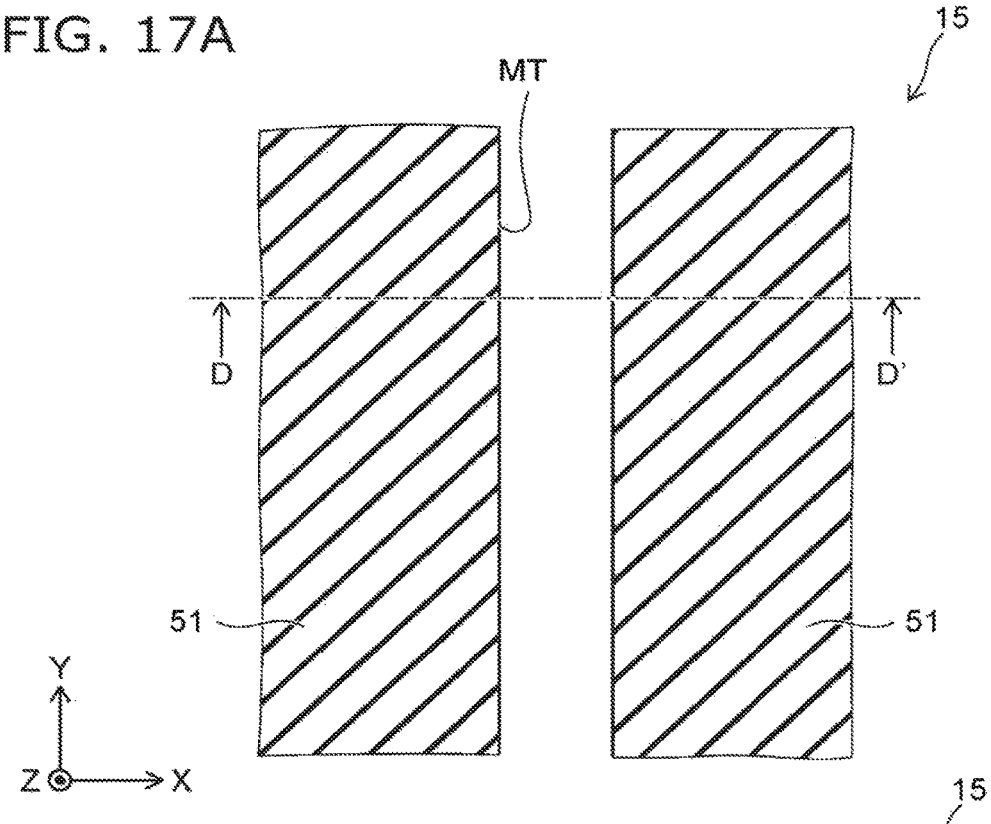
FIG. 17A to FIG. 23B are cross-sectional views showing a method for manufacturing a semiconductor memory device according to the second embodiment.
Figure 17B:
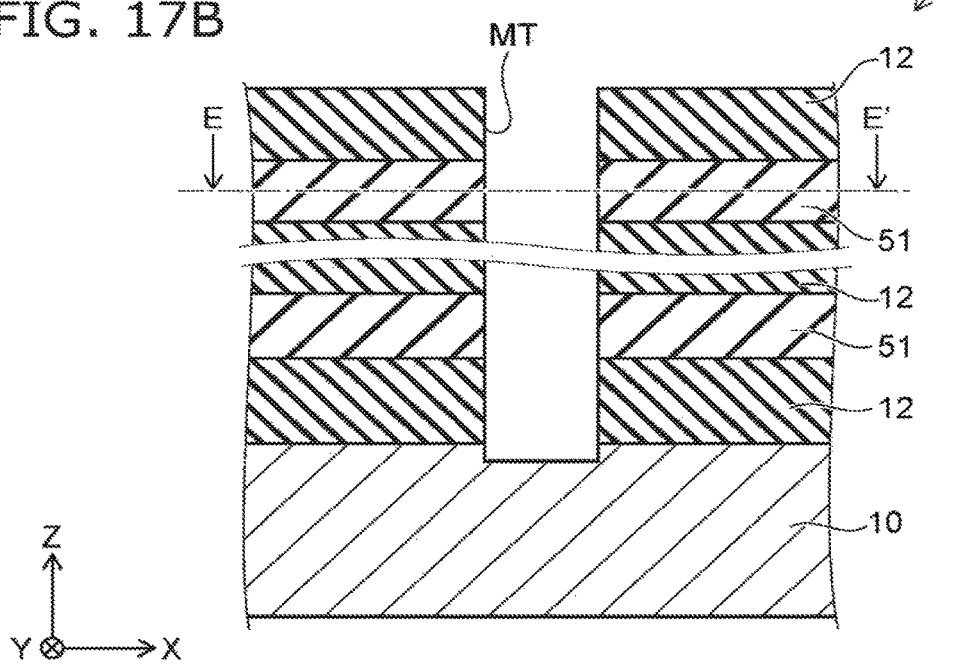

FIG. 17A and FIG. 17B show the same process; FIG. 17B is a cross-sectional view along line D-D' shown in FIG. 17A; and FIG. 17A is a cross-sectional view along line E-E' shown in FIG. 17B. This is similar for FIG. 18A to FIG. 23B as well.

First, as shown in FIG. 17A and FIG. 17B, the stacked body 15 is formed by forming the insulating films 12 and the sacrificial films 51 alternately on the silicon substrate 10. Then, memory trenches MT that extend in the Y-direction are formed in the stacked body 15. In each of the fingers 13b, the memory trenches MT are formed along multiple columns extending in the Y-direction and are formed to be discontinuous in each column. The stacked body 15 remains between the memory trenches MT adjacent to each other in the Y-direction. The memory trenches MT reach the silicon substrate 10.

Figure 18A:
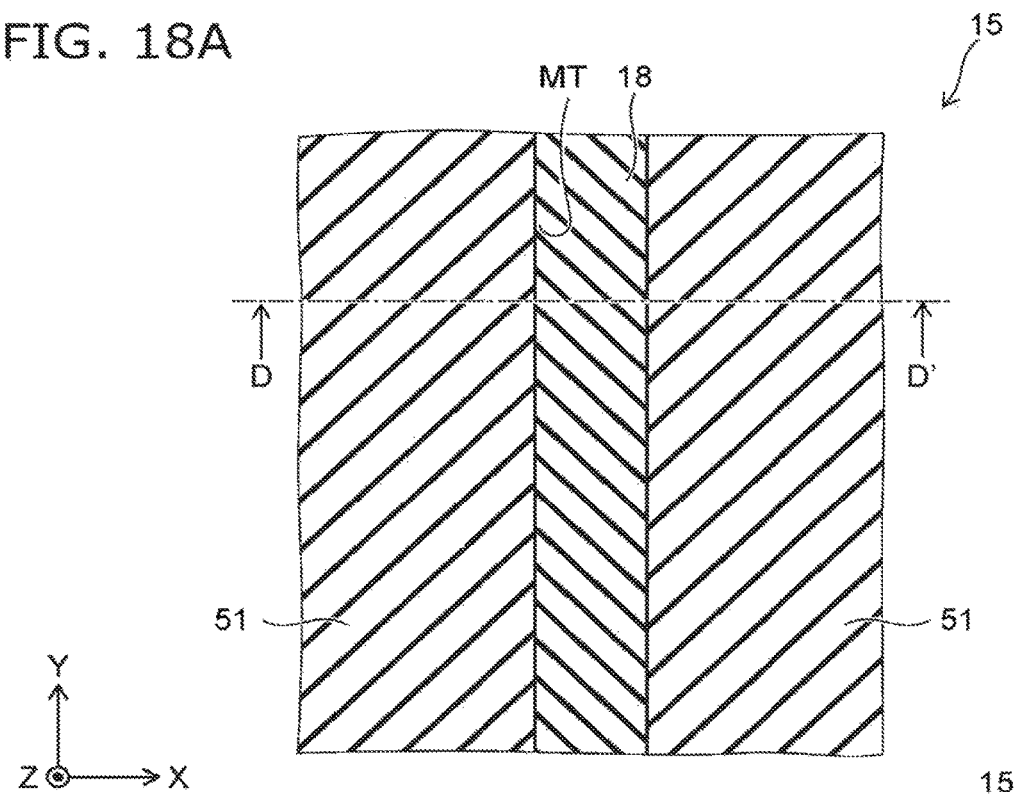
Figure 18B:
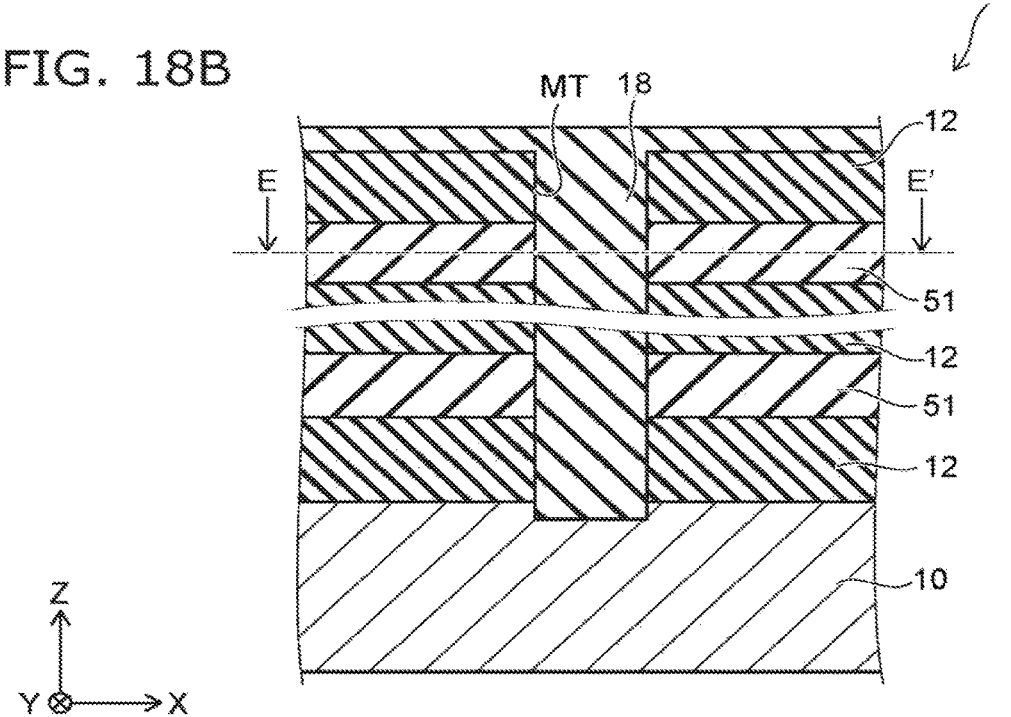

Then, as shown in FIG. 18A and FIG. 18B, an insulating member 18 is formed inside the memory trenches MT by depositing silicon oxide on the entire surface.

Figure 19A:
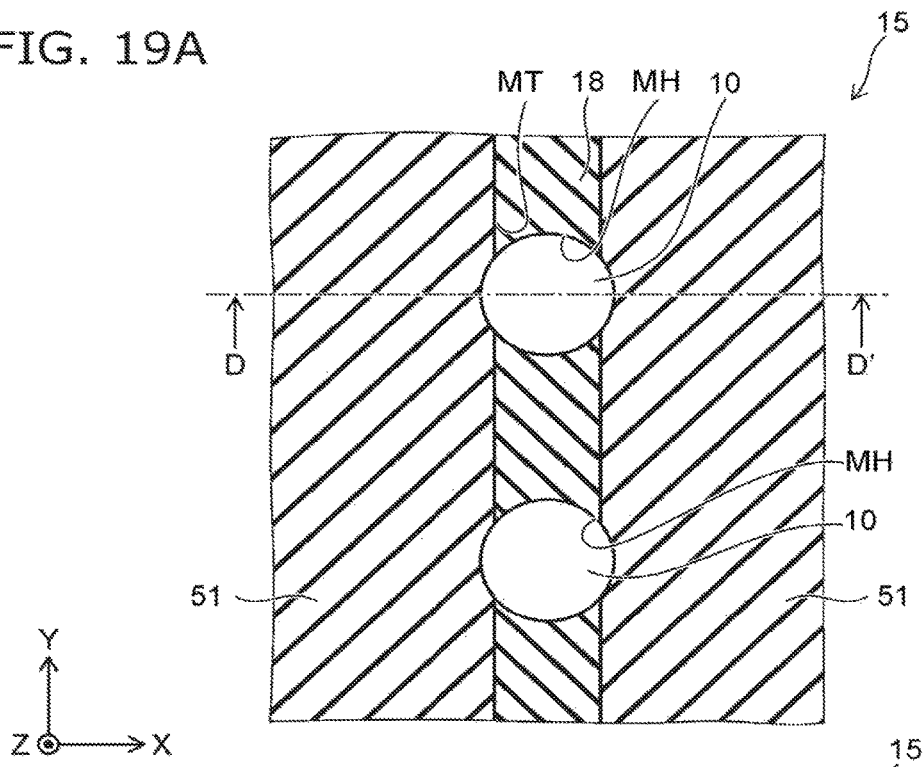
Figure 19B:
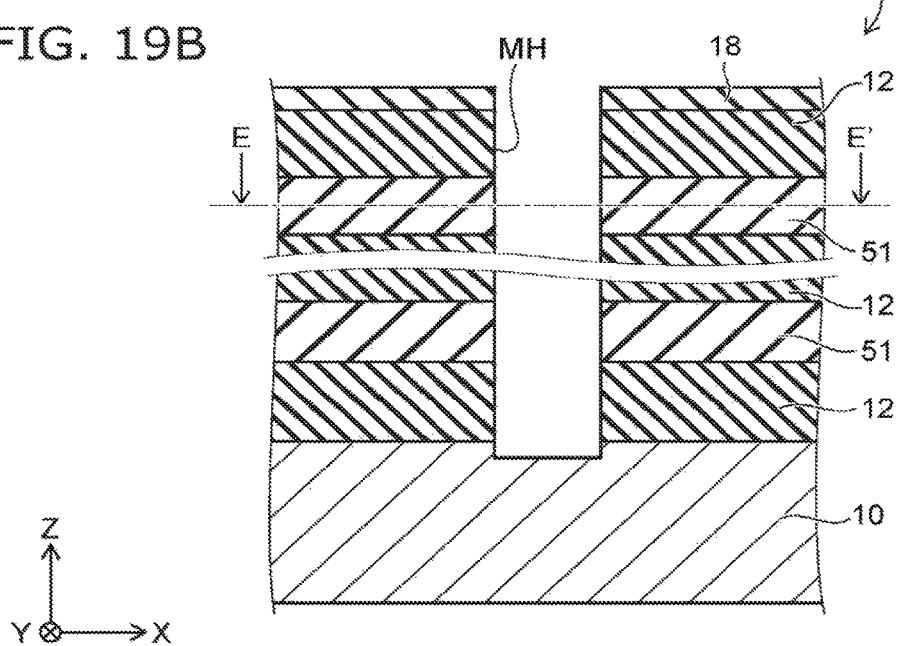

Then, as shown in FIG. 19A and FIG. 19B, the memory holes MH are formed in the insulating members 18 by, for example, RIE. At this time, multiple, e.g., three, memory holes MH are formed along the Y-direction inside each of the insulating members 18. The diameter of each of the memory holes MH is slightly greater than the width, i.e., the length in the X-direction, of the insulating member 18 and divides the insulating member 18 along the Y-direction. Each of the memory holes MH pierces the stacked body 15 in the Z-direction and reaches the silicon substrate 10.

Figure 20A:
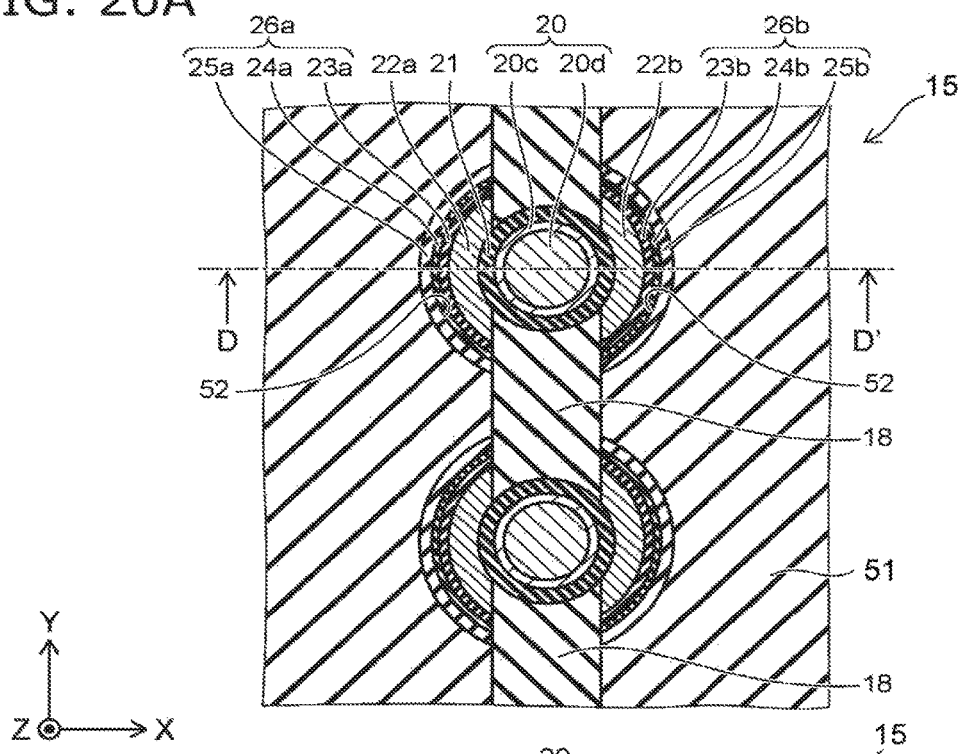
Figure 20B:
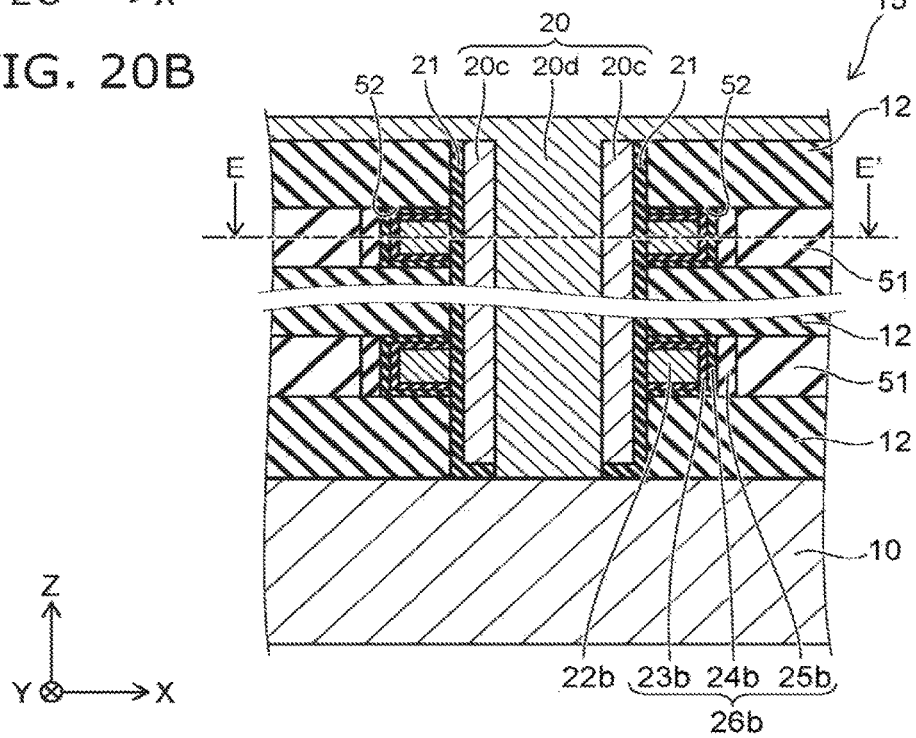

Then, memory cell structures are formed inside the memory holes MH by implementing the processes shown in FIG. 6A to FIG. 7B. Thereby, the blocking insulating films 26a and 26b, the floating gate electrodes 22a and 22b, the tunneling insulating films 21, and the silicon pillars 20 are formed as shown in FIG. 20A and FIG. 20B. At this time, the portions of the blocking insulating films and the floating gate electrodes formed inside the memory holes MH are removed by etch-back so that the portions remain only inside the recesses 52.

Figure 21A:
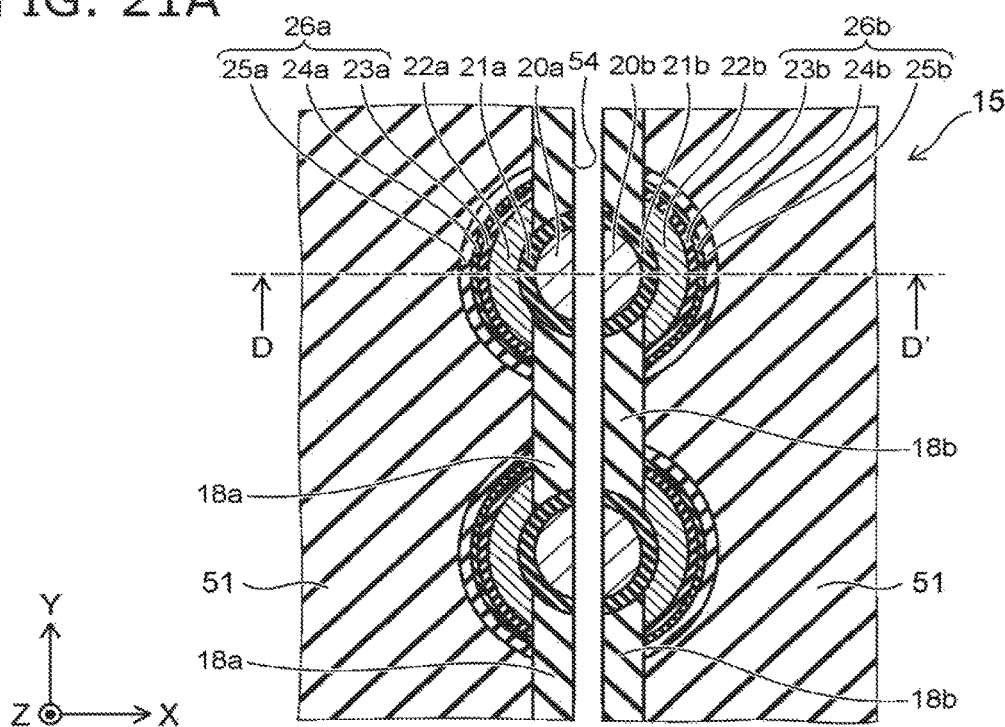
Figure 21B:
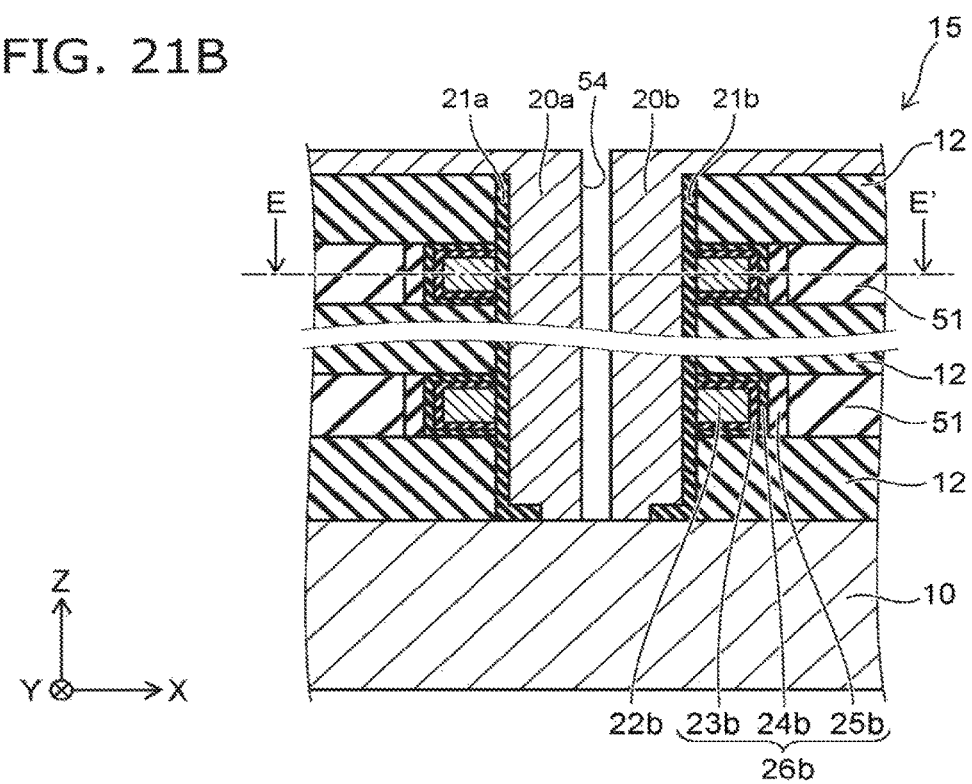

Then, as shown in FIG. 21A and FIG. 21B, the trench 54 is formed to pierce the insulating member 18 (referring to FIG. 20A and FIG. 20B) along the Y-direction and the Z-direction. Thereby, the insulating member 18 is subdivided into the insulating members 18a and 18b; the silicon pillar 20 (referring to FIG. 20A and FIG. 20B) is subdivided into the silicon pillars 20a and 20b; and the tunneling insulating film 21 (referring to FIG. 20A and FIG. 20B) is subdivided into the tunneling insulating films 21a and 21b.

Figure 22A:
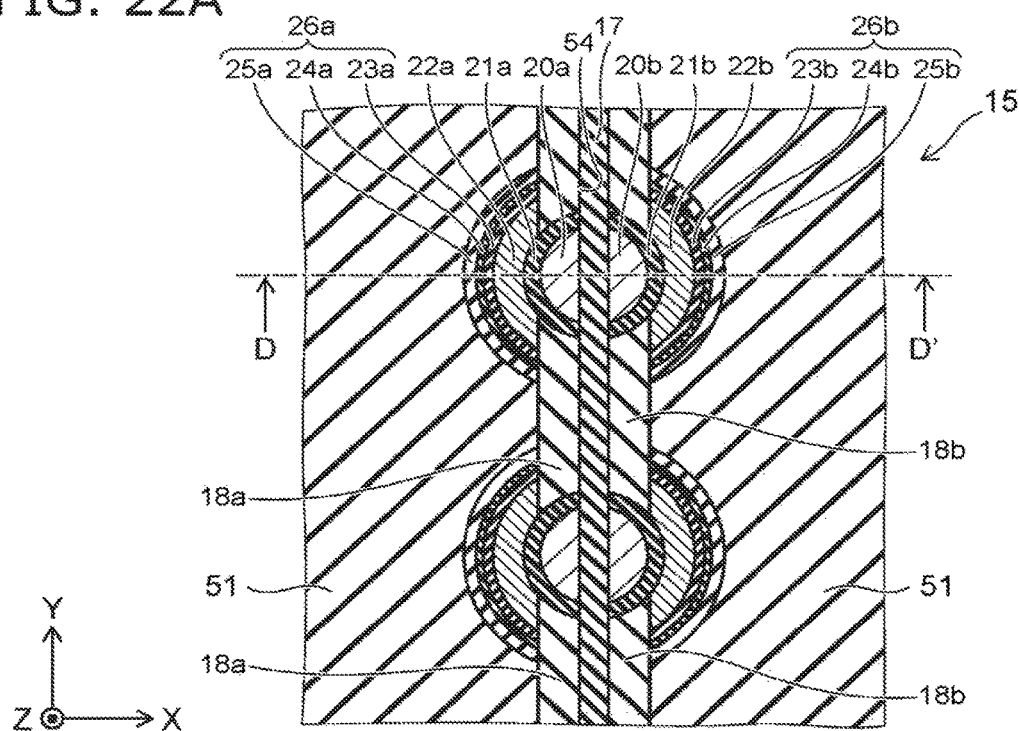
Figure 22B:
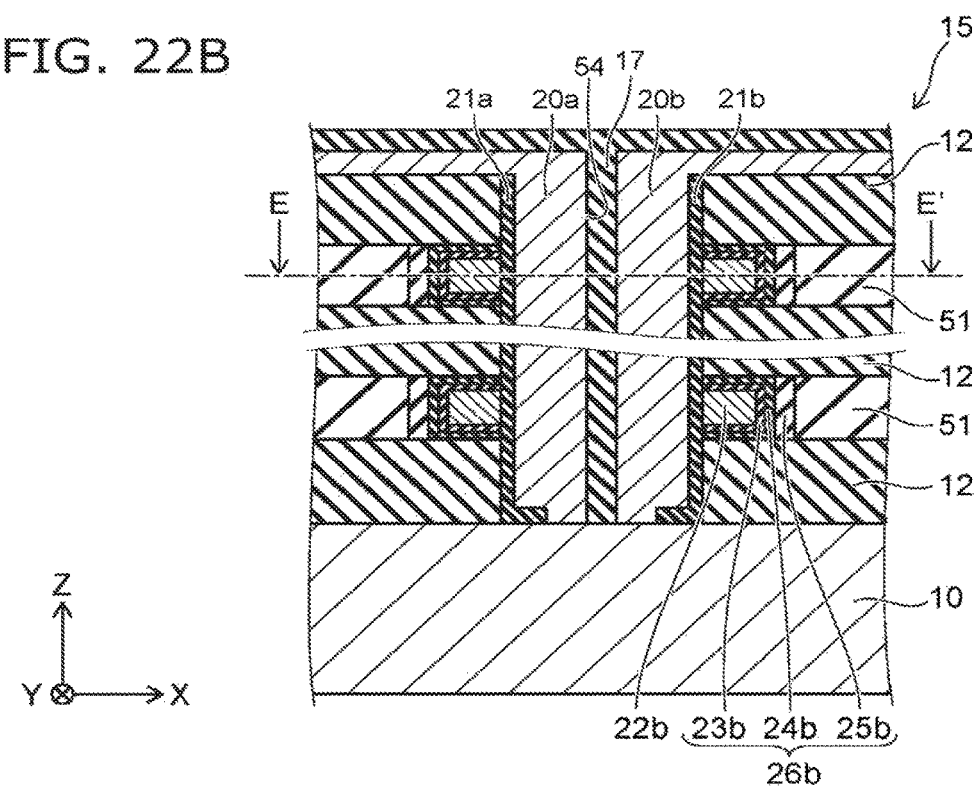

Then, as shown in FIG. 22A and FIG. 22B, the insulating member 17 is formed inside the trench 54 by depositing silicon oxide on the entire surface.

Figure 23A:
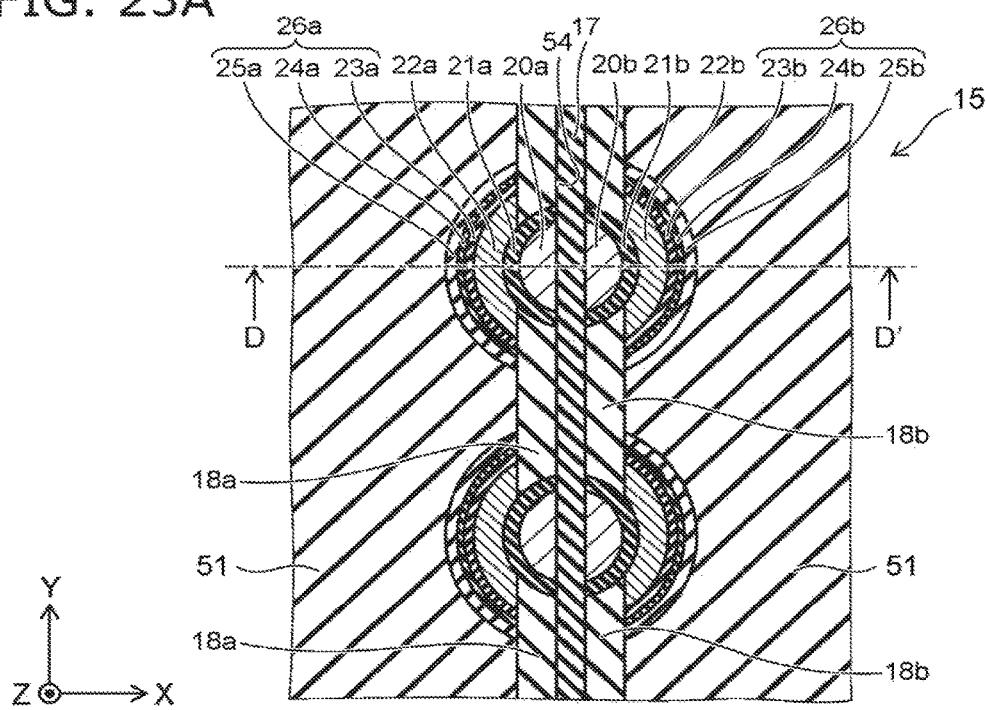
Figure 23B:
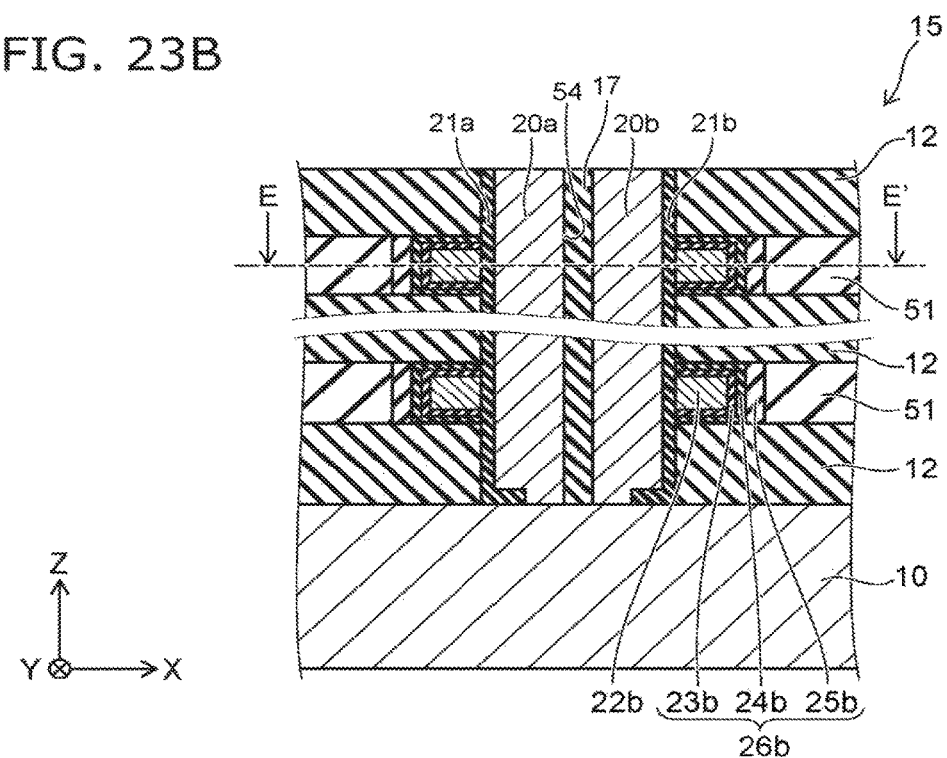

Then, as shown in FIG. 23A and FIG. 23B, the silicon oxide that is deposited on the upper surface of the stacked body 15 is removed by performing etch-back.

The method for manufacturing thereafter is similar to that of the first embodiment described above. In other words, as shown in FIG. 11A and FIG. 11B, the slit ST is formed in the stacked body 15; and the spaces 55 are formed by removing the sacrificial films 51 via the slit ST. Then, as shown in FIG. 12A and FIG. 12B, the electrode films 13 are formed inside the spaces 55. Subsequently, the upper structures such as the bit lines 31, etc., are formed. Thus, the semiconductor memory device 2 according to the embodiment is manufactured.

Otherwise, the configuration, the manufacturing method, and the effects of the embodiment are similar to those of the first embodiment described above.

Third Embodiment

A third embodiment will now be described.

Figure 24:
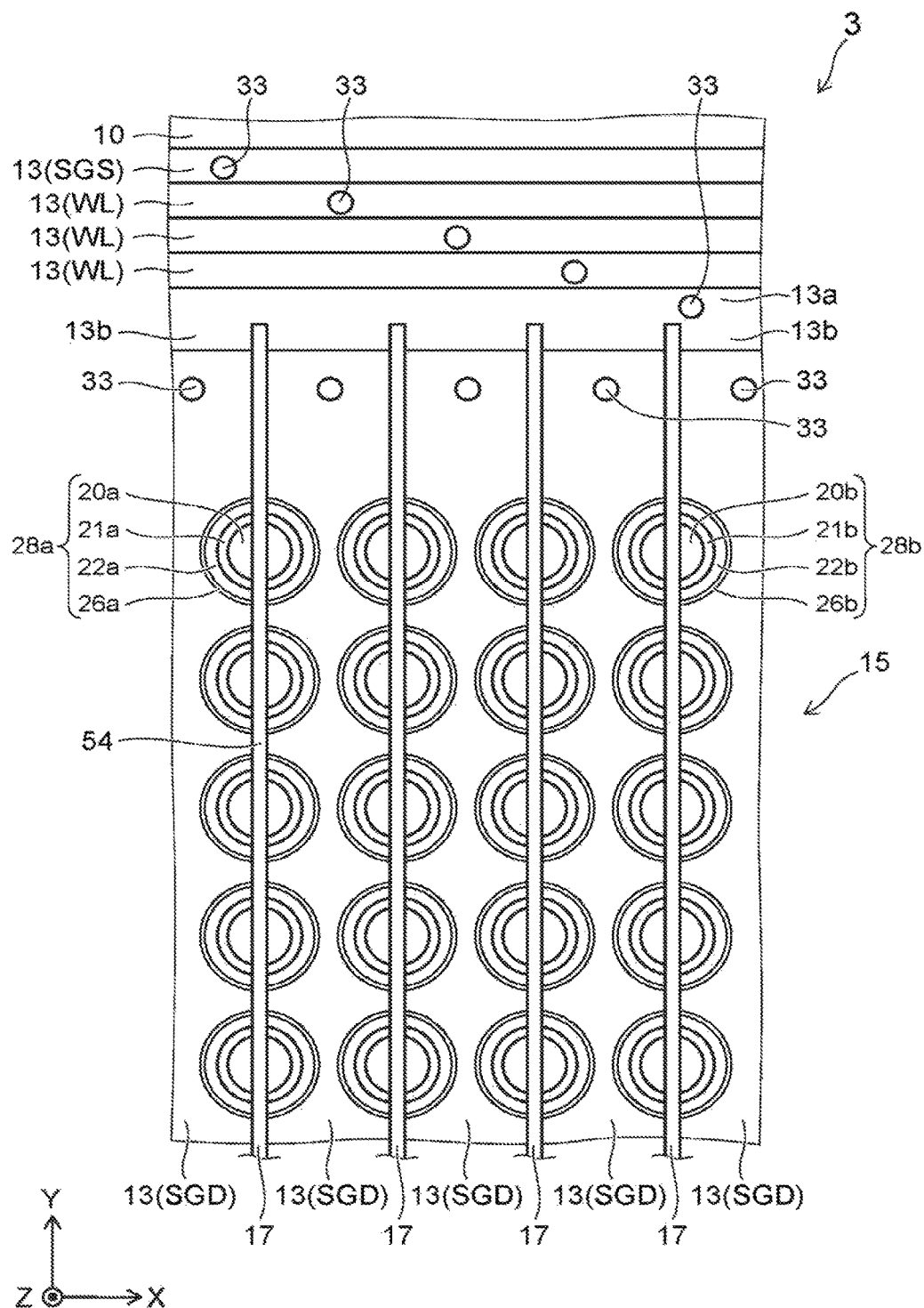
FIG. 24 is a plan view showing a semiconductor memory device according to a third embodiment.

FIG. 24 is a plan view showing a semiconductor memory device according to the embodiment.

As shown in FIG. 24, the semiconductor memory device 3 according to the embodiment differs from the semiconductor memory device 1 according to the first embodiment described above (referring to FIG. 1 to FIG. 4) in that the insulating member 17 extends to be continuous in the Y-direction, and the insulating plate 16 is not provided.

A method for manufacturing the semiconductor memory device according to the embodiment will now be described.

FIG. 25A to FIG. 27B are cross-sectional views showing the method for manufacturing the semiconductor memory device according to the embodiment.

Figure 25A:
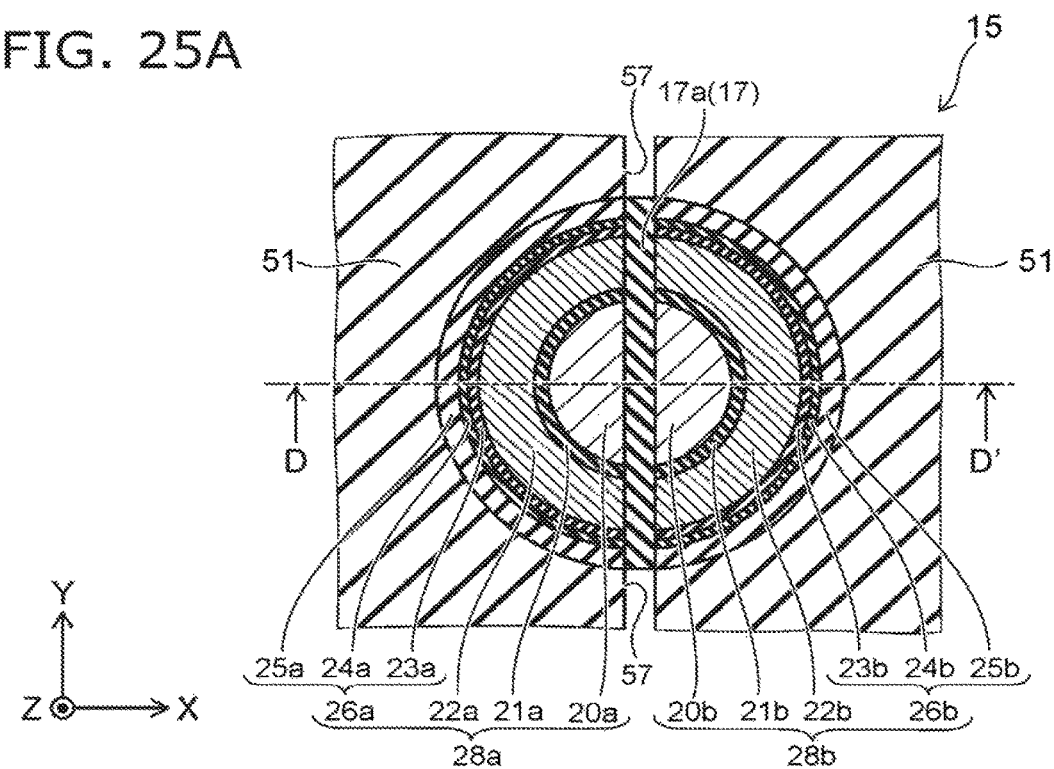
FIG. 25A to FIG. 27B are cross-sectional views showing a method for manufacturing a semiconductor memory device according to the third embodiment.
Figure 25B:
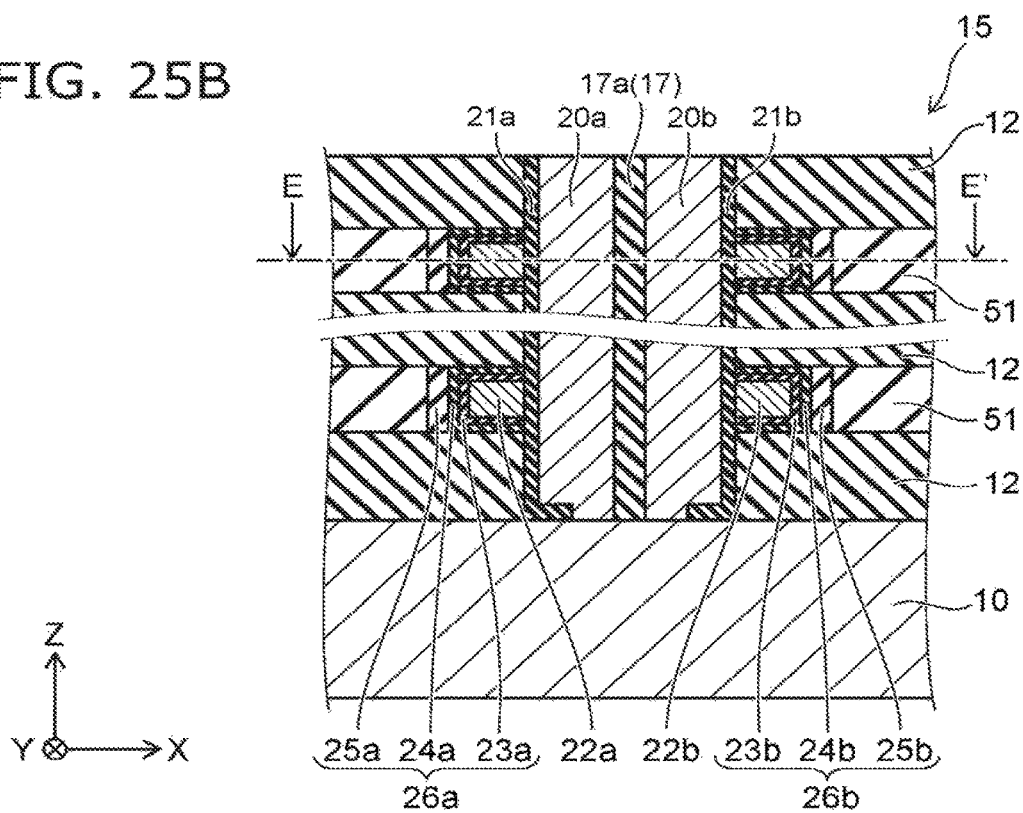

FIG. 25A and FIG. 25B show the same process; FIG. 25B is a cross-sectional view along line D-D' shown in FIG. 25A; and FIG. 25A is a cross-sectional view along line E-E' shown in FIG. 25B. This is similar for FIG. 26A to FIG. 27B as well.

First, the processes shown in FIG. 5A to FIG. 9B are implemented.

Then, as shown in FIG. 25A and FIG. 25B, the portion of the insulating member 17 disposed between the columnar body 28a and the columnar body 28b is caused to remain; and the other portions of the insulating member 17 are removed. In other words, the portion of the insulating member 17 contacting the floating gate electrodes 22a and 22b and the silicon pillars 20a and 20b is caused to remain; and the portion that contacts the sacrificial films 51 is removed. Thereby, an opening 57 is formed in the stacked body 15.

Figure 26A:
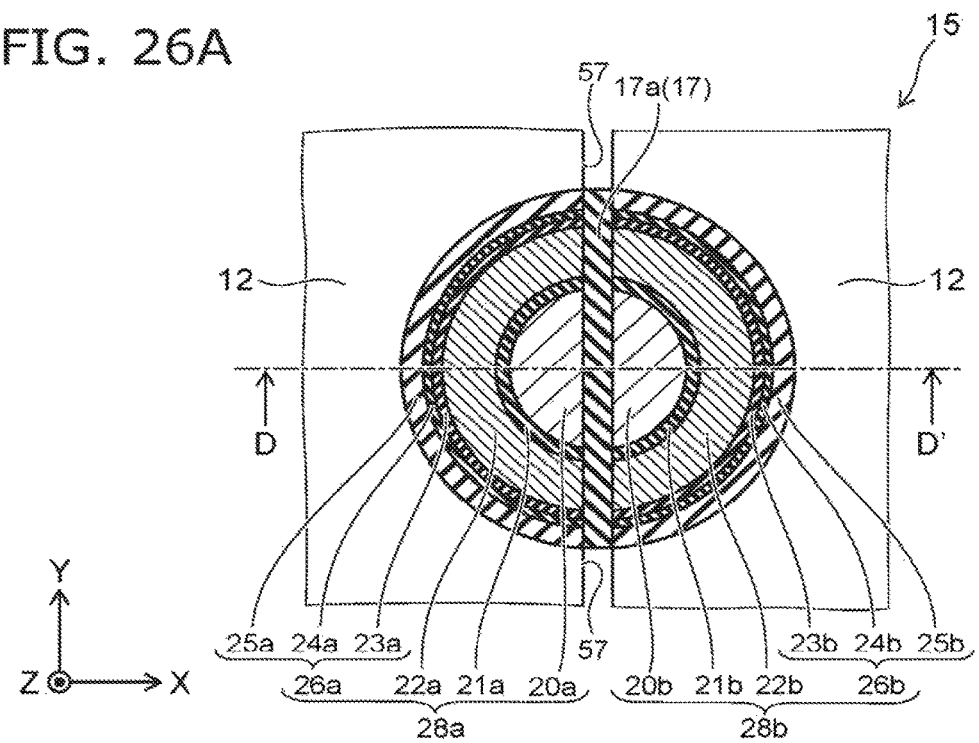
Figure 26B:
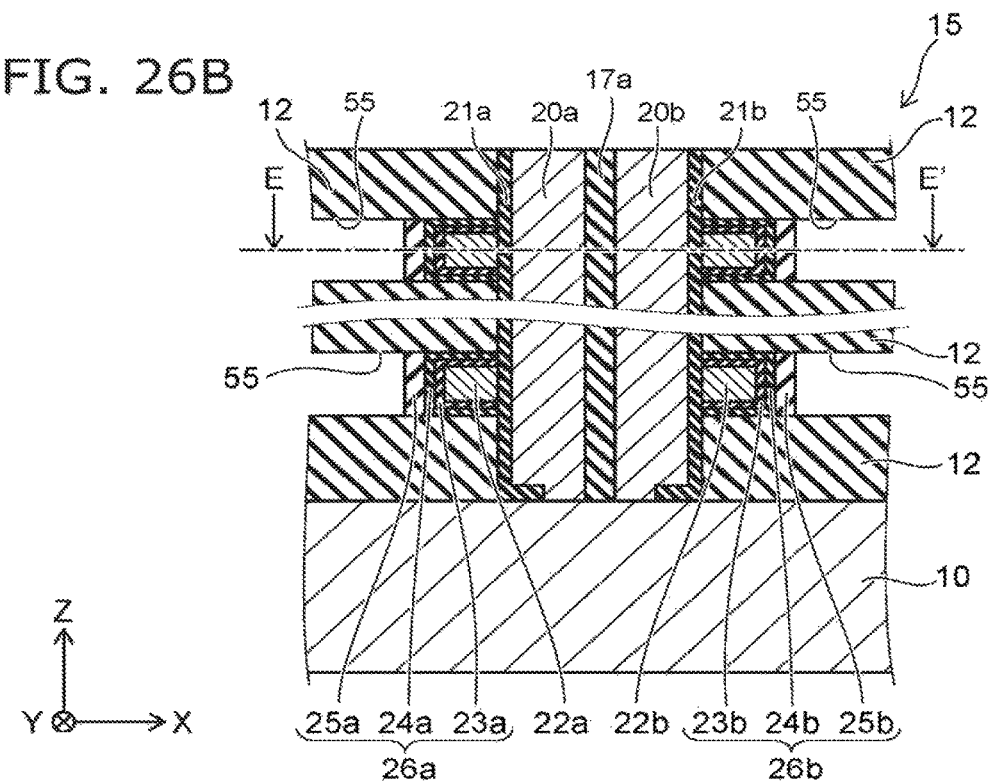

Then, as shown in FIG. 26A and FIG. 26B, wet etching is performed via the opening 57; and the sacrificial films 51 that are made of silicon nitride (referring to FIG. 25B) are removed. Thereby, the spaces 55 are formed between the insulating films 12.

Figure 27A:
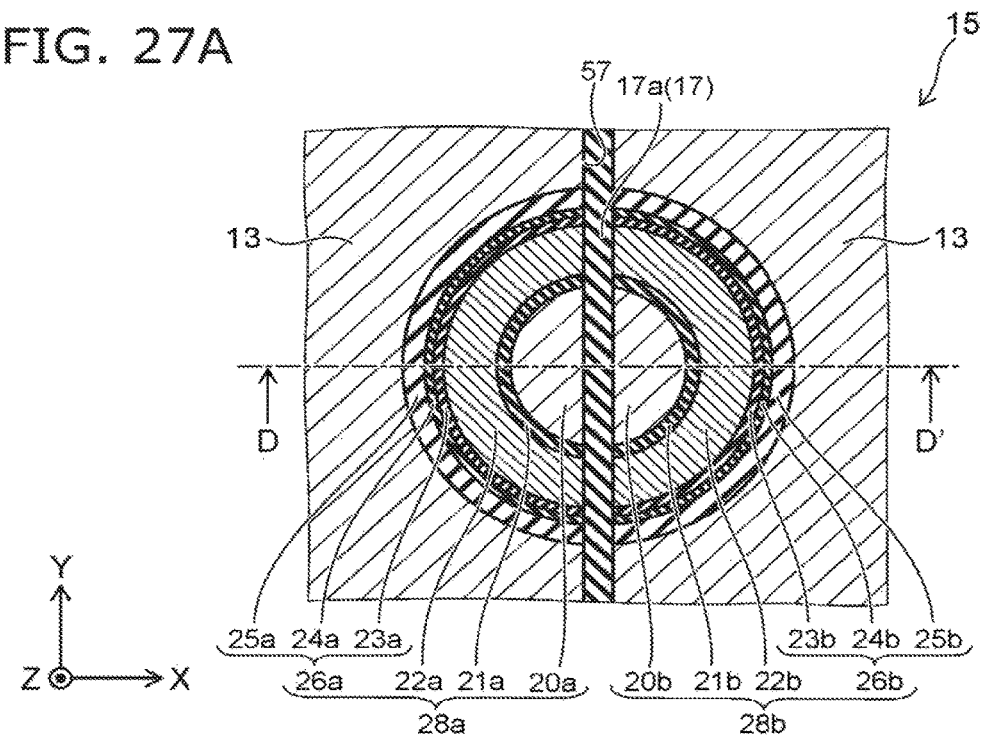
Figure 27B:
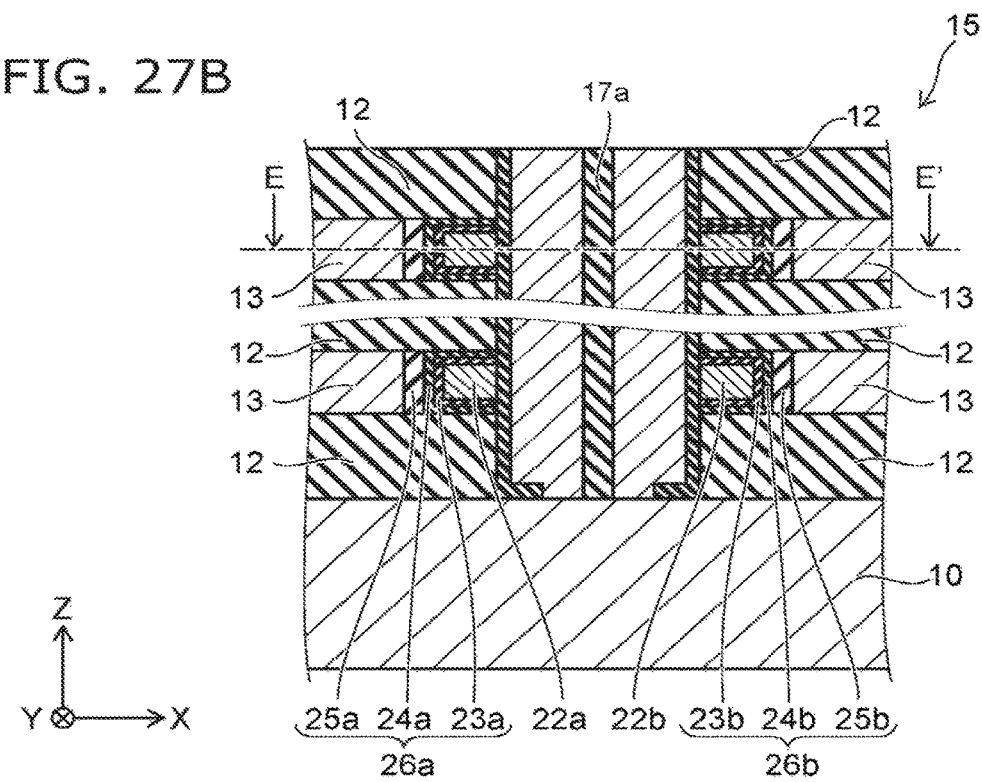

Then, as shown in FIG. 27A and FIG. 27B, the electrode film 13 is formed inside the spaces 55 by depositing a conductive material such as tungsten, etc., via the opening 57. Then, the portion of the electrode film 13 formed inside the opening 57 is removed by performing etching. Then, the insulating member 17 is re-formed by refilling silicon oxide into the opening 57. The method thereafter is similar to that of the first embodiment described above. Thereby, the semiconductor memory device 3 according to the embodiment is manufactured.

Effects of the embodiment will now be described.

In the embodiment, in the process shown in FIG. 25A and FIG. 25B, the opening 57 is formed by removing a portion of the insulating member 17; and in the process shown in FIG. 26A to FIG. 27B, the sacrificial films 51 are replaced with the electrode films 13 via the opening 57. Therefore, it is unnecessary to form the slit ST (referring to FIG. 1) in the stacked body 15 separately from the trench 54 (referring to FIG. 24). As a result, the arrangement density of the silicon pillars 20a and 20b in the X-direction can be increased; and the integration of the memory cell transistors can be increased.

Otherwise, the configuration, the manufacturing method, and the effects of the embodiment are similar to those of the first embodiment described above.

Fourth Embodiment

A fourth embodiment will now be described.

The configuration of a semiconductor memory device according to the embodiment is similar to that of the third embodiment described above.

A method for manufacturing the semiconductor memory device according to the embodiment will now be described.

FIG. 28A to FIG. 31B are cross-sectional views showing the method for manufacturing the semiconductor memory device according to the embodiment.

Figure 28A:
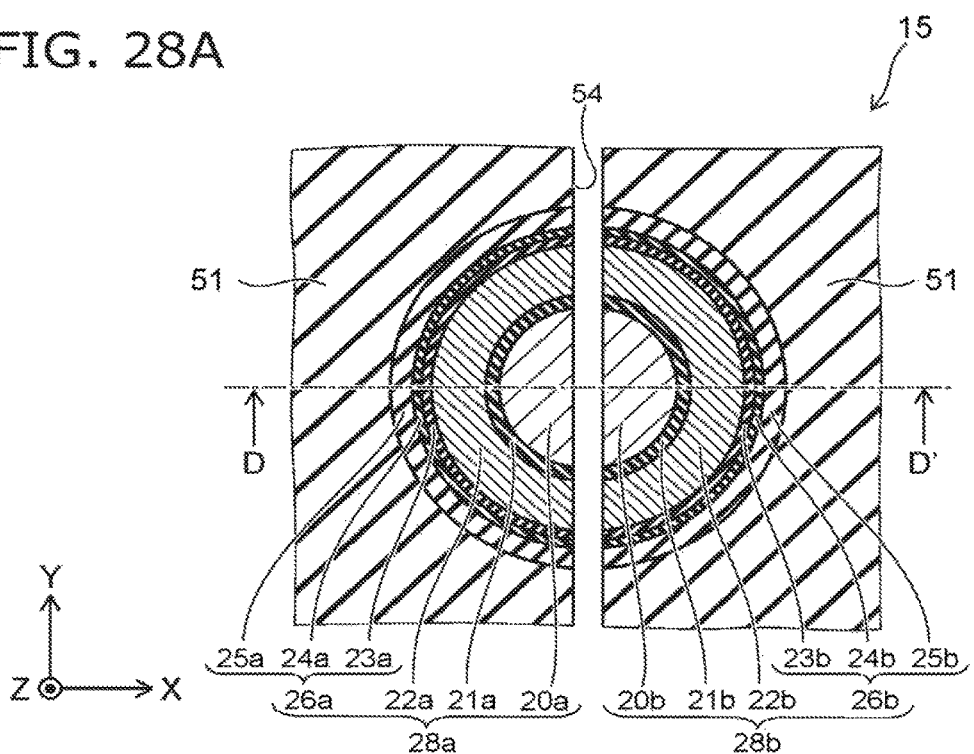
FIG. 28A to FIG. 31B are cross-sectional views showing a method for manufacturing a semiconductor memory device according to a fourth embodiment.
Figure 28B:
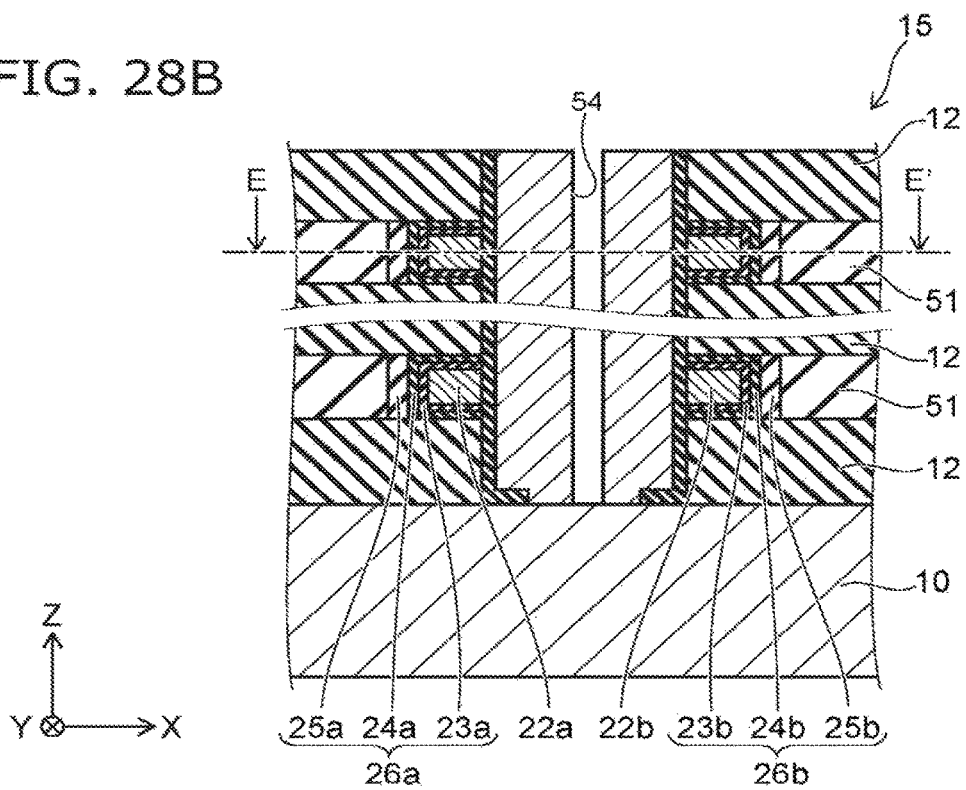

FIG. 28A and FIG. 28B show the same process; FIG. 28B is a cross-sectional view along line D-D' shown in FIG. 28A; and FIG. 28A is a cross-sectional view along line E-E' shown in FIG. 28B. This is similar for FIG. 29A to FIG. 31B as well.

First, the processes shown in FIG. 5A to FIG. 8B are implemented.

Then, as shown in FIG. 28A and FIG. 28B, the silicon and the silicon oxide that are deposited on the stacked body 15 are removed by performing etch-back.

Figure 29A:
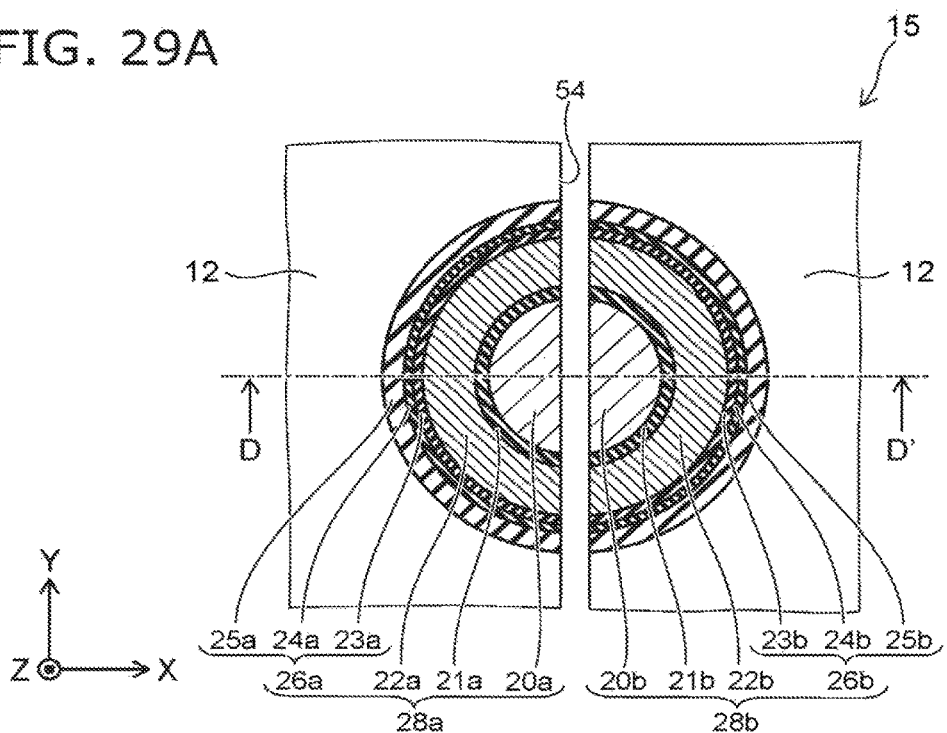
Figure 29B:
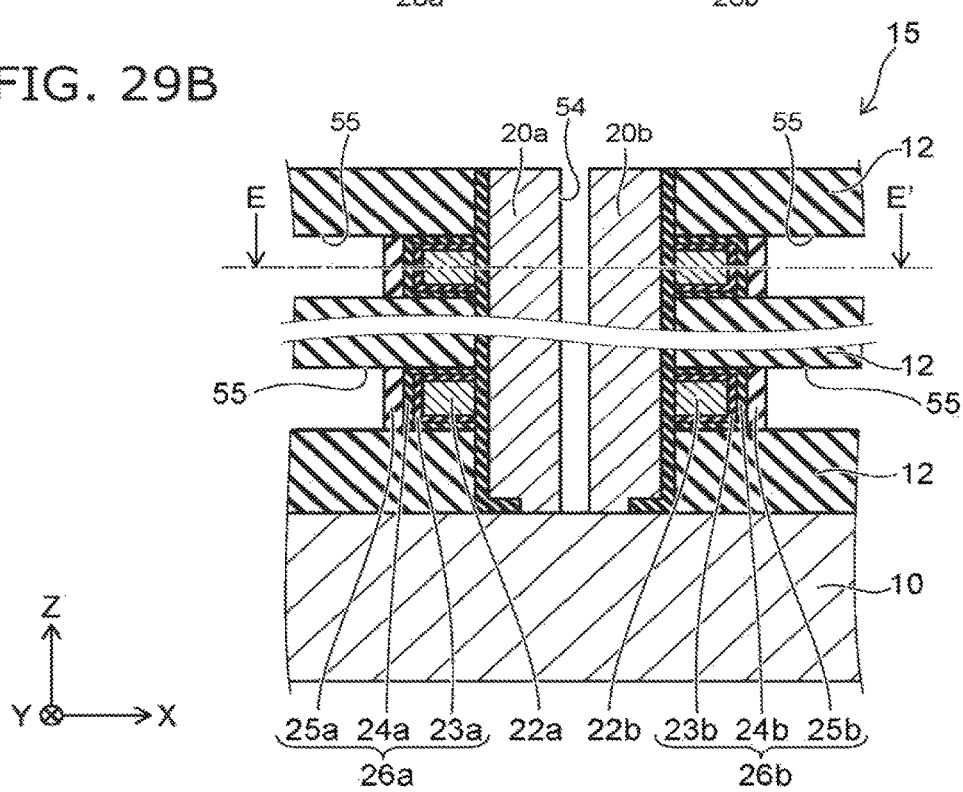

Then, as shown in FIG. 29A and FIG. 29B, the sacrificial films 51 that are made of silicon nitride (referring to FIG. 28B) are removed by performing wet etching via the trench 54. Thereby, the spaces 55 are formed between the insulating films 12.

Figure 30A:
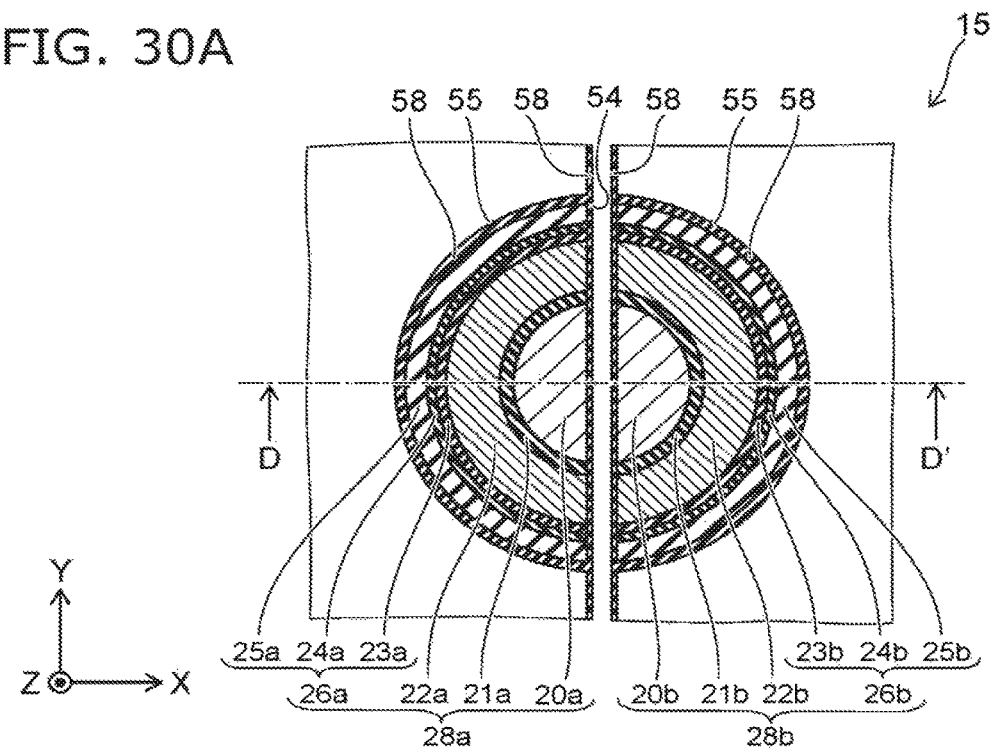
Figure 30B:
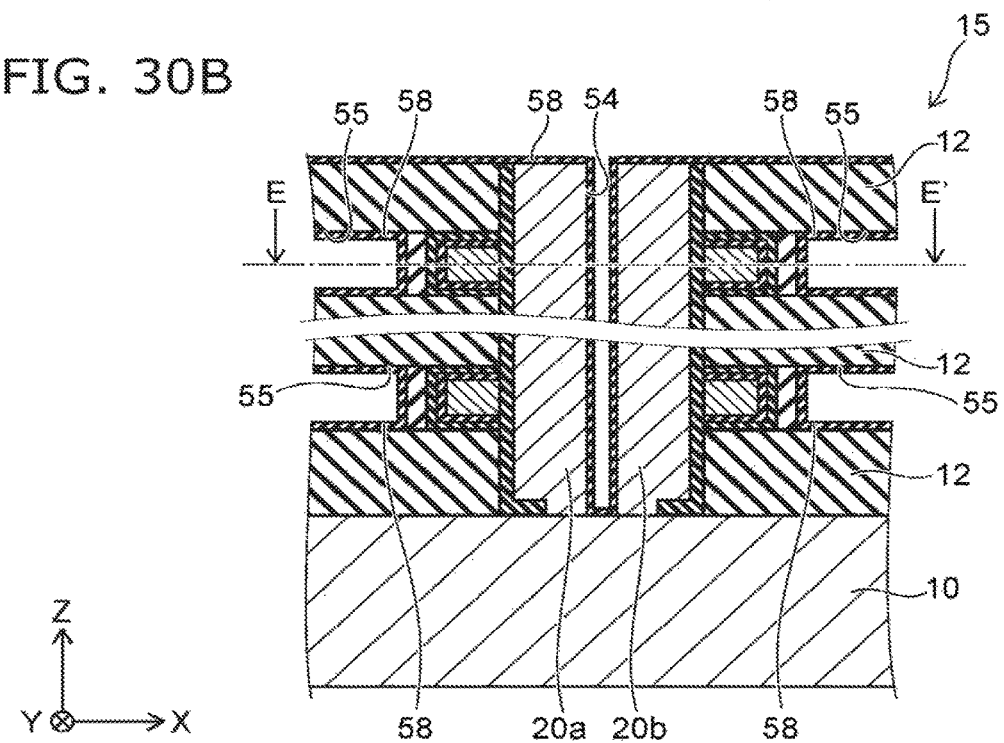

Then, as shown in FIG. 30A and FIG. 30B, a silicon oxide film 58 is formed on the entire surface. The silicon oxide film 58 is formed also on the inner surface of the trench 54 and on the inner surfaces of the spaces 55.

Figure 31A:
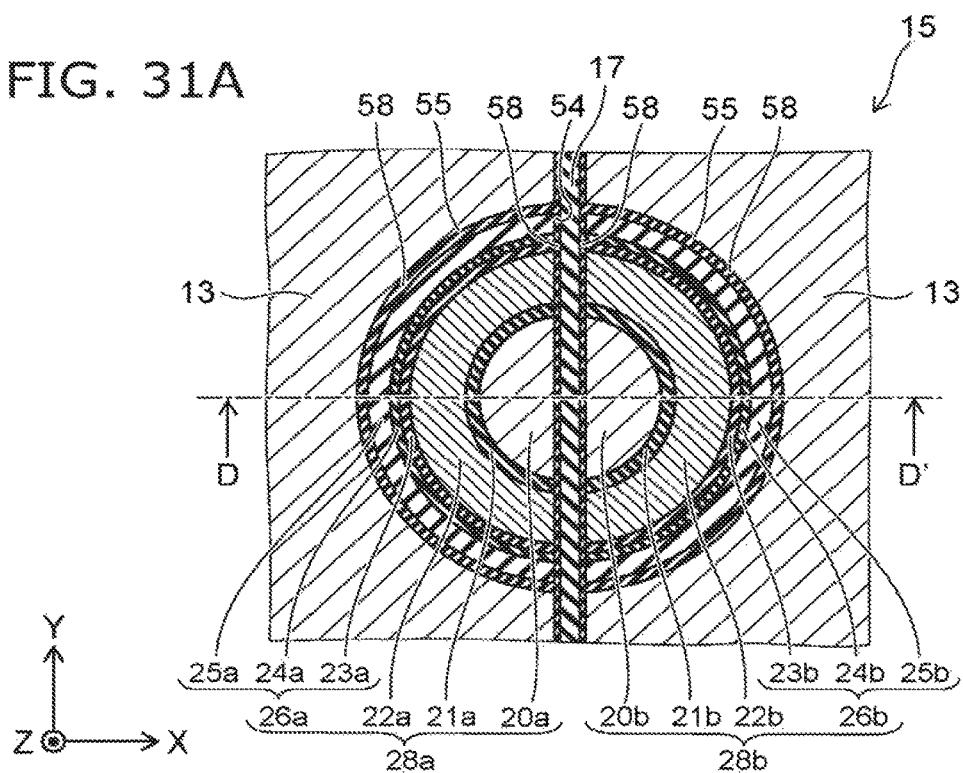
Figure 31B:
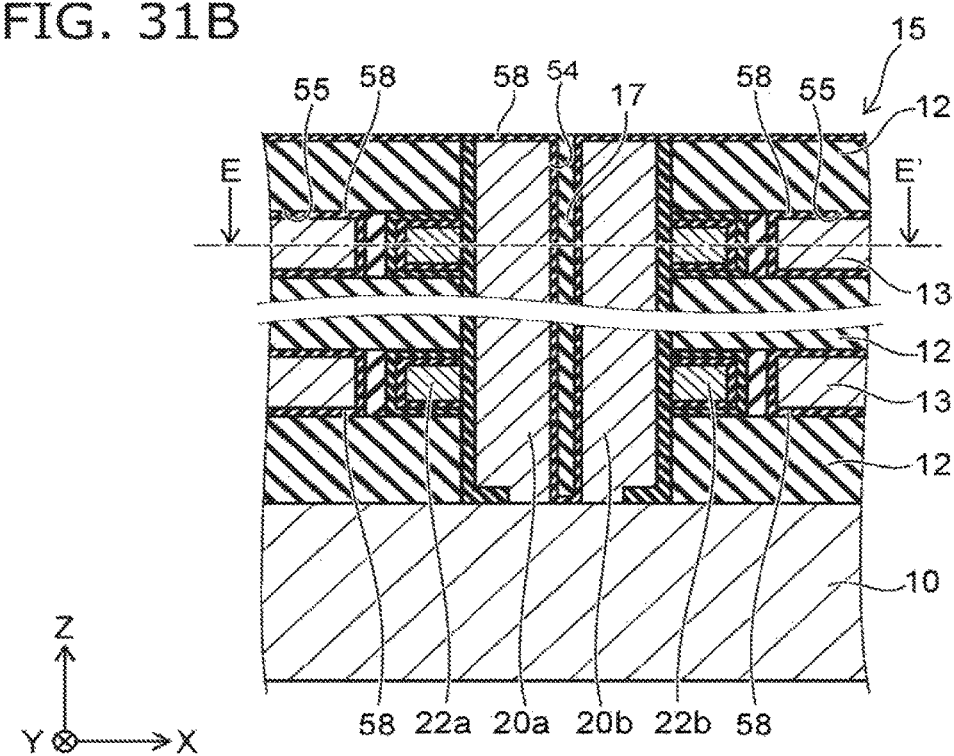

Then, as shown in FIG. 31A and FIG. 31B, the electrode film 13 is formed inside the spaces 55 by depositing a conductive material such as tungsten, etc., via the trench 54. At this time, because the silicon oxide film 58 is formed on the inner surface of the trench 54, the conductive material that is used to form the electrode film 13 does not react with the silicon used to form the silicon pillars 20a and 20b.

Then, the portion of the electrode film 13 formed inside the trench 54 is removed by performing etching. Then, the insulating member 17 is formed by depositing silicon oxide inside the trench 54. The method thereafter is similar to that of the first embodiment described above. Thereby, the semiconductor memory device according to the embodiment is manufactured.

Otherwise, the configuration, the manufacturing method, and the effects of the embodiment are similar to those of the third embodiment described above.

Fifth Embodiment

A fifth embodiment will now be described.

Figure 32:
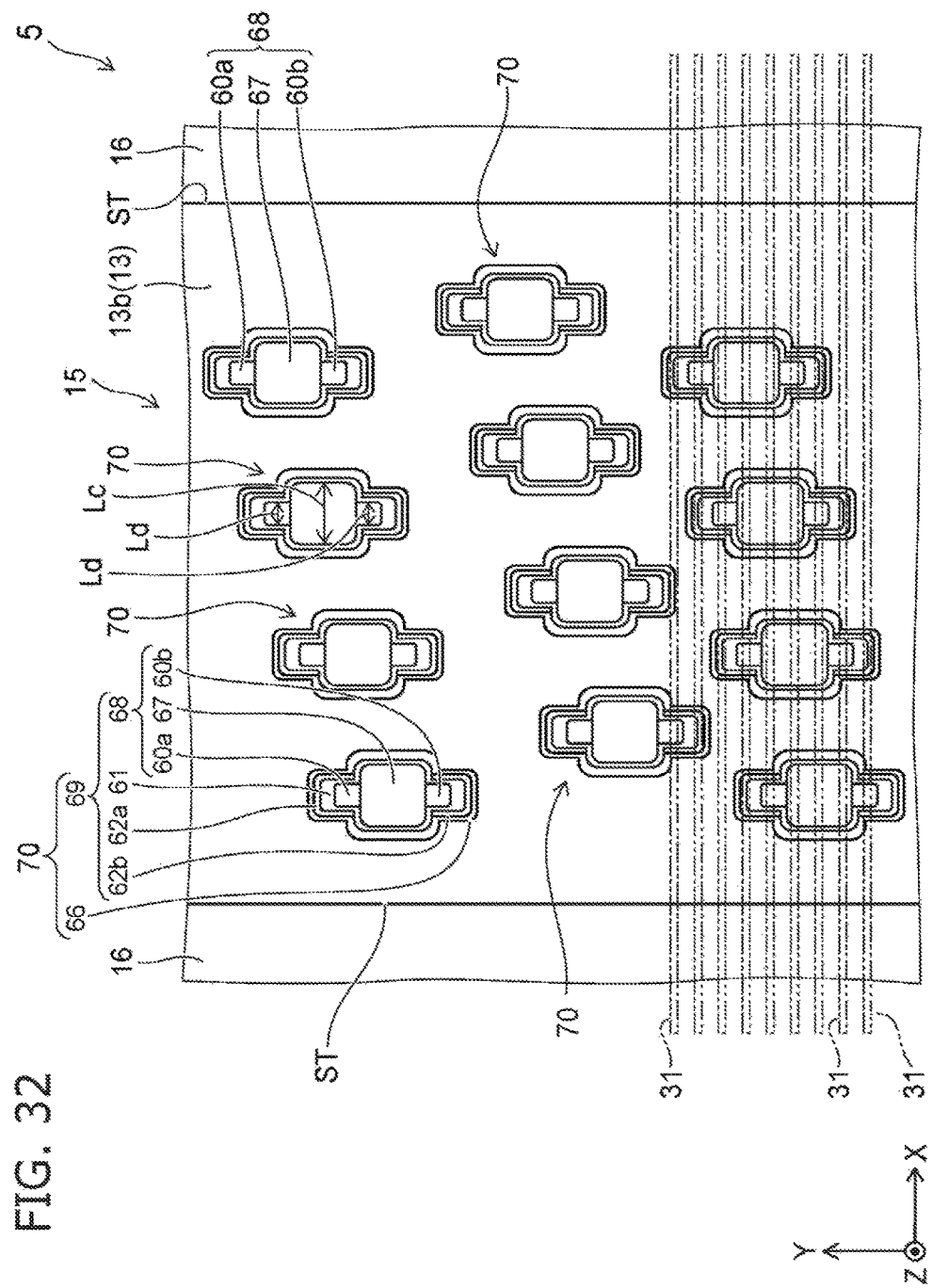
FIG. 32 is a plan view showing a semiconductor memory device according to a fifth embodiment.

FIG. 32 is a plan view showing a semiconductor memory device according to the embodiment.

In the semiconductor memory device 5 according to the embodiment as shown in FIG. 32, an insulating member 67 is provided in the stacked body 15 to pierce the multiple electrode films 13 arranged along the Z-direction. The configuration of the insulating member 67 is a substantially quadrilateral column or a substantially inverted truncated quadrilateral pyramid and extends in the Z-direction. The multiple insulating members 67 are arranged to be separated from each other along the XY plane in each of the fingers 13b of the electrode films 13. The fingers 13b and the insulating plates 16 are arranged alternately along the X-direction.

Silicon pillars 60a and 60b are provided on the two Y-direction sides of the insulating member 67. The configurations of the silicon pillars 60a and 60b are substantially quadrilateral columns or substantially inverted truncated quadrilateral pyramids and extend in the Z-direction. A length Lc of the insulating member 67 in the X-direction is longer than a length Ld of the silicon pillars 60a and 60b in the X-direction. In other words, Lc>Ld. A columnar body 68 includes the silicon pillars 60a and 60b and the insulating member 67 disposed between the silicon pillars 60a and 60b.

A tunneling insulating film 61 is provided on the side surface of the columnar body 68. The configuration of the tunneling insulating film 61 is a tubular configuration surrounding the columnar body 68 when viewed from the Z-direction. Floating gate electrodes 62a and 62b are provided on the two Y-direction sides of the tunneling insulating film 61. When viewed from the Z-direction, the floating gate electrode 62a covers the region of the side surface of the silicon pillar 20a other than the region of the side surface opposing the insulating member 67. Similarly, when viewed from the Z-direction, the floating gate electrode 62b covers the region of the side surface of the silicon pillar 20b other than the region of the side surface opposing the insulating member 67. A columnar body 69 includes the columnar body 68, the tunneling insulating film 61, and the floating gate electrodes 62a and 62b.

A blocking insulating film 66 is provided on the side surface of the columnar body 69. The configuration of the blocking insulating film 66 is a tubular configuration surrounding the columnar body 69 when viewed from the Z-direction. The film configuration of the blocking insulating film 66 is similar to the film configuration of the blocking insulating film 26a (referring to FIG. 3) of the first embodiment described above. A NAND structure body 70 includes the columnar body 69 and the blocking insulating film 66. When viewed from the Z-direction, the electrode films 13 surround each of the NAND structure bodies 70.

A method for manufacturing the semiconductor memory device according to the embodiment will now be described.

FIG. 33A to FIG. 40C are cross-sectional views showing the method for manufacturing the semiconductor memory device according to the embodiment.

Figure 33A:
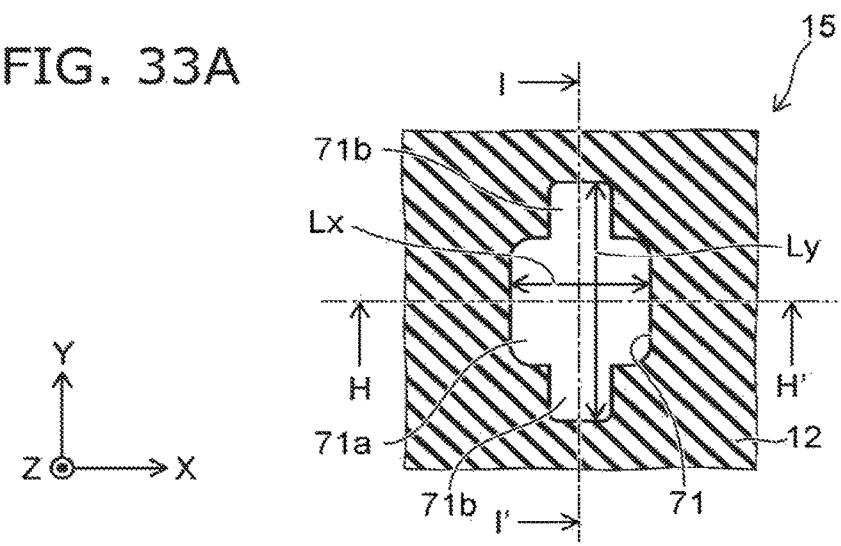
FIG. 33A to FIG. 40C are cross-sectional views showing a method for manufacturing a semiconductor memory device according to the fifth embodiment.
Figure 33B:
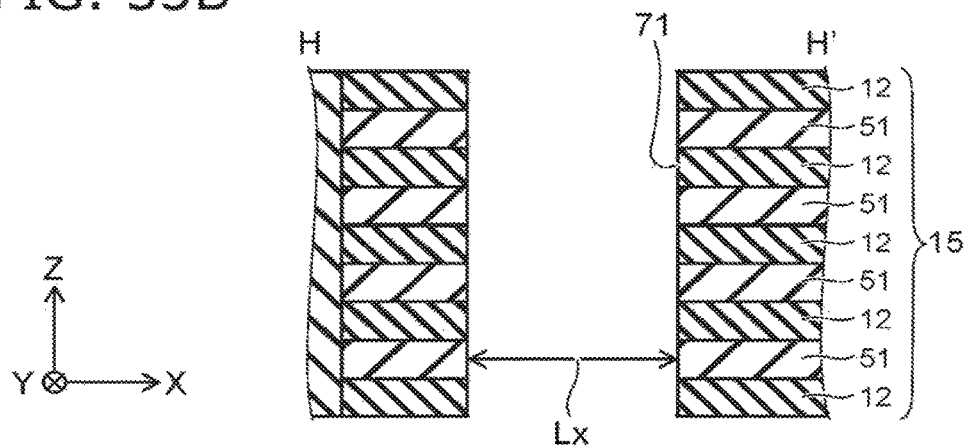
Figure 33C:
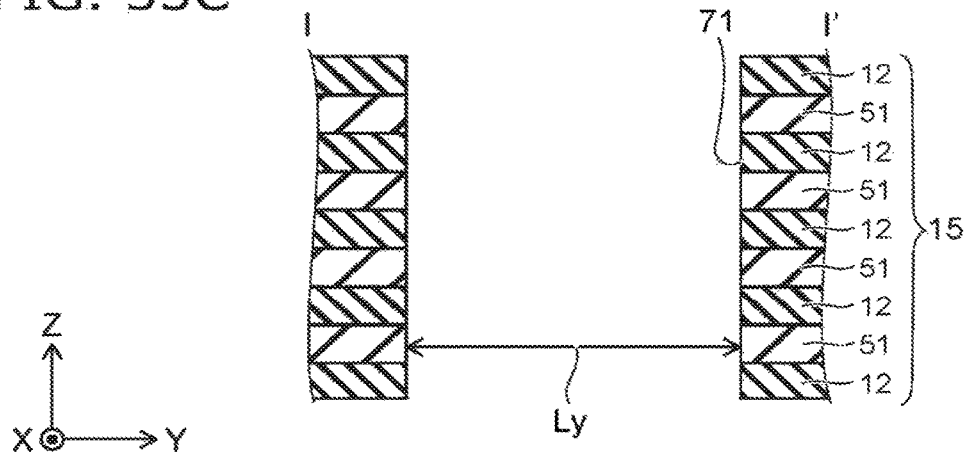

FIG. 33A to FIG. 33C show the same process; FIG. 33B is a cross-sectional view along line H-H' shown in FIG. 33A; and FIG. 33C is a cross-sectional view along line I-I' shown in FIG. 33A. This is similar for FIG. 34A to FIG. 40C as well.

First, as shown in FIG. 33A to FIG. 33C, the stacked body 15 is formed by forming the insulating films 12 and the sacrificial films 51 alternately on the silicon substrate 10 (referring to FIG. 2). For example, the insulating films 12 are formed by depositing silicon oxide (SiO); and, for example, the sacrificial films 51 are formed by depositing silicon nitride (SiN). Then, the end portion of the stacked body 15 is patterned into a stairstep configuration.

Then, for example, a memory hole 71 is formed in the stacked body 15 by lithography and RIE. The configuration of the memory hole 71 when viewed from the Z-direction is set to be a configuration in which one substantially square major portion 71a is linked to two substantially rectangular sub portions 71b provided on the two Y-direction sides of the major portion 71a. The length of the major portion 71a in the X-direction is longer than the lengths of the sub portions 71b in the X-direction. The configuration of the memory hole 71 when viewed from the Z-direction is cross-shaped; and a length Ly in the Y-direction is longer than a length Lx in the X-direction. In other words, Ly>Lx.

Figure 34A:
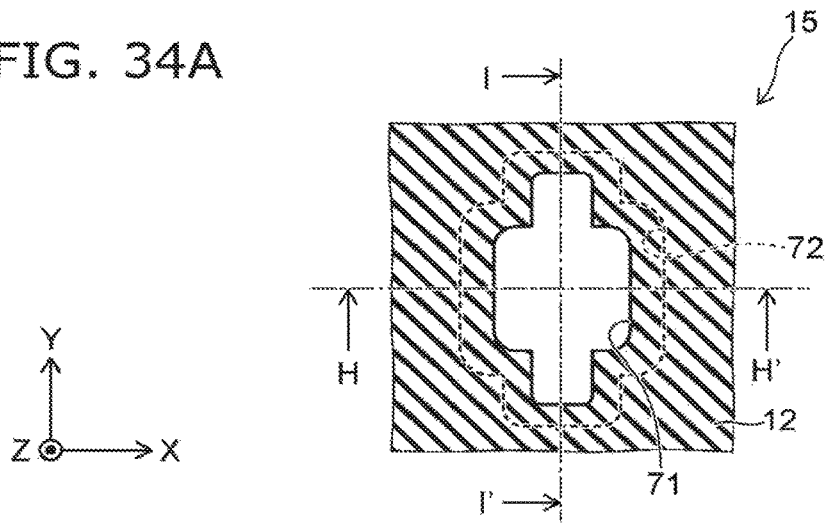
Figure 34B:
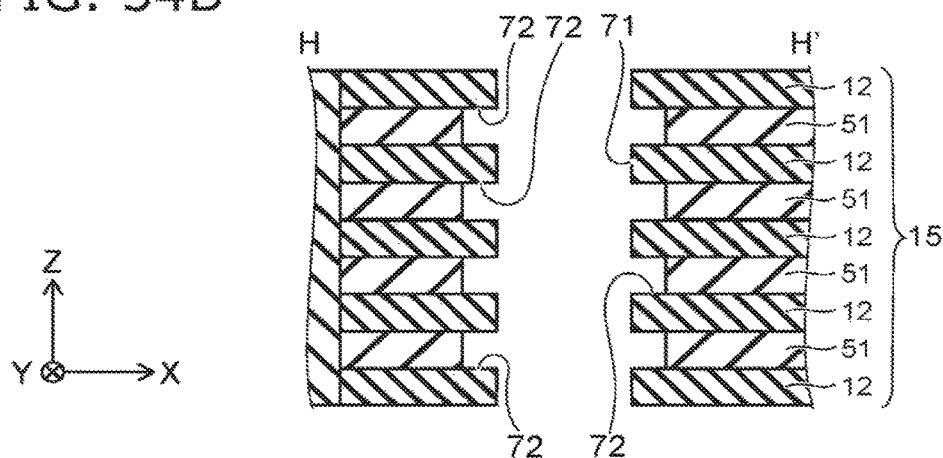
Figure 34C:
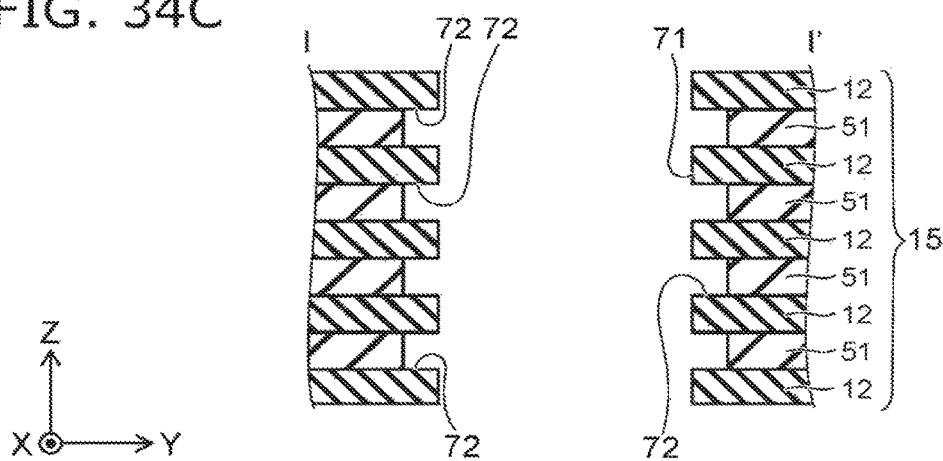

Then, as shown in FIG. 34A to FIG. 34C, the sacrificial films 51 are recessed via the memory hole 71. For example, wet etching is performed using hot phosphoric acid as the etchant. Thereby, recesses 72 are formed in the regions of the inner surface of the memory hole 71 where the sacrificial films 51 are exposed.

Figure 35A:
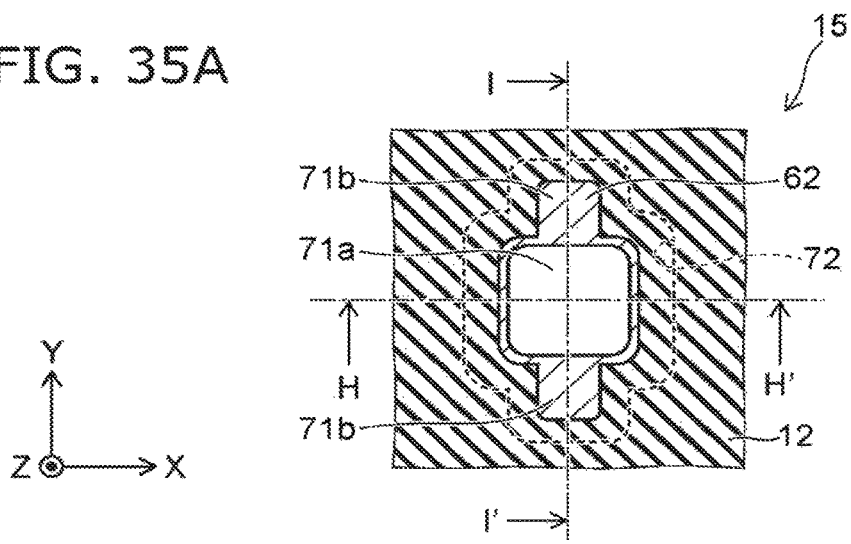
Figure 35B:
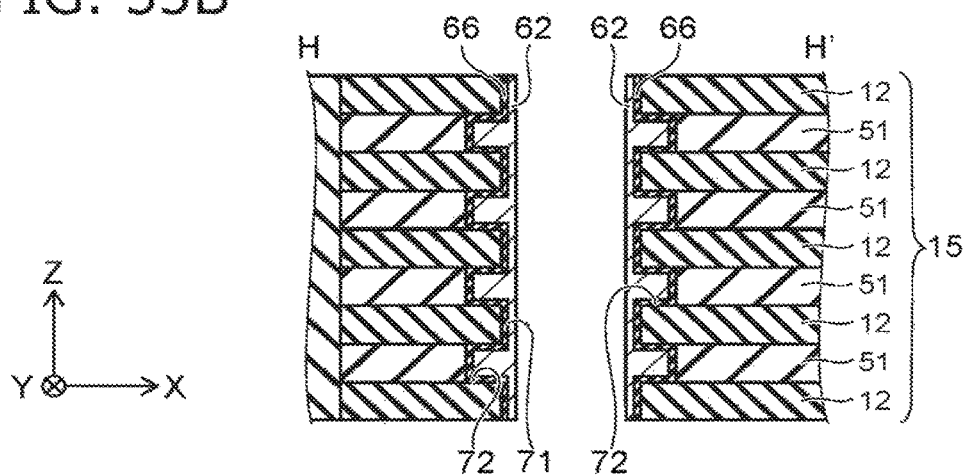
Figure 35C:
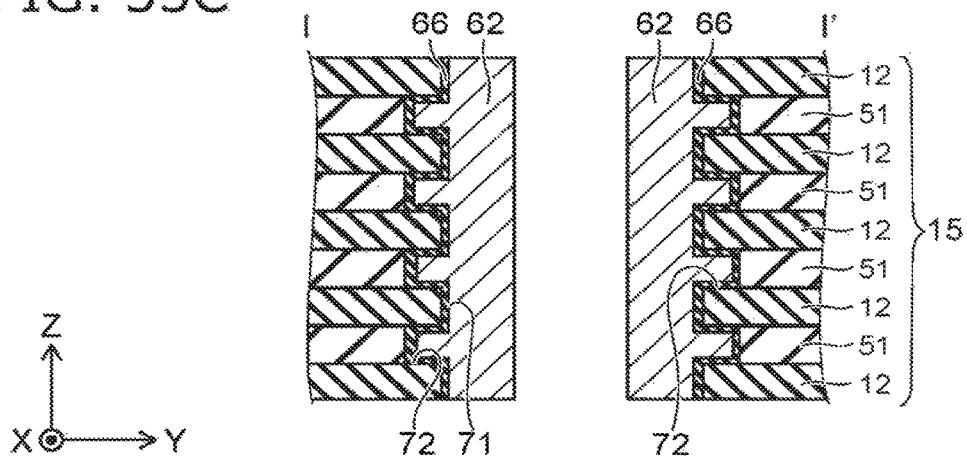

Then, as shown in FIG. 35A to FIG. 35C, the blocking insulating film 66 is formed on the inner surfaces of the memory hole 71 and the recesses 72. Then, a silicon film 62 is formed by depositing silicon. At this time, the silicon film 62 is formed so that the interiors of the recesses 72 and the interiors of the sub portions 71b are filled, but the major portion 71a is not filled.

Figure 36A:
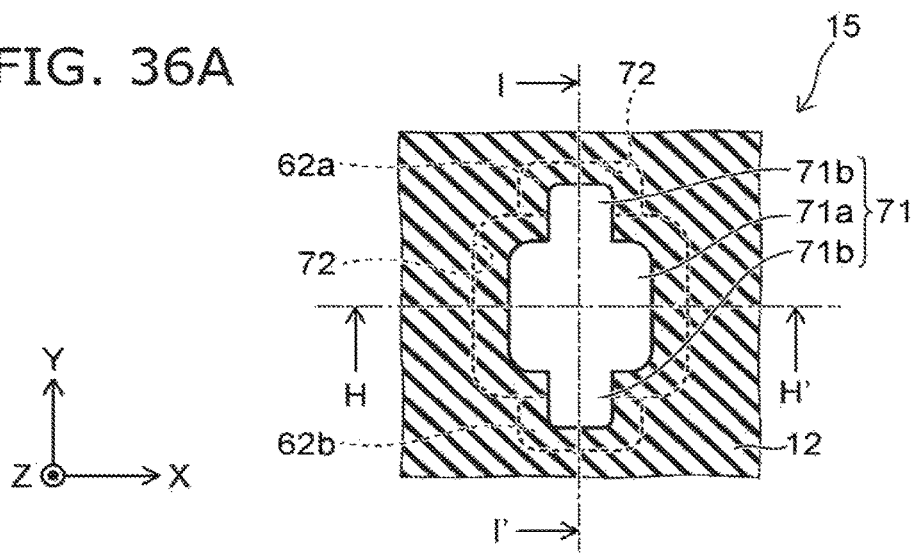
Figure 36B:
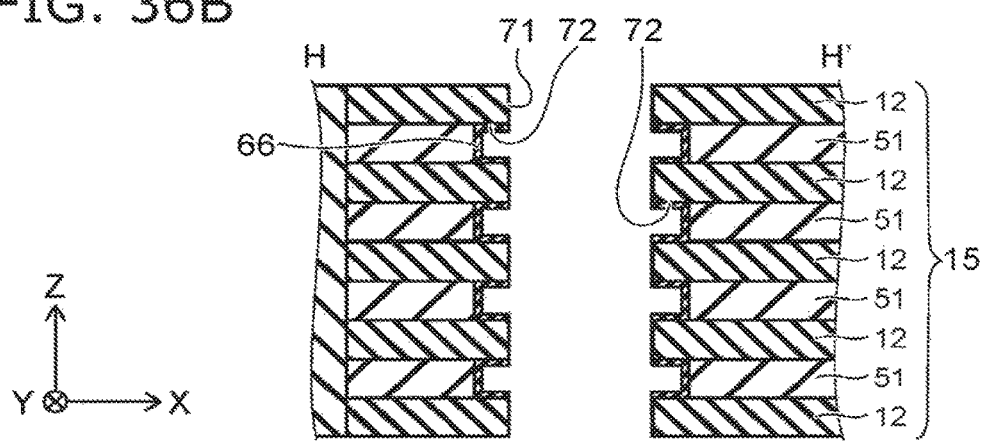
Figure 36C:
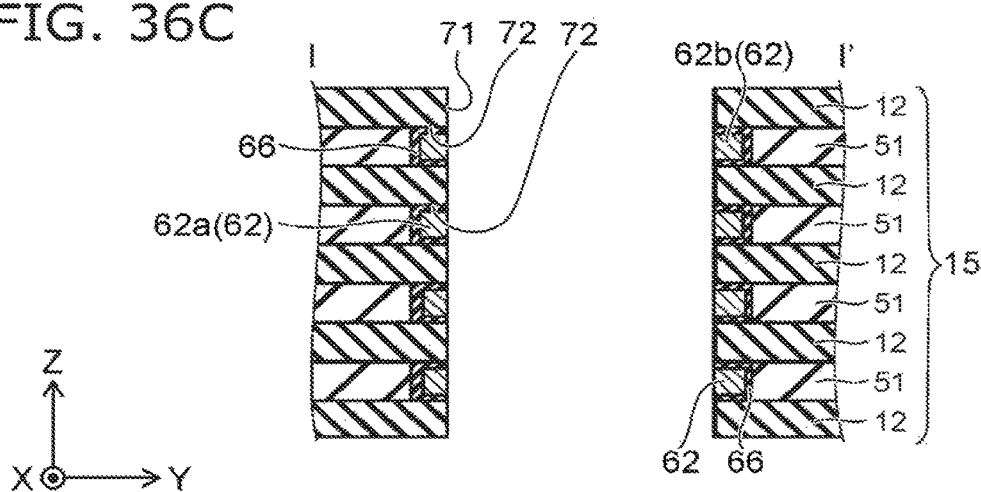

Then, as shown in FIG. 36A to FIG. 36C, the silicon film 62 is recessed by performing wet etching or dry etching. At this time, the distances from the exposed surface of the silicon film 62 to the portions of the recess 72 surrounding the sub portions 71b are longer than the distances from the exposed surface of the silicon film 62 to the portions of the recess 72 positioned on the two X-direction sides of the major portion 71a. Therefore, by stopping the etching of the silicon film 62 at an appropriate timing, the silicon film 62 can be removed from the interior of the memory hole 71 and the interiors of the portions of the recess 72 positioned on the two X-direction sides of the major portion 71a and can be caused to remain only inside the portions of the recess 72 surrounding the sub portions 71b. As a result, the floating gate electrodes 62a and 62b that are made of silicon are formed inside the portions of the recess 72 surrounding the sub portions 71b. Then, the blocking insulating film 66 is recessed, removed from the interior of the memory hole 71, and caused to remain only on the inner surfaces of the recesses 72. Thereby, the blocking insulating film 66 is divided every recess 72.

Figure 37A:
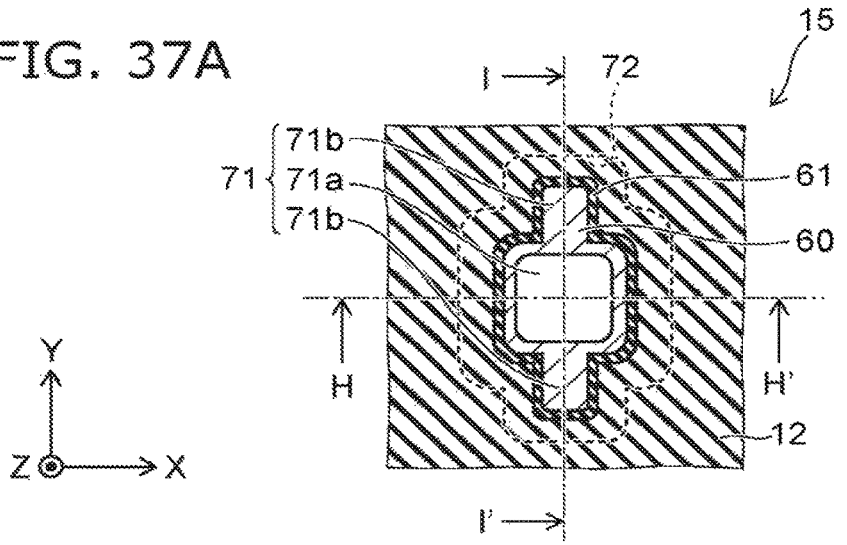
Figure 37B:
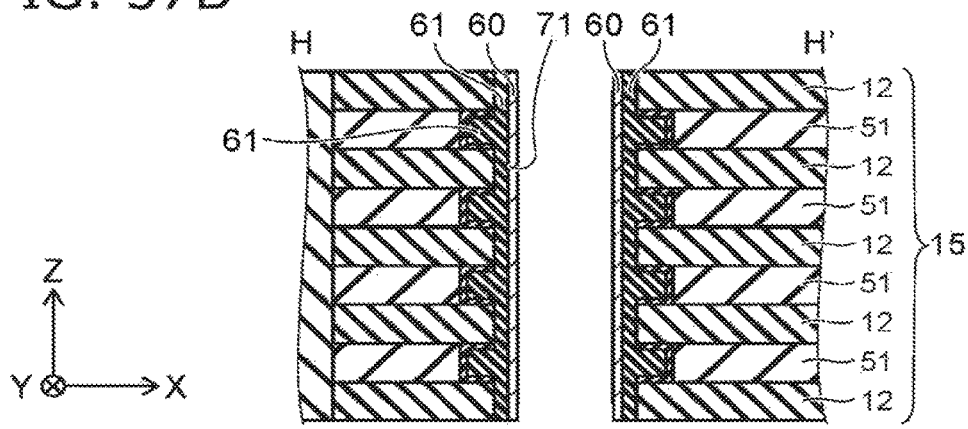
Figure 37C:
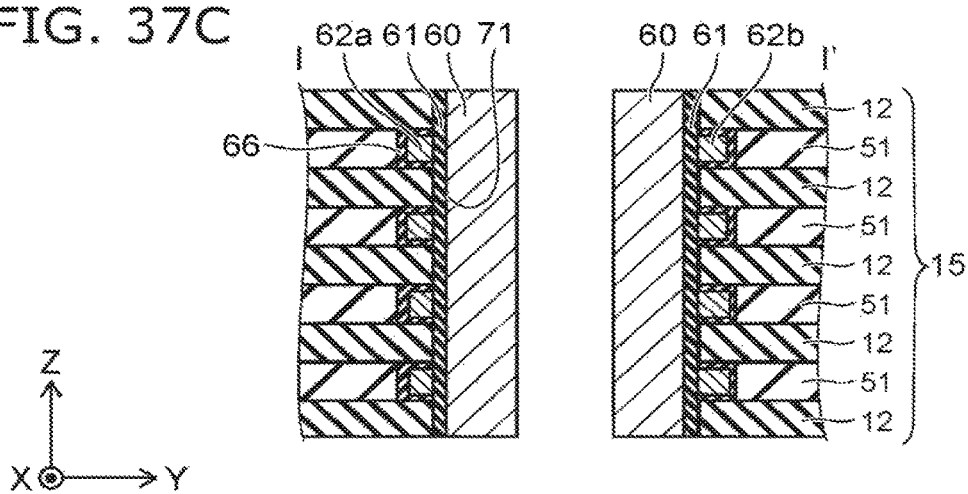

Then, as shown in FIG. 37A to FIG. 37C, the tunneling insulating film 61 is formed on the inner surface of the memory hole 71. At this time, the portions of the recesses 72 not filled with the floating gate electrodes 62a and 62b are filled with the tunneling insulating film 61. Then, a cover silicon layer (not illustrated) is formed on the inner surface of the memory hole 71 by depositing silicon. Then, the cover silicon layer and the tunneling insulating film 61 that are on the bottom surface of the memory hole 71 are removed by performing anisotropic etching such as RIE, etc. Then, a silicon film 60 is formed by filling body silicon. At this time, the silicon film 60 is formed so that the interiors of the sub portions 71b are filled, but the major portion 71a is not filled.

Figure 38A:
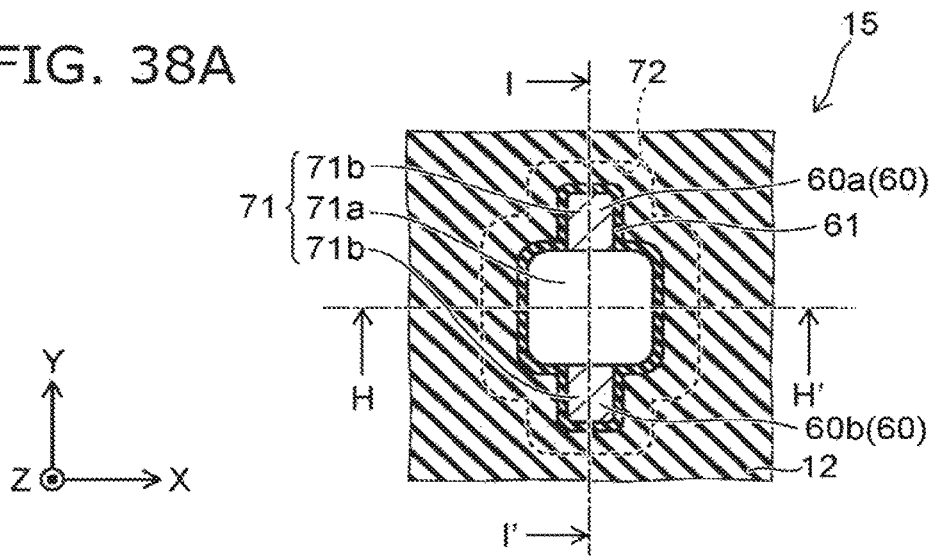
Figure 38B:
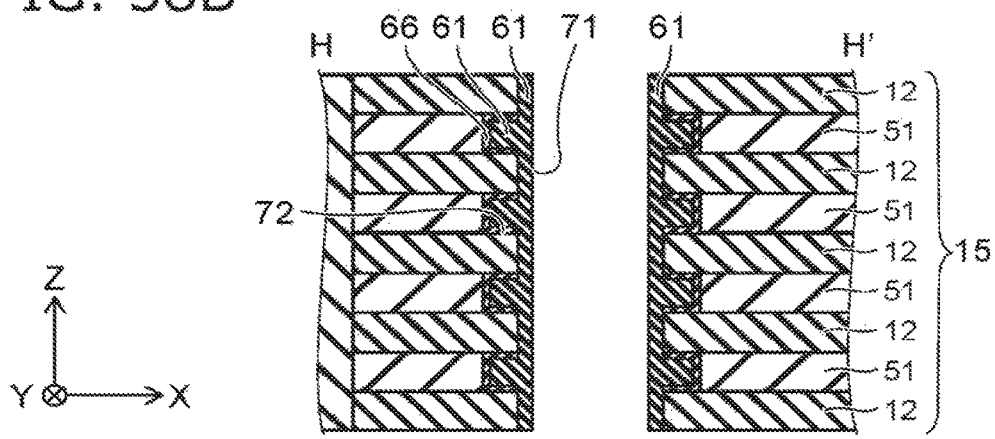
Figure 38C:
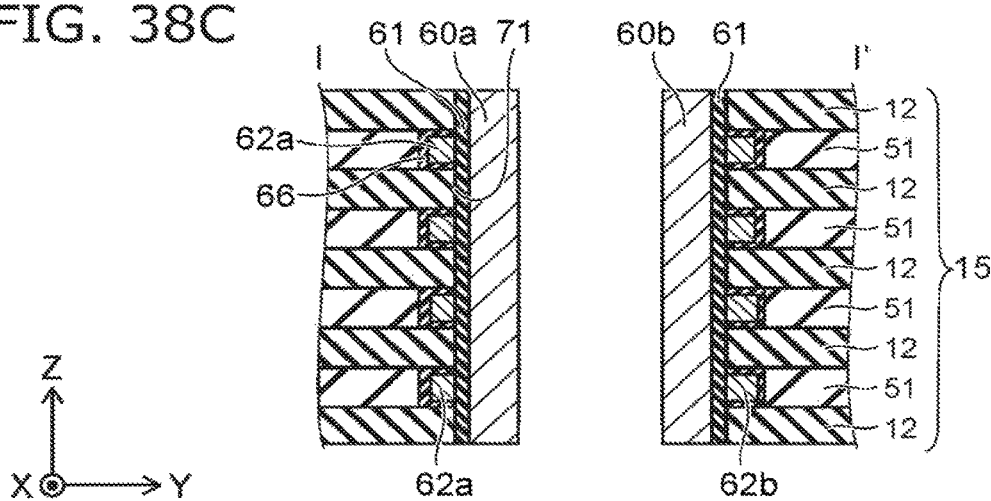

Then, as shown in FIG. 38A to FIG. 38C, the silicon film 60 is recessed by performing wet etching or dry etching. At this time, the distances from the exposed surface of the silicon film 60 to the side surfaces of the sub portions 71b are longer than the distance from the exposed surface of the silicon film 60 to the side surface of the major portion 71a. Therefore, by stopping the etching of the silicon film 60 at an appropriate timing, the silicon film 60 can be removed from the interior of the major portion 71a and can be caused to remain inside the sub portions 71b. As a result, the silicon film 60 is patterned into the silicon pillars 60a and 60b. The silicon pillars 60a and 60b are disposed respectively inside the sub portions 71b.

Figure 39A:
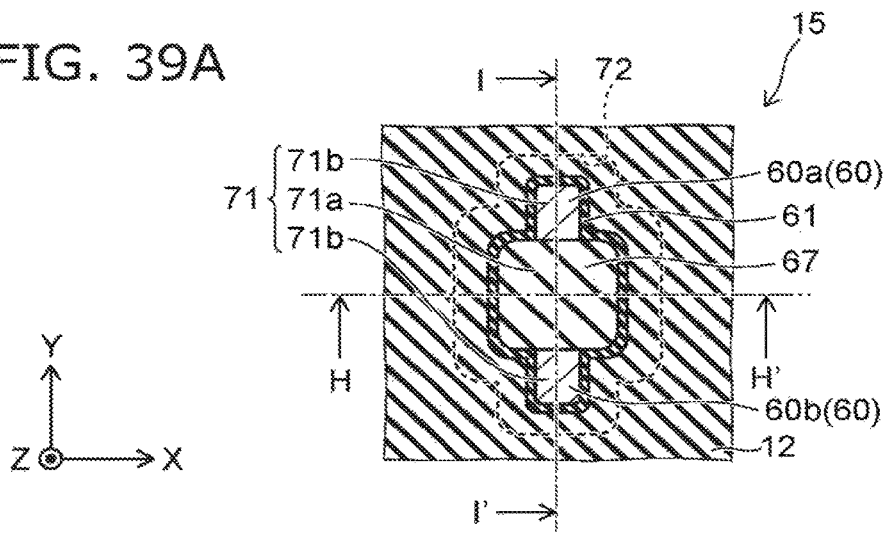
Figure 39B:
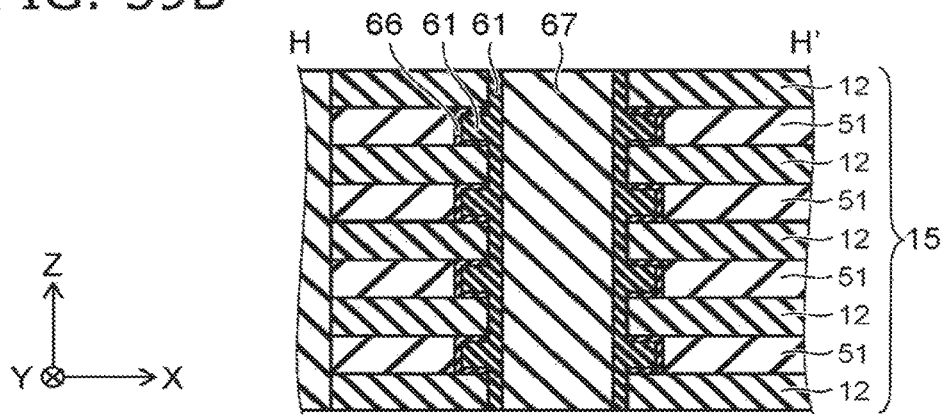
Figure 39C:
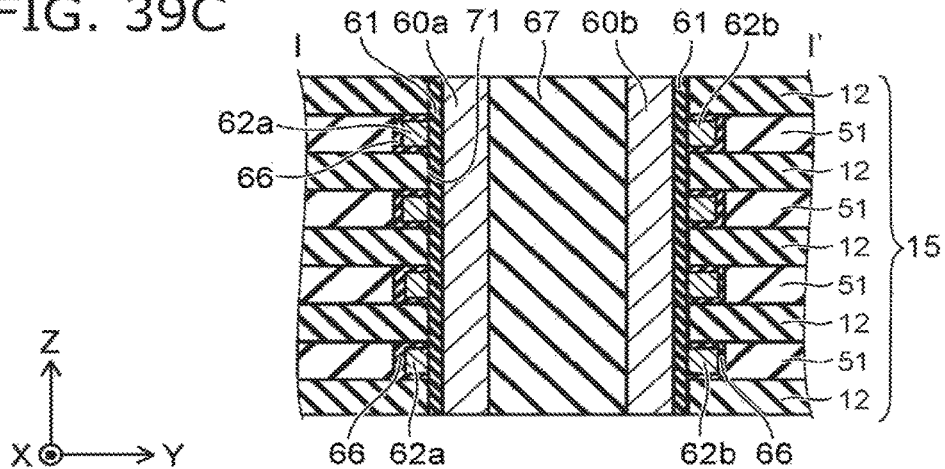

Then, silicon oxide is deposited as shown in FIG. 39A to FIG. 39C. Thereby, the insulating member 67 is formed in the memory hole 71.

Figure 40A:
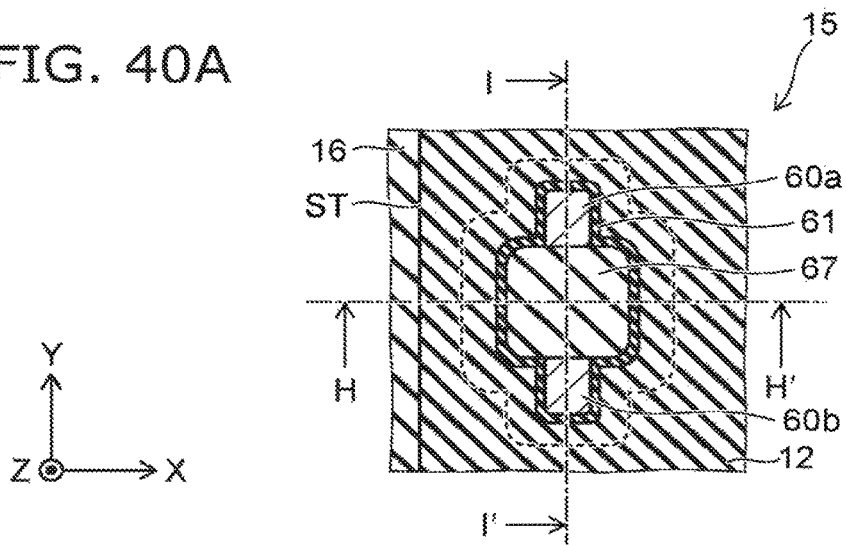
Figure 40B:
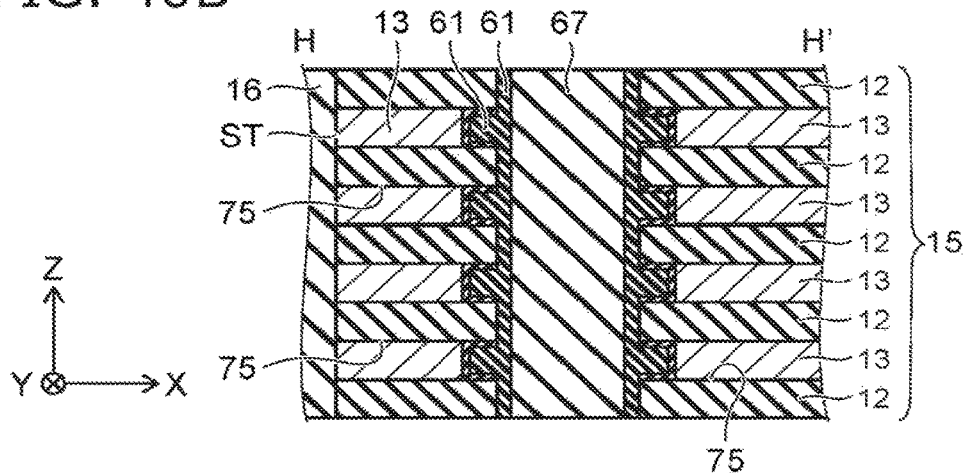
Figure 40C:
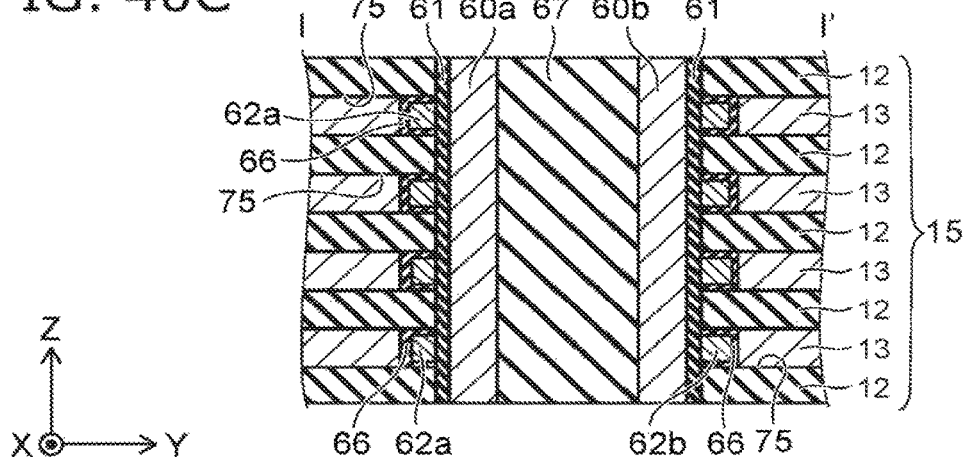

Then, as shown in FIG. 40A to FIG. 40C, the slit ST that extends in the Y-direction is formed in the stacked body 15. The slit ST reaches the silicon substrate 10. Then, the sacrificial films 51 (referring to FIG. 39B) are removed by etching via the slit ST. For example, wet etching is performed using hot phosphoric acid as the etchant. Thereby, spaces 75 are formed between the insulating films 12 adjacent to each other in the Z-direction. Then, a conductive material such as tungsten or the like is filled into the spaces 75 via the slit ST. Then, the conductive material that is deposited inside the slit ST is removed by performing anisotropic etching such as RIE, etc. Thereby, the electrode film 13 is formed inside each of the spaces 75. Then, the insulating plate 16 is formed by filling an insulating material such as silicon oxide, etc., into the slit ST.

Then, as shown in FIG. 32, the upper layer interconnects such as the bit lines 31, etc., are formed on the stacked body 15. Thus, the semiconductor memory device 5 according to the embodiment is manufactured.

Effects of the embodiment will now be described.

In the embodiment, in the process shown in FIG. 33A to FIG. 33C, the cross-shaped memory hole 71 is formed so that the length Ly in the Y-direction is longer than the length Lx in the X-direction. Subsequently, the recesses 72 are formed in the side surface of the memory hole 71 in the process shown in FIG. 34A to FIG. 34C; the silicon film 62 is formed on the side surface of the memory hole 71 in the process shown in FIG. 35A to FIG. 35C; and the silicon film 62 is recessed in the process shown in FIG. 36A to FIG. 36C. Thereby, the floating gate electrodes 62a and 62b can be formed self-aligningly inside the portions of the recess 72 surrounding the two sub portions 71b.

Also, the silicon film 60 is formed on the side surface of the memory hole 71 in the process shown in FIG. 37A to FIG. 37C; and the silicon film 60 is recessed in the process shown in FIG. 38A to FIG. 38C. Thereby, the silicon pillars 60a and 60b can be formed self-aligningly inside the sub portions 71b of the memory hole 71. As a result, compared to the case where the silicon film 60 is subdivided into the silicon pillars 60a and 60b by using a dedicated mask, the fluctuation of the configurations of the silicon pillars 60a and 60b caused by alignment shift of the mask can be avoided; and the cell current that flows in the silicon pillars 60a and 60b can be stabilized. Thereby, while maintaining the necessary stability of the operations, the silicon pillars 60a and 60b can be downscaled; and the integration of the semiconductor memory device 5 can be increased.

Further, according to the embodiment, the processes can be simplified compared to the first embodiment described above because the function of the memory hole MH (referring to FIG. 5A and FIG. 5B) and the function of the trench 54 (referring to FIG. 8A and FIG. 8B) can be performed by the memory hole 71 (referring to FIG. 33A to FIG. 33C).

Otherwise, the configuration, the manufacturing method, and the effects of the embodiment are similar to those of the first embodiment described above.

Sixth Embodiment

A sixth embodiment will now be described.

Figure 41:
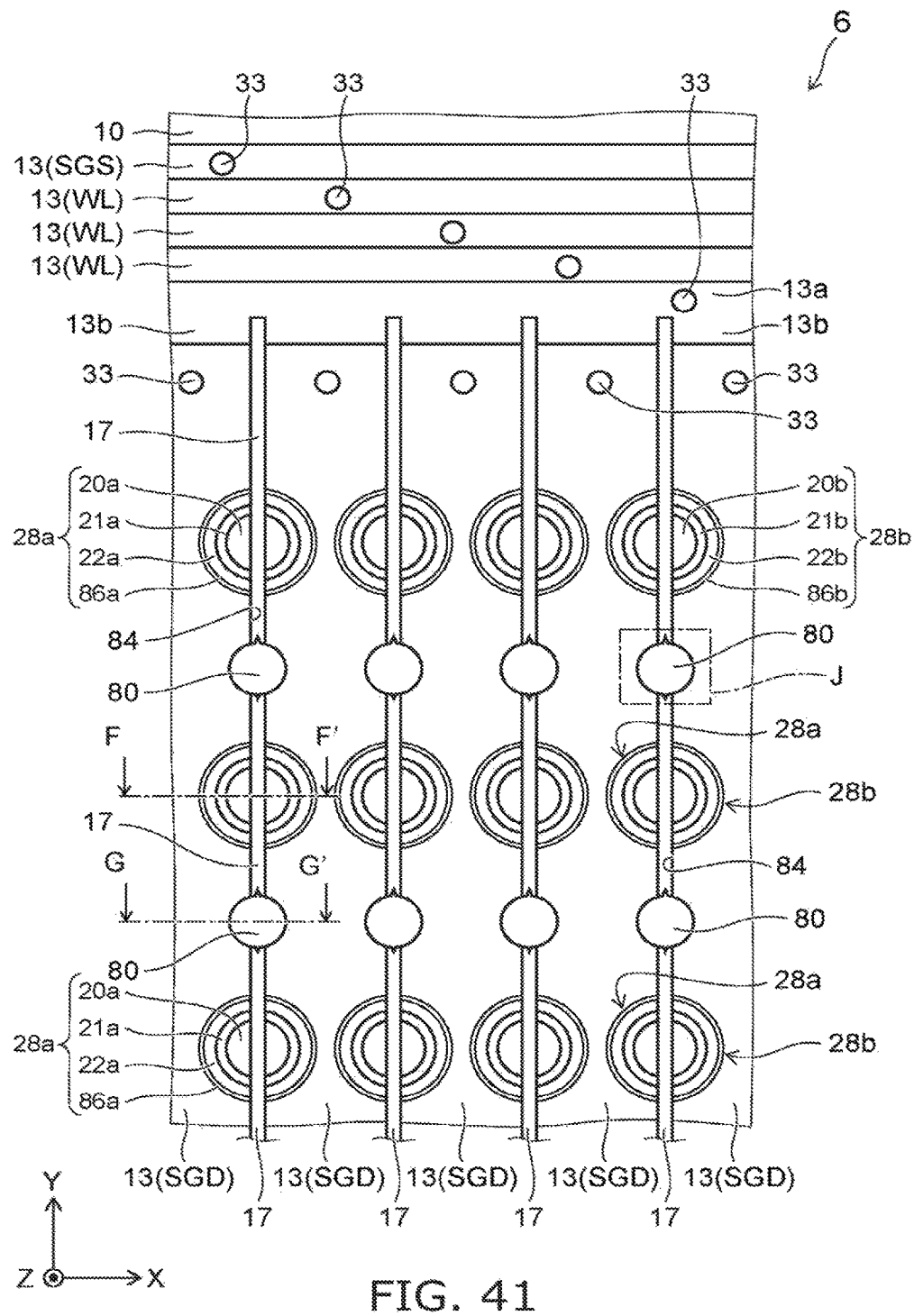
FIG. 41 is a plan view showing a semiconductor memory device according to a sixth embodiment.

FIG. 41 is a plan view showing a semiconductor memory device according to the embodiment.

Figure 42:
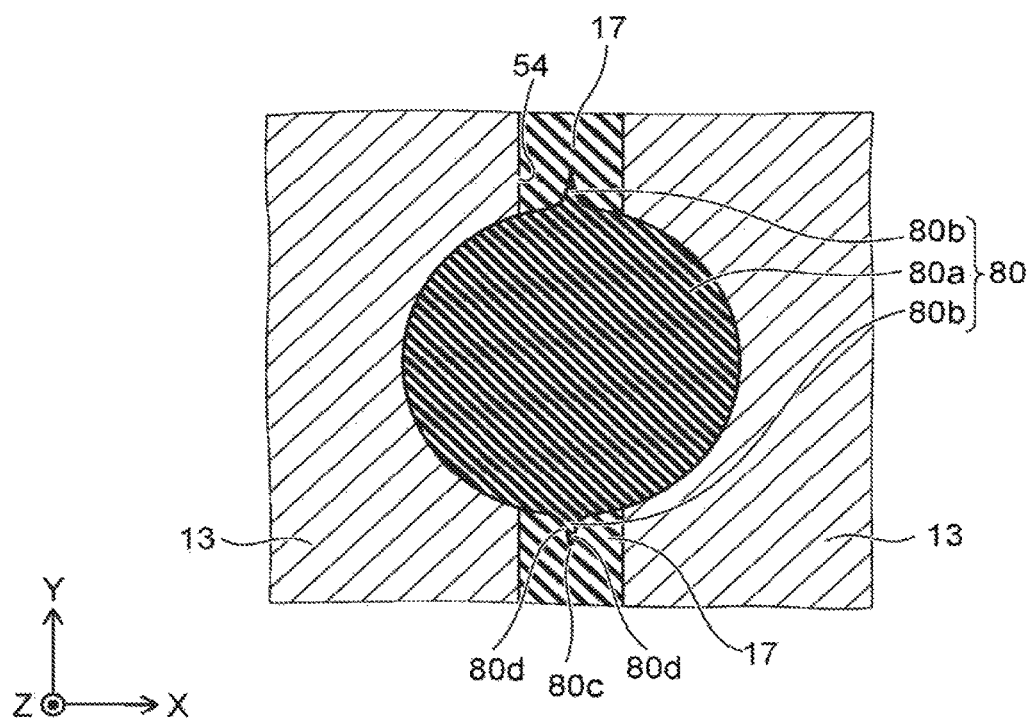
FIG. 42 is a plan view showing region J of FIG. 41.

FIG. 42 is a plan view showing region J of FIG. 41.

Figure 43A:
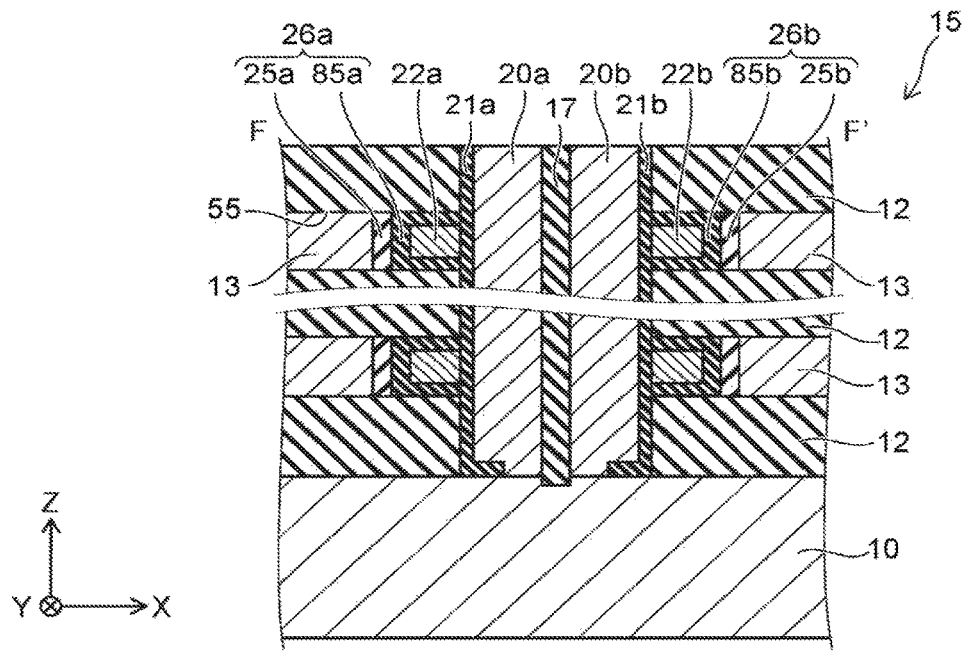
FIG. 43A is a cross-sectional view along line F-F' shown in FIG. 41.
Figure 43B:
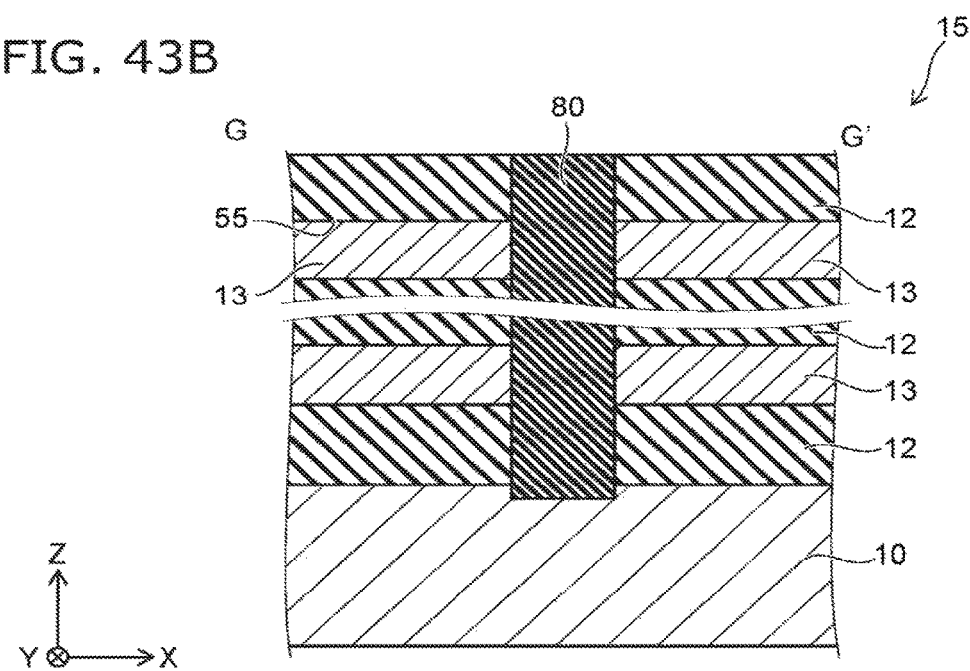
FIG. 43B is a cross-sectional view along line G-G' shown in FIG. 41.

FIG. 43A is a cross-sectional view along line F-F' shown in FIG. 41; and FIG. 43B is a cross-sectional view along line G-G' shown in FIG. 41.

As shown in FIG. 41 to FIG. 43B, the semiconductor memory device 6 according to the embodiment differs from the semiconductor memory device 3 according to the third embodiment described above (referring to FIG. 24) in that an insulating member 80 that is made of, for example, silicon oxide is provided between the columnar bodies 28a and between the columnar bodies 28b adjacent to each other in the Y-direction. The insulating member 80 is disposed to divide the insulating member 17 in the Y-direction and contacts the insulating member 17. The insulating member 80 pierces the stacked body 15; and the lower end portion of the insulating member 80 contacts the silicon substrate 10.

A substantially circular columnar main body portion 80a that has a central axis extending in the Z-direction is provided in the insulating member 80. Protruding portions 80b are formed on the two Y-direction sides of the main body portion 80a. The configuration of the protruding portion 80b is a substantially triangular prism in which two side surfaces 80d having a ridgeline 80c interposed between the two side surfaces 80d are curved into concave configurations, and the ridgeline 80c extends in the Z-direction. The protruding portions 80b penetrate the interior of the insulating member 17.

Also, in the semiconductor memory device 6, blocking insulating films 86a and 86b are provided instead of the blocking insulating films 26a and 26b (referring to FIG. 24). The silicon oxide layer 25a and a five-layer film (SiN/SiO/SiN/SiO/SiN) 85a in which a silicon nitride layer, a silicon oxide layer, a silicon nitride layer, a silicon oxide layer, and a silicon nitride layer are stacked in this order are provided in the blocking insulating film 86a. The five-layer film 85a is provided on the upper surface of the floating gate electrode 22a, on the lower surface of the floating gate electrode 22a, and on the side surface of the floating gate electrode 22a facing the electrode film 13. Similarly, the silicon oxide layer 25b and a five-layer film 85b are provided in the blocking insulating film 86b. The configuration of the five-layer film 85b is the same as the configuration of the five-layer film 85a.

A method for manufacturing the semiconductor memory device according to the embodiment will now be described.

FIG. 44 to FIG. 49B are cross-sectional views showing the method for manufacturing the semiconductor memory device according to the embodiment.

Figure 45:
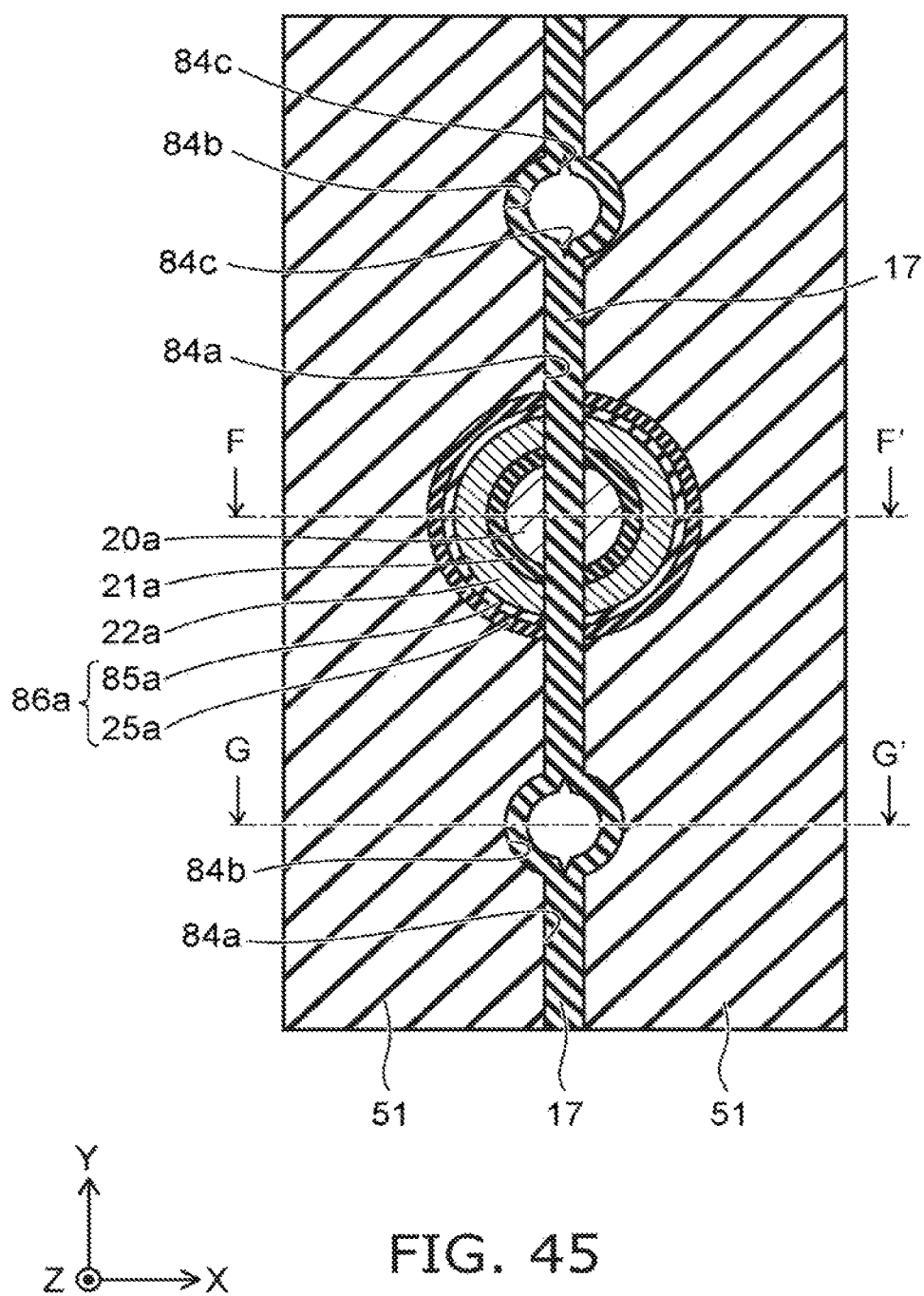
Figure 46A:
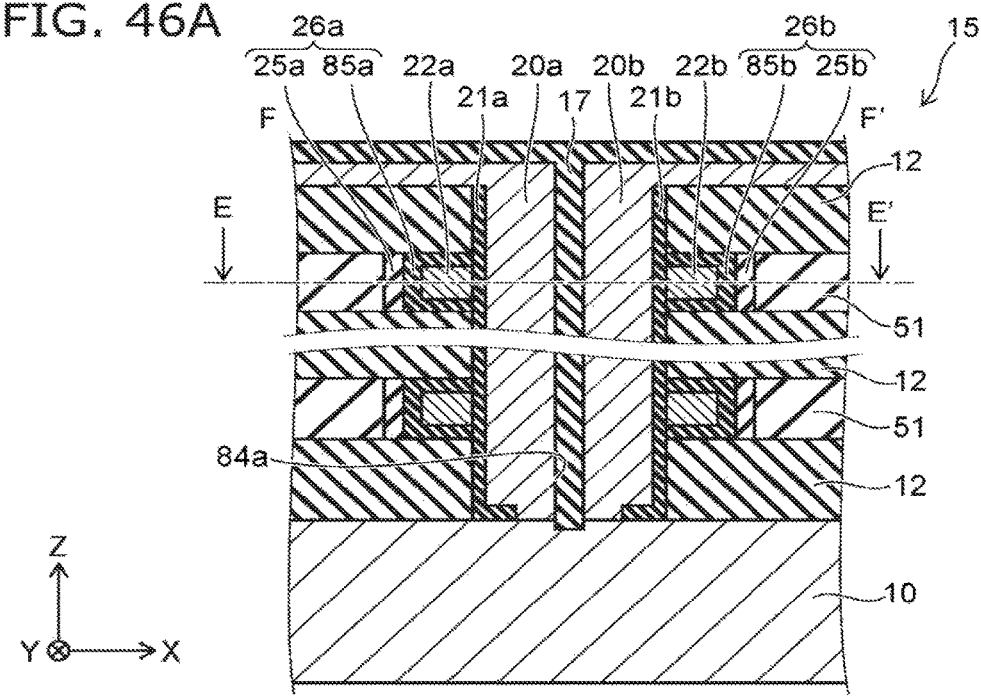
Figure 46B:
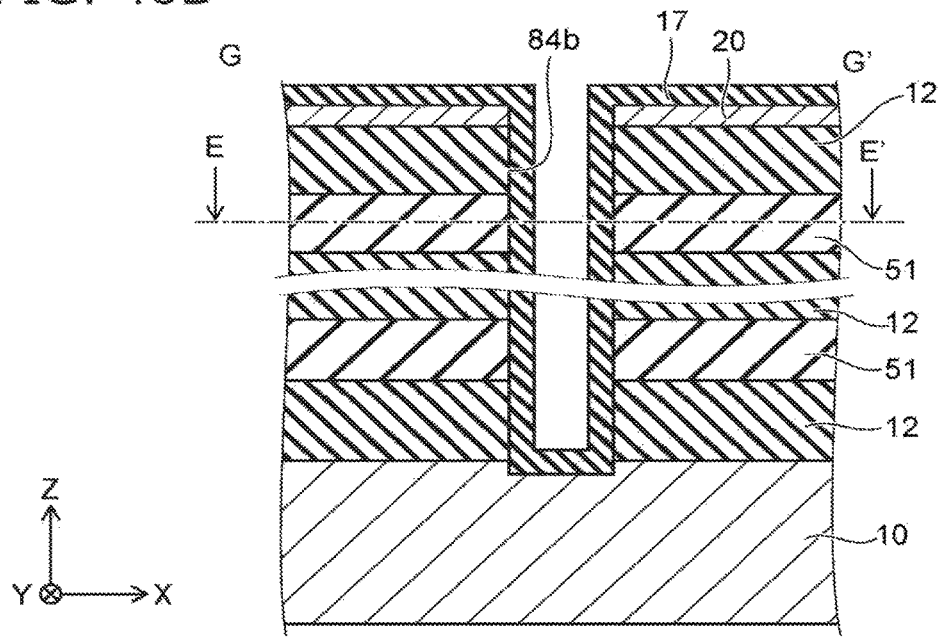
Figure 47:
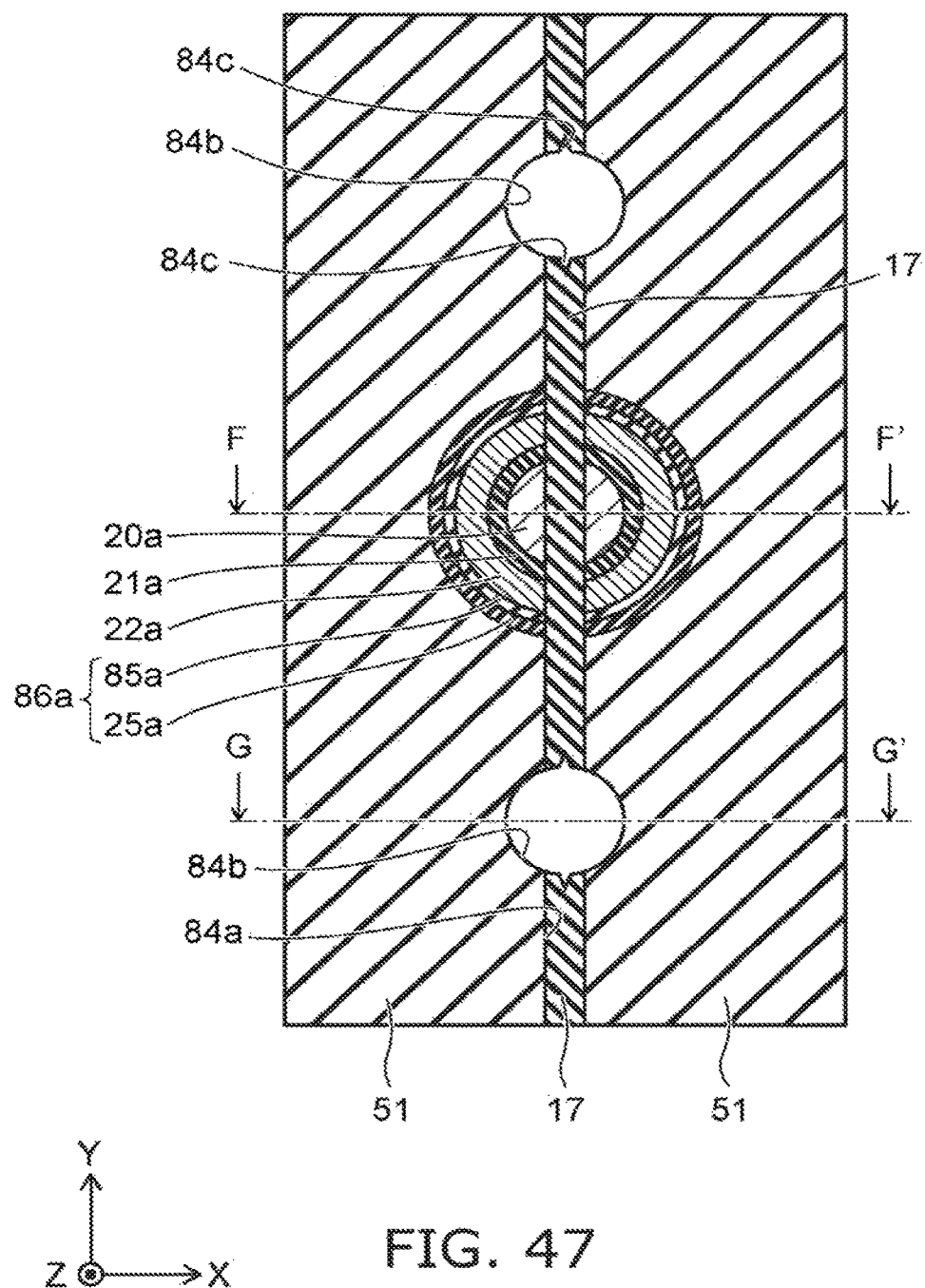
Figure 48A:
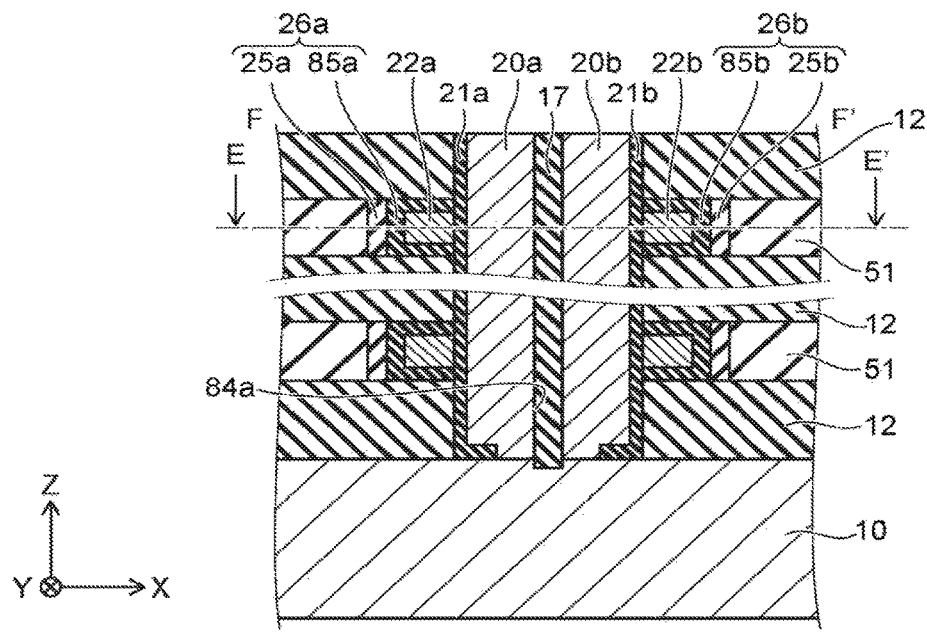
Figure 48B:
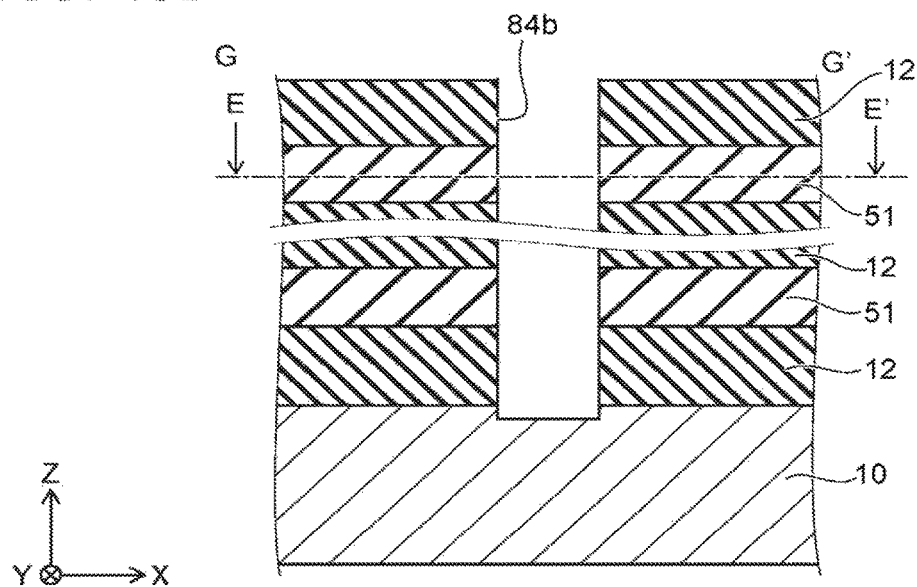
Figure 49A:
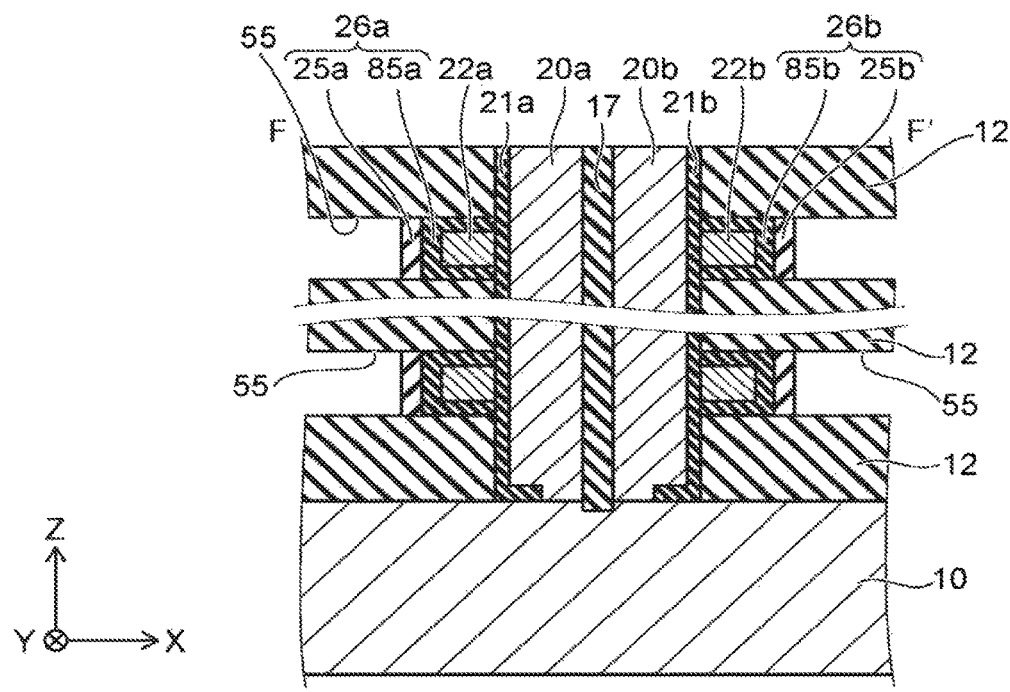
Figure 49B:
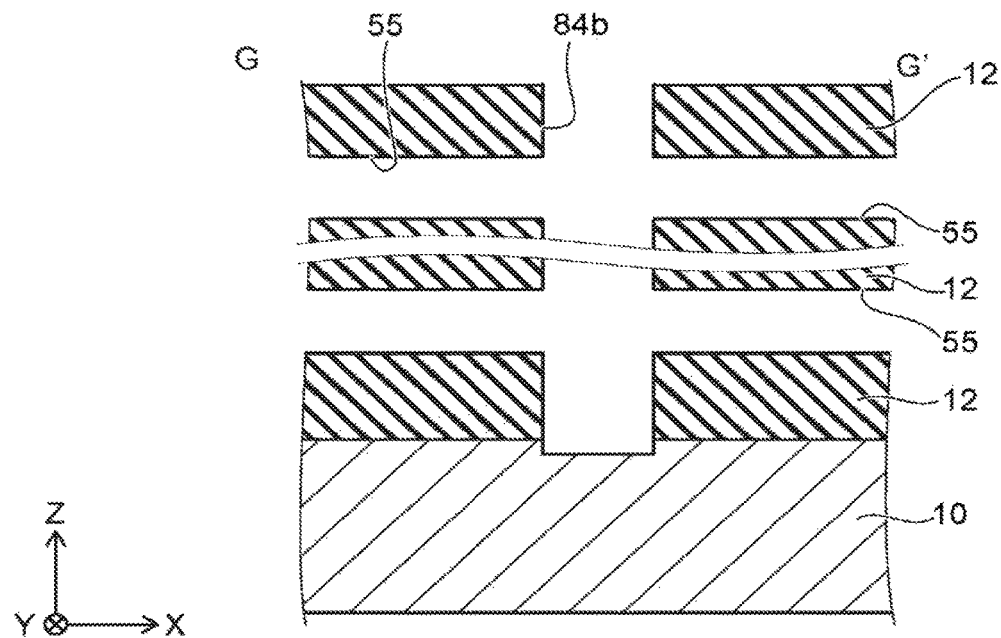

FIG. 45, FIG. 46A, and FIG. 46B show the same process; FIG. 46A is a cross-sectional view along line F-F' shown in FIG. 45; FIG. 46B is a cross-sectional view along line G-G' shown in FIG. 45; and FIG. 45 is a cross-sectional view along line E-E' shown in FIG. 46A and FIG. 46B. Also, FIG. 47, FIG. 48A, and FIG. 48B show the same process; FIG. 48A is a cross-sectional view along line F-F' shown in FIG. 47; FIG. 48B is a cross-sectional view along line G-G' shown in FIG. 47; and FIG. 47 is a cross-sectional view along line E-E' shown in FIG. 48A and FIG. 48B. FIG. 49A and FIG. 49B show the same process; FIG. 49A shows the same cross section as FIG. 48A; and FIG. 49B shows the same cross section as FIG. 48B.

First, the processes shown in FIG. 5A to FIG. 7B are implemented. At this time, a silicon oxide layer and a (SiN/SiO/SiN/SiO/SiN) five-layer film are formed as the blocking insulating film.

Figure 44:
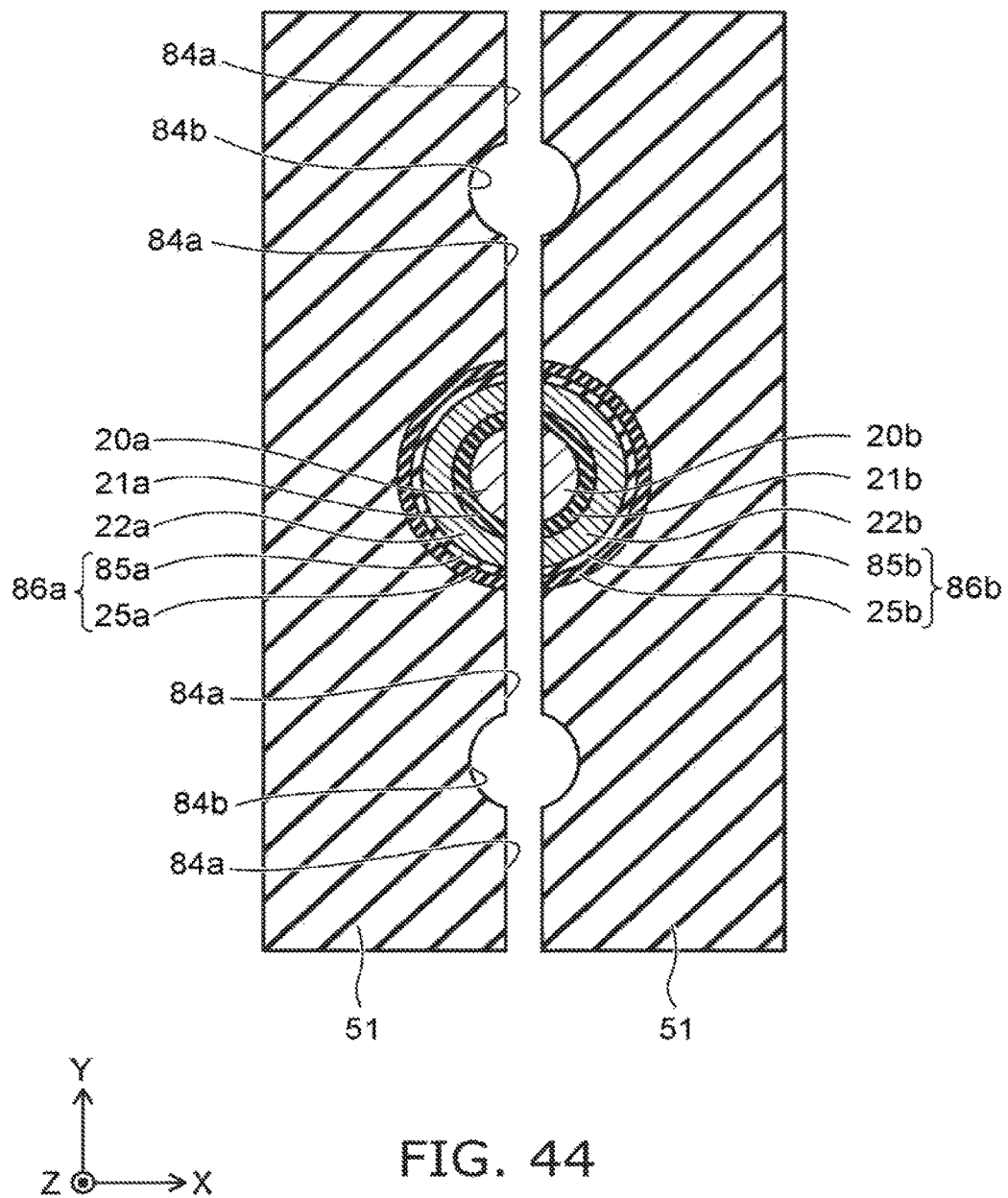
FIG. 44 to FIG. 49B are cross-sectional views showing a method for manufacturing a semiconductor memory device according to the sixth embodiment.

Then, a trench 84 is formed as shown in FIG. 44. A straight portion 84a and hole portions 84b are provided in the trench 84. The configuration of the hole portion 84b is a substantially circular column; and the diameter of the hole portion 84b is wider than the width of the straight portion 84a. The straight portion 84a extends in the Y-direction and divides the silicon pillar 20. The hole portion 84b is disposed to be separated from the silicon pillars 20 between the silicon pillars 20 adjacent to each other in the Y-direction.

Then, as shown in FIG. 45, FIG. 46A, and FIG. 46B, an insulating material such as, for example, silicon oxide or the like is deposited inside the trench 84. Thereby, the insulating member 17 is formed inside the trench 84. At this time, although the straight portion 84a is filled with the insulating member 17, the hole portion 84b is not filled completely with the insulating member 17; and the insulating member 17 is formed in a film-like configuration on the inner surface of the hole portion 84b. At this time, recesses 84c that have seam configurations are formed on the two Y-direction end portions of the hole portion 84b.

Then, as shown in FIG. 47, FIG. 48A, and FIG. 48B, the insulating member 17 is removed from the interior of the hole portion 84b by, for example, performing isotropic etching such as wet etching, etc. At this time, the insulating member 17 is caused to remain inside the straight portion 84a. Such a control is possible because the exposed surface area per unit volume is smaller and the progress of the etching is slower for the insulating member 17 disposed inside the straight portion 84a than for the insulating member 17 disposed inside the hole portion 84b. Also, the insulating member 17 and the silicon that are deposited on the upper surface of the stacked body 15 also are removed.

Then, as shown in FIG. 49A and FIG. 49B, the sacrificial films 51 (referring to FIG. 48B) are removed by etching via the hole portion 84b. As a result, the spaces 55 are formed between the insulating films 12 adjacent to each other in the Z-direction.

Then, as shown in FIG. 41 to FIG. 43B, the electrode film 13 is formed inside the spaces 55 by depositing a conductive material such as tungsten, etc., via the hole portion 84b. Then, the portion of the electrode film 13 formed inside the hole portion 84b is removed by performing etching. Then, the insulating member 80 is formed by refilling silicon oxide into the hole portion 84b. At this time, the protruding portions 80b are formed in the insulating member 80 to reflect the recesses 84c of the hole portion 84b. The method for manufacturing thereafter is similar to that of the first embodiment described above. Thereby, the semiconductor memory device 6 according to the embodiment is manufactured.

Effects of the embodiment will now be described.

In the embodiment, because the trench 84, in which the straight portion 84a and the hole portion 84b are formed, is formed in the process shown in FIG. 44, the insulating member 17 can be formed in the process shown in FIG. 45 so that the straight portion 84a is filled but the hole portion 84b is not filled completely. Thereby, the through-holes for replacing the sacrificial films 51 with the electrode films 13 can be formed easily by removing the insulating member 17 from the interior of the hole portion 84b in the process shown in FIG. 47.

Otherwise, the configuration, the manufacturing method, and the effects of the embodiment are similar to those of the third embodiment described above.

Although an example is shown in the embodiment in which the insulating member 80 and the structure body made of the columnar bodies 28a and 28b are arranged alternately along the Y-direction, this is not limited thereto. For example, the insulating member 80 may be disposed every plurality of structure bodies made of the columnar bodies 28a and 28b.

Seventh Embodiment

A seventh embodiment will now be described.

Figure 50:
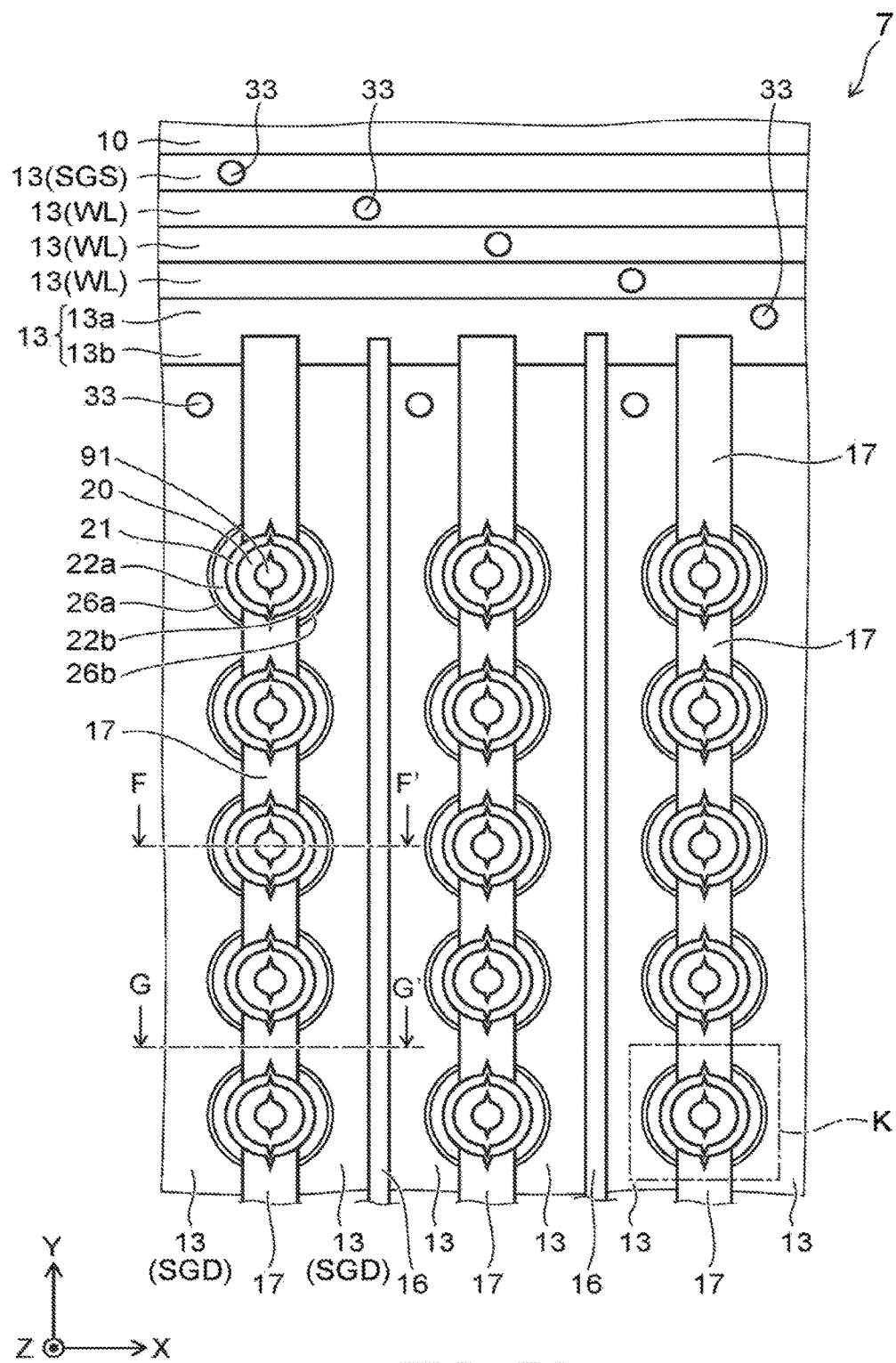
FIG. 50 is a plan view showing a semiconductor memory device according to a seventh embodiment.

FIG. 50 is a plan view showing a semiconductor memory device according to the embodiment.

Figure 51:
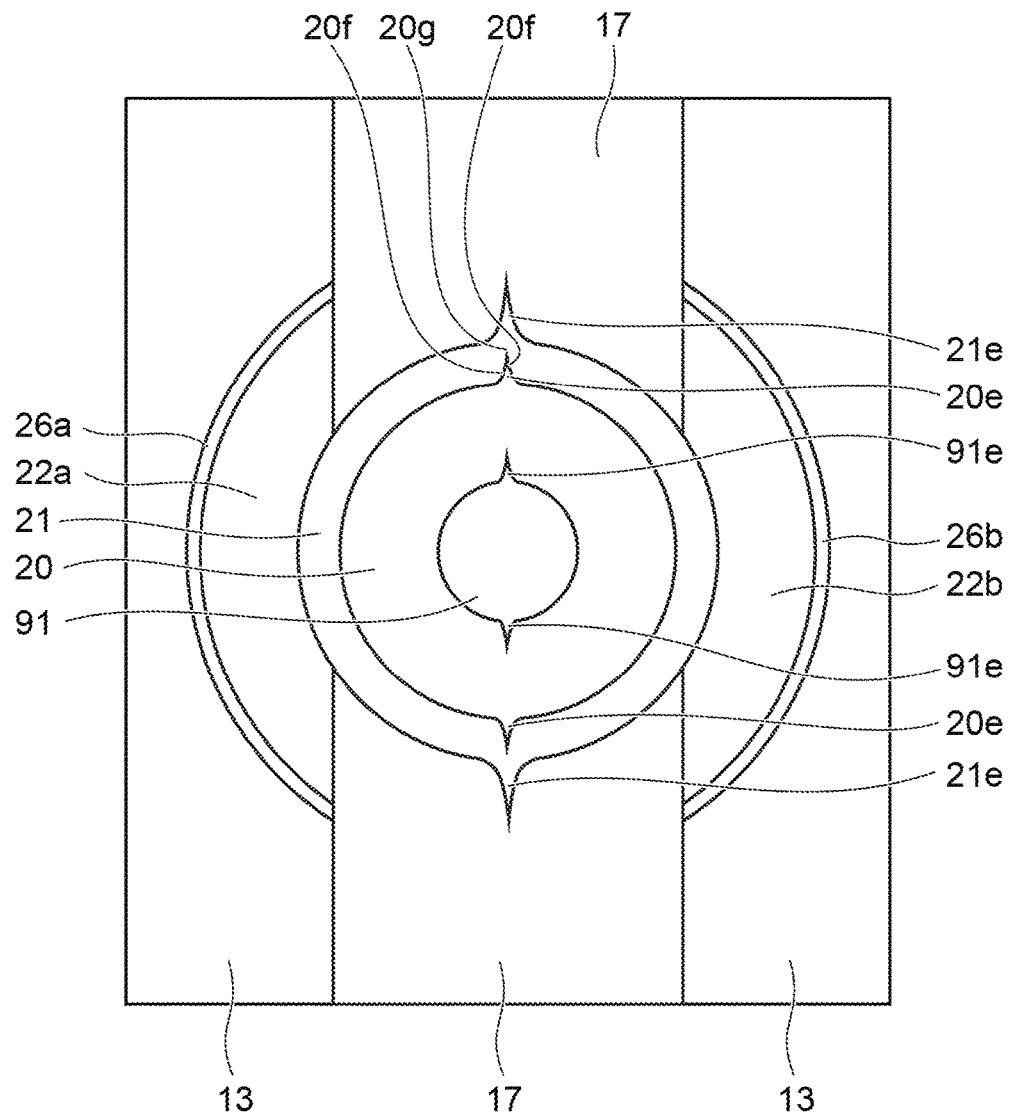
FIG. 51 is a plan view showing region K of FIG. 50.

FIG. 51 is a plan view showing region K of FIG. 50.

Figure 52A:
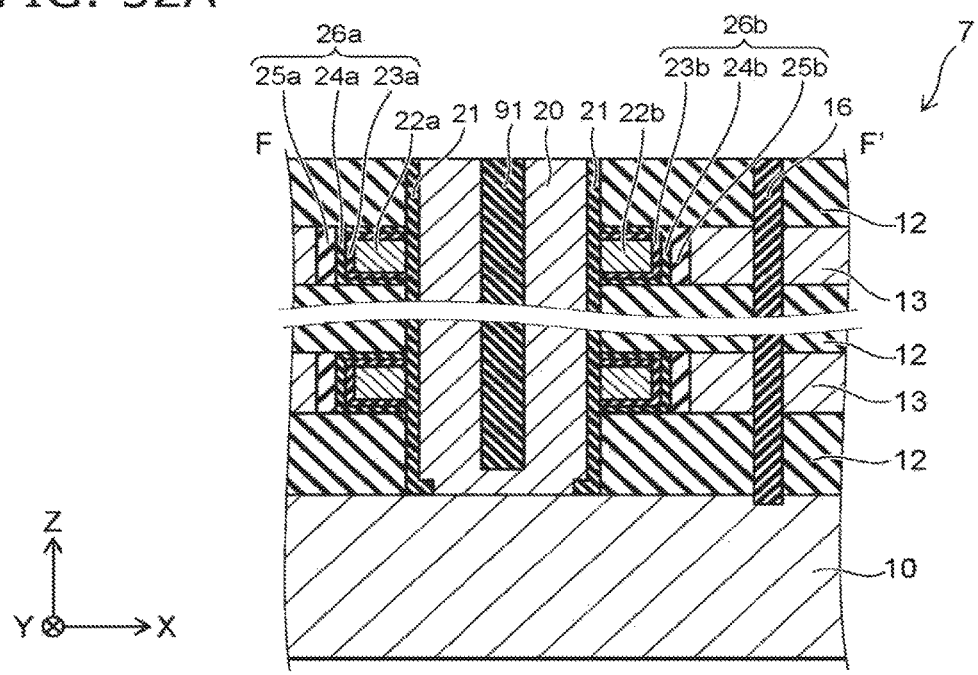
FIG. 52A is a cross-sectional view along line F-F' shown in FIG. 50.
Figure 52B:
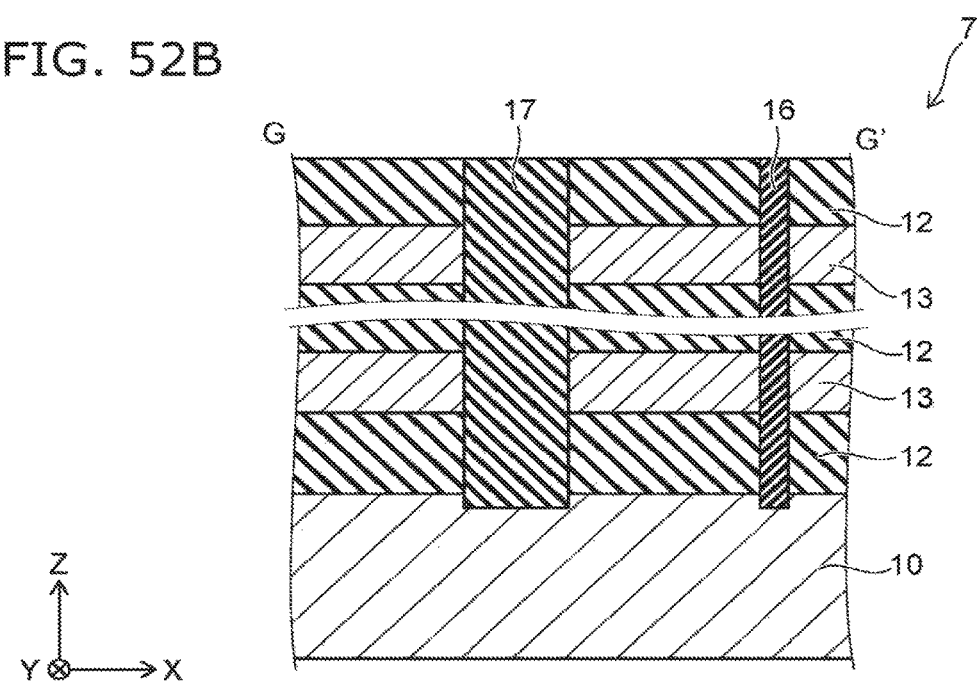
FIG. 52B is a cross-sectional view along line G-G' shown in FIG. 50.

FIG. 52A is a cross-sectional view along line F-F' shown in FIG. 50; and FIG. 52B is a cross-sectional view along line G-G' shown in FIG. 50.

As shown in FIG. 50, FIG. 51, FIG. 52A, and FIG. 52B, the semiconductor memory device 7 according to the embodiment differs from the semiconductor memory device 3 according to the third embodiment described above (referring to FIG. 24) in that the silicon pillar 20 and the tunneling insulating film 21 are not subdivided by the insulating member 17; a core member 91 is provided inside the silicon pillar 20; protruding portions are formed at the two Y-direction end portions of the tunneling insulating film 21, the silicon pillar 20, and the core member 91; and the insulating plate 16 is provided between the insulating members 17.

For example, the core member 91 is formed of an insulating material such as silicon oxide, etc. The configuration of the core member 91 is a substantially circular column; the configuration of the silicon pillar 20 is a substantially circular tube having a plugged lower end; and the configuration of the tunneling insulating film 21 is a circular tube. On the other hand, the floating gate electrodes 22a and 22b are separated from each other by the insulating member 17. Also, the blocking insulating films 26a and 26b are separated from each other by the insulating member 17.

Protruding portions 21e are formed at the two Y-direction end portions of the tunneling insulating film 21; protruding portions 20e are formed at the two Y-direction end portions of the silicon pillar 20; and protruding portions 91e are formed at the two Y-direction end portions of the core member 91. The configuration of each of the protruding portions is a substantially triangular prism in which the two side surfaces having a ridgeline interposed between the two side surfaces are curved into concave configurations, and the ridgeline extends in the Z-direction. For example, the protruding portion 20e of the silicon pillar 20 has two side surfaces 20f; and a ridgeline 20g that forms the boundary line of the two side surfaces 20f extends in the Z-direction. This is similar for the protruding portion 21e and the protruding portion 91e as well.

A method for manufacturing the semiconductor memory device according to the embodiment will now be described.

FIG. 53 to FIG. 62B are cross-sectional views showing the method for manufacturing the semiconductor memory device according to the embodiment.

Figure 53:
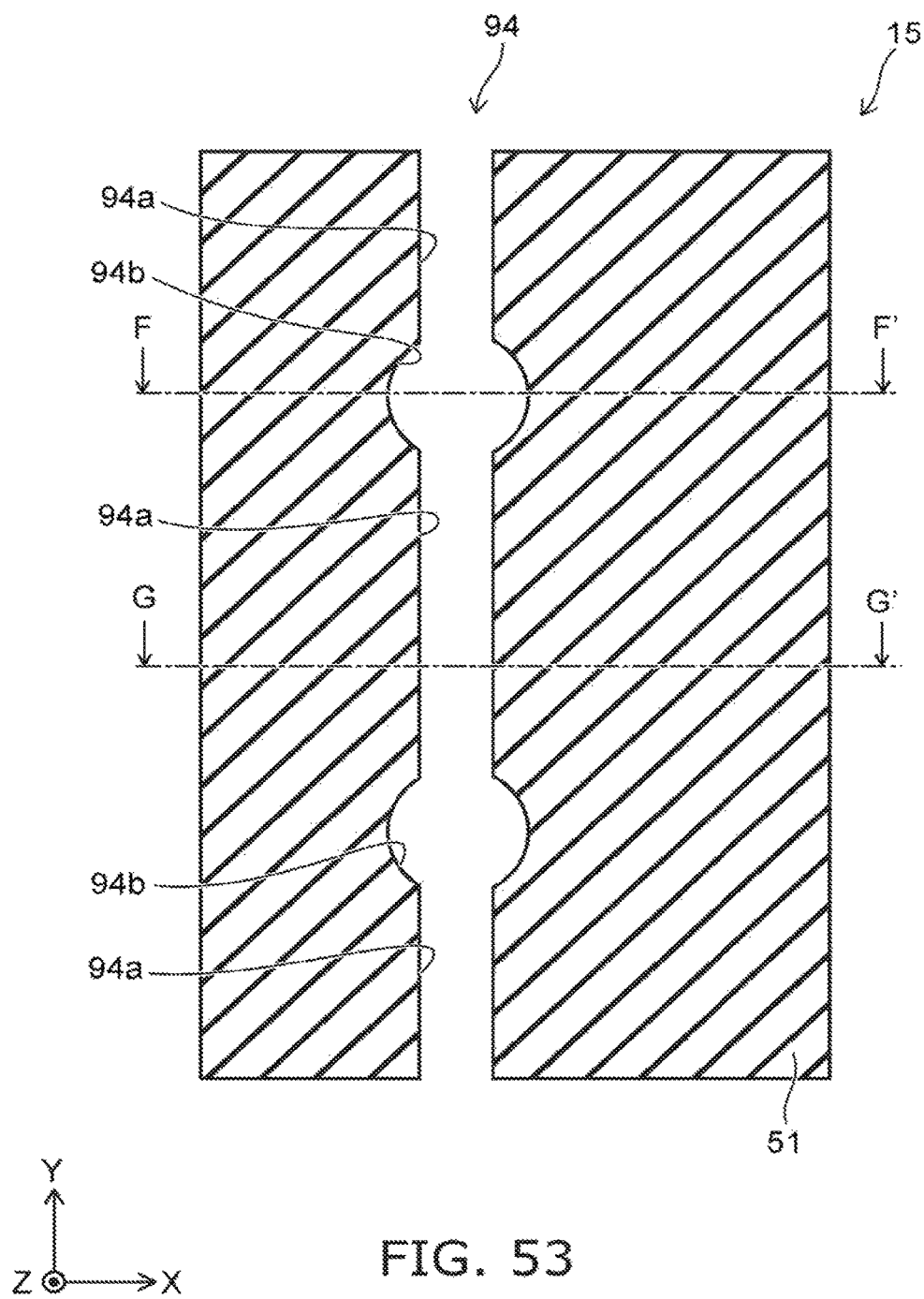
FIG. 53 to FIG. 62B are cross-sectional views showing a method for manufacturing a semiconductor memory device according to the seventh embodiment.
Figure 54A:
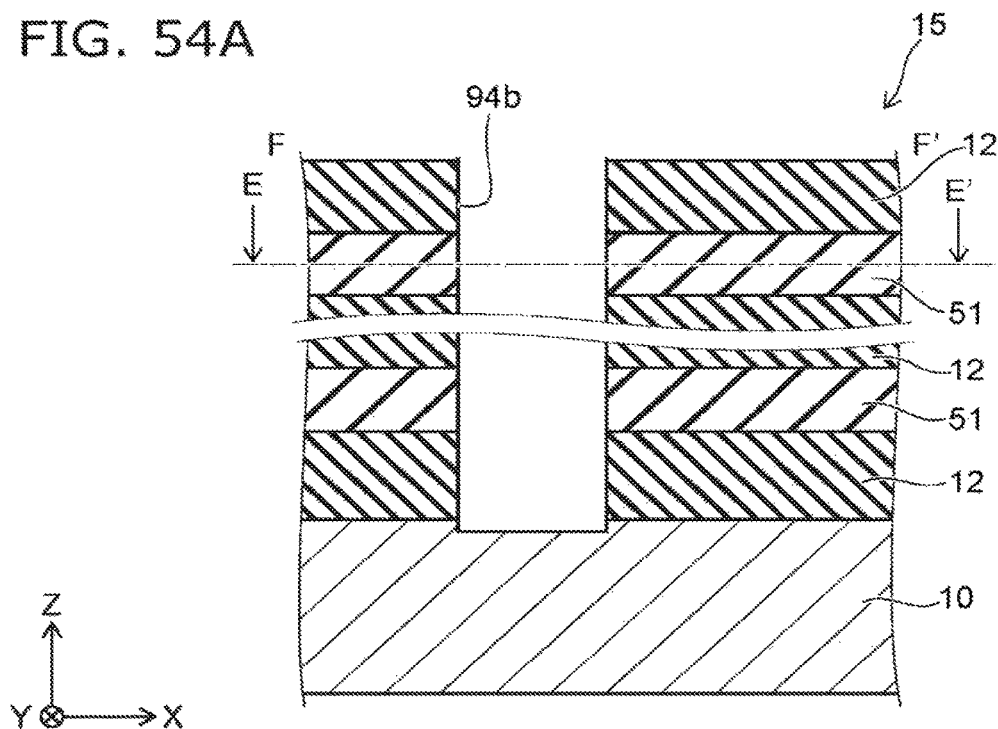
Figure 54B:
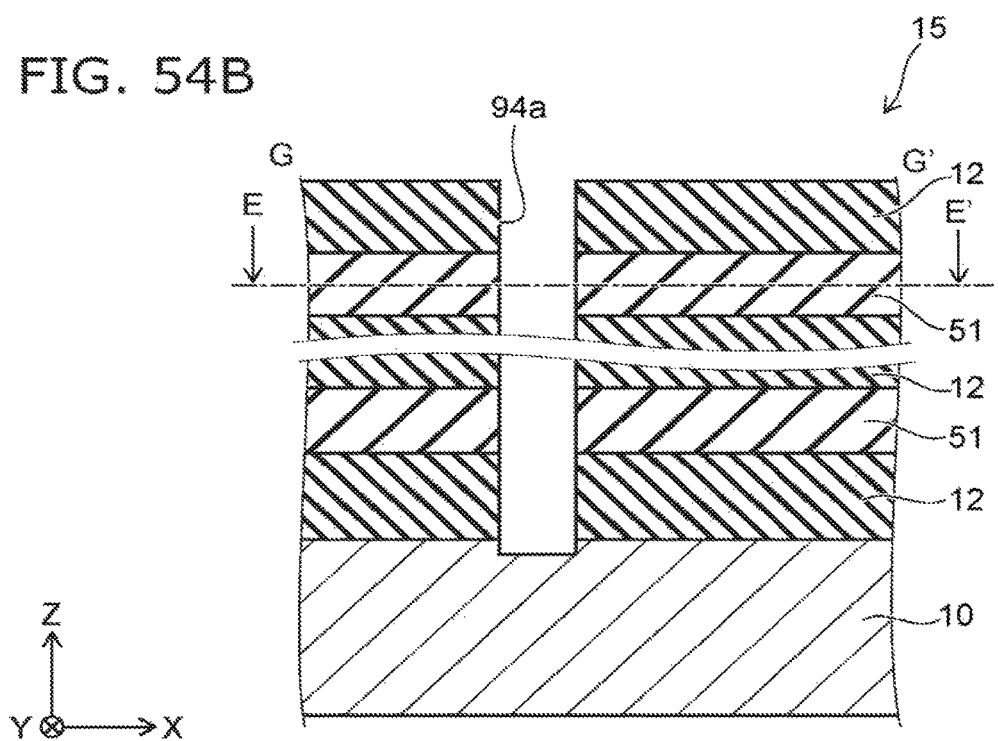

FIG. 53, FIG. 54A, and FIG. 54B show the same process; FIG. 54A is a cross-sectional view along line F-F' shown in FIG. 53; FIG. 54B is a cross-sectional view along line G-G' shown in FIG. 53; and FIG. 53 is a cross-sectional view along line E-E' shown in FIG. 54A and FIG. 54B. This is similar for FIG. 55 to FIG. 62B as well.

First, as shown in FIG. 53, FIG. 54A, and FIG. 54B, the stacked body 15 is formed by forming the insulating films 12 and the sacrificial films 51 alternately on the silicon substrate 10. Then, the end portion of the stacked body 15 is patterned into a stairstep configuration. Then, for example, a trench 94 is formed in the stacked body 15 by lithography and RIE. The trench 94 has a configuration in which straight portions 94a that extend in the Y-direction and circular columnar hole portions 94b are arranged alternately along the Y-direction. The diameter of the hole portion 94b is wider than the width of the straight portion 94a. The trench 94 pierces the stacked body 15 in the Z-direction and reaches the silicon substrate 10.

Figure 55:
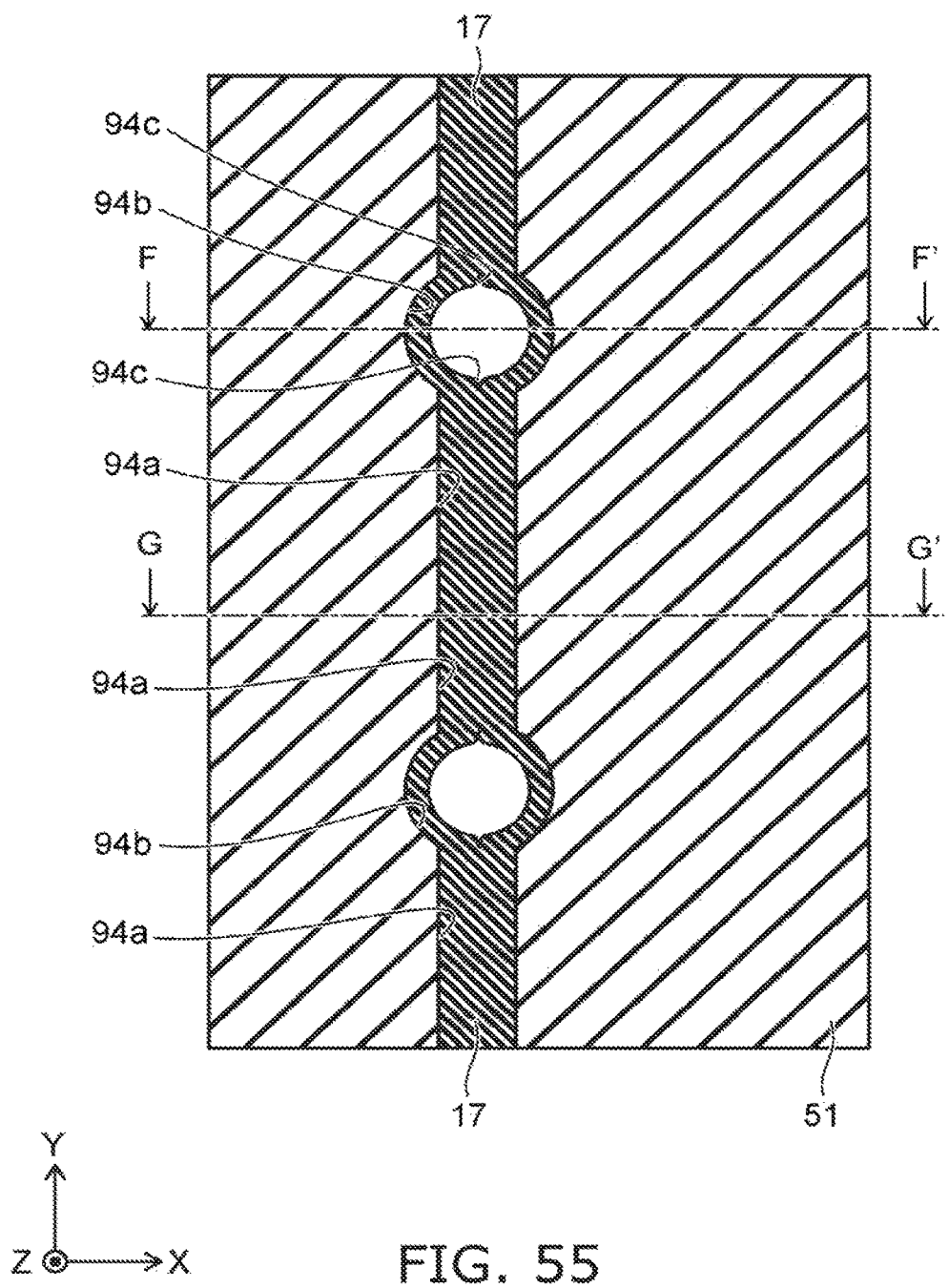
Figure 56A:
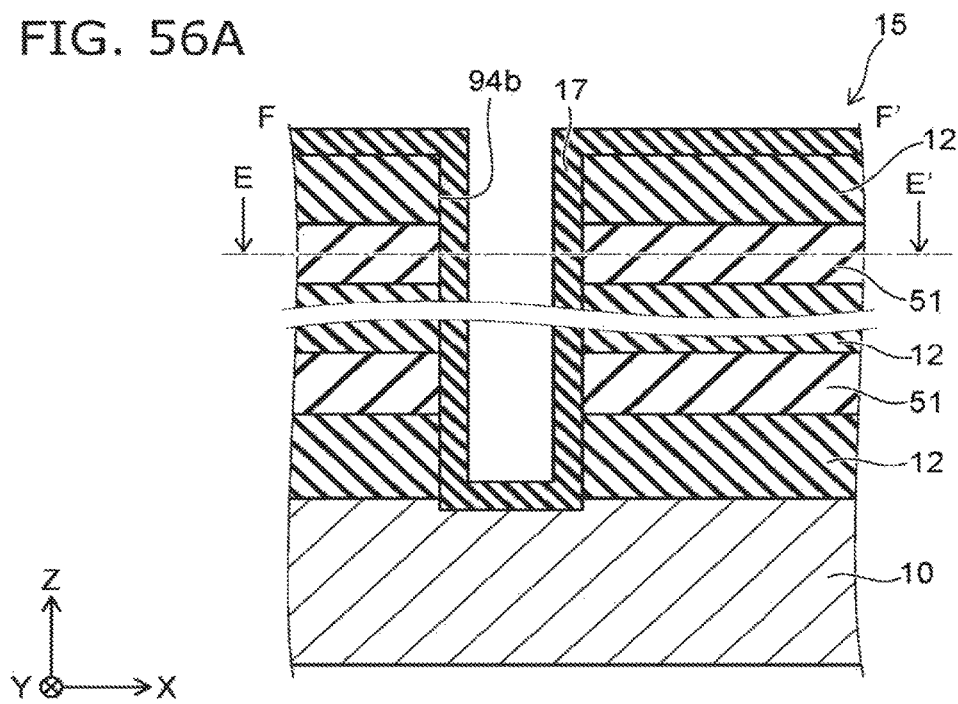
Figure 56B:
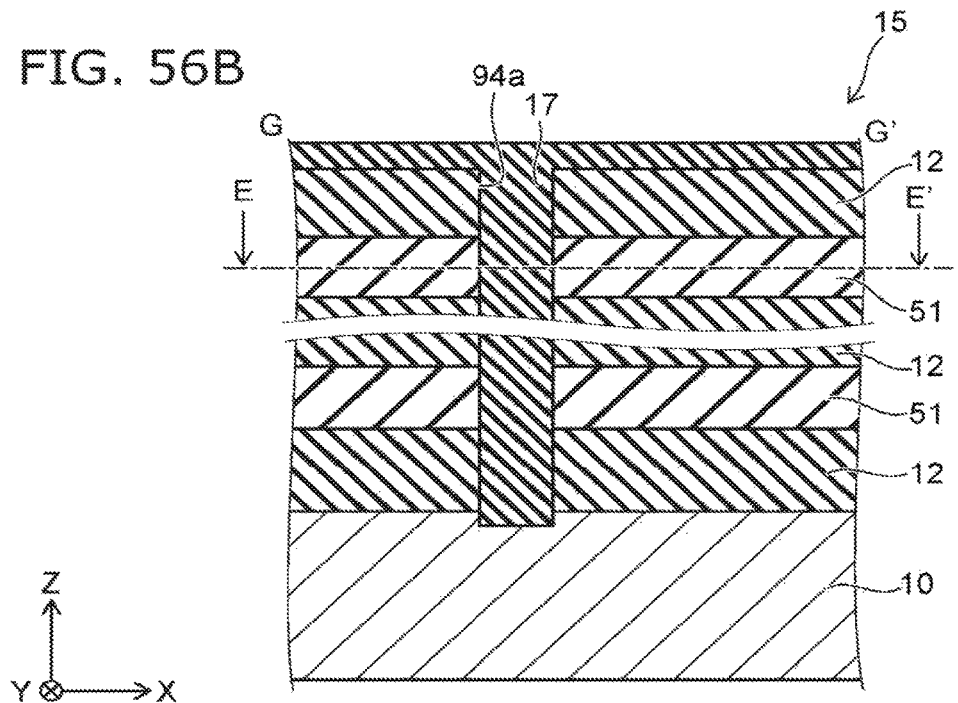

Then, as shown in FIG. 55, FIG. 56A, and FIG. 56B, for example, an insulating material such as silicon oxide or the like is deposited inside the trench 94. Thereby, the insulating member 17 is formed inside the trench 94. At this time, the interior of the straight portion 94a is filled completely by the insulating member 17; the interior of the hole portion 94b is not filled completely with the insulating member 17; and the insulating member 17 is formed in a film-like configuration on the inner surface of the hole portion 94b. At this time, recesses 94c that have seam configurations are formed at the two Y-direction end portions of the hole portion 94b.

Figure 57:
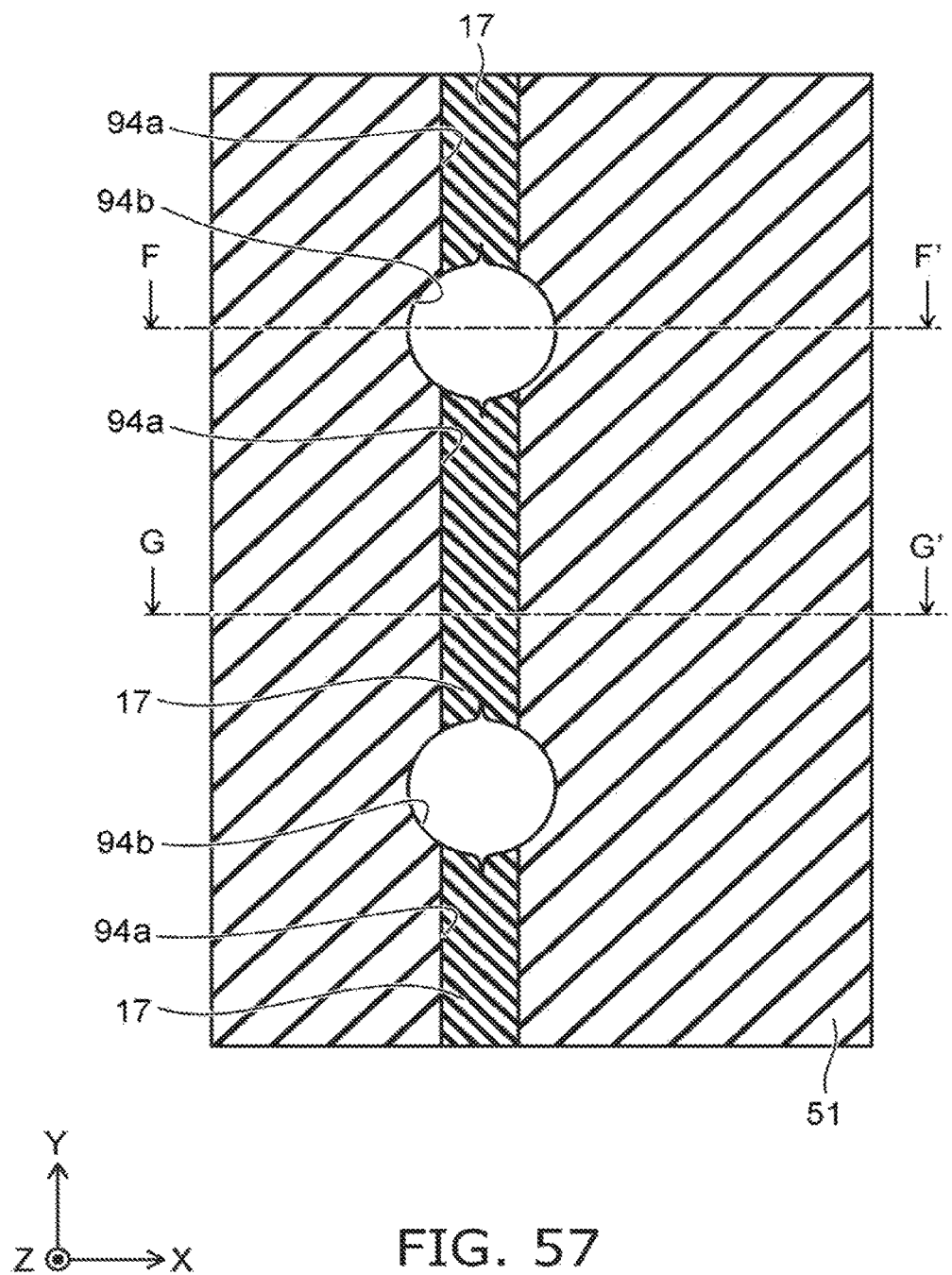
Figure 58A:
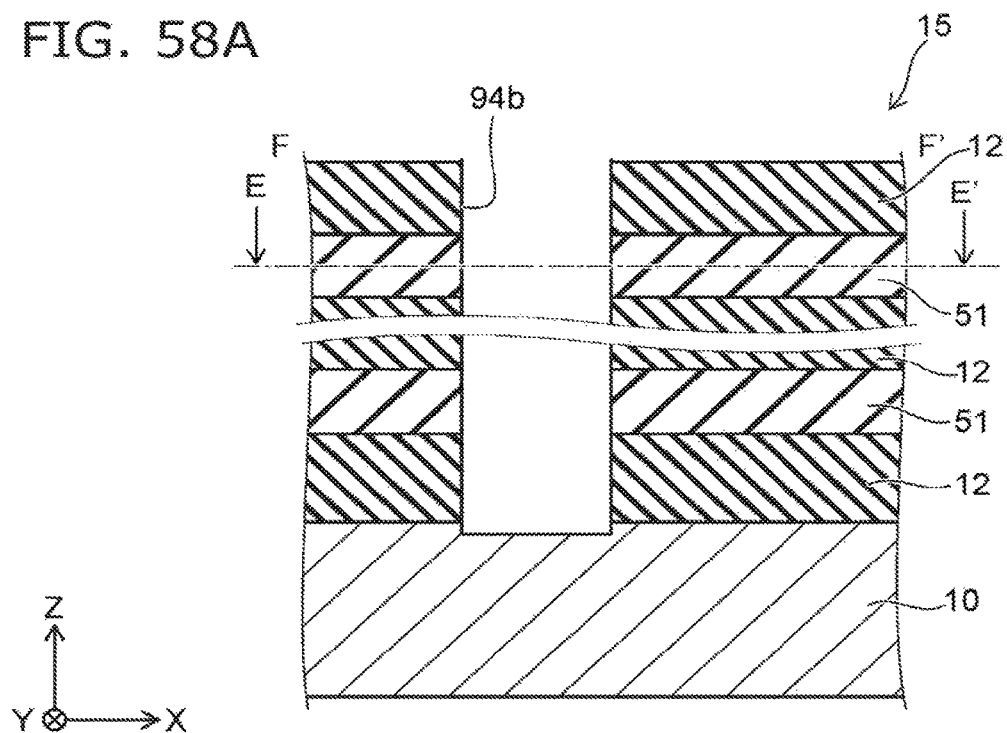
Figure 58B:
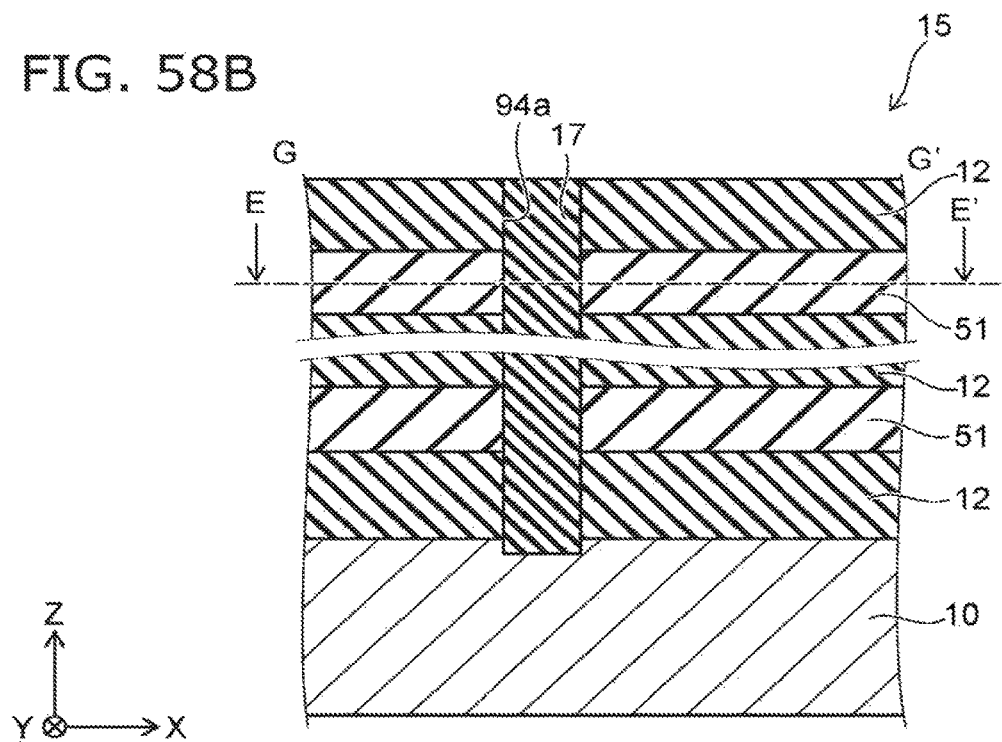

Then, as shown in FIG. 57, FIG. 58A, and FIG. 58B, for example, the insulating member 17 is removed from the interior of the hole portion 94b by performing isotropic etching such as wet etching, etc. At this time, the insulating member 17 is caused to remain inside the straight portion 94a. The progress of the etching is slow and such a control is possible because the exposed surface area per unit volume is smaller for the insulating member 17 disposed inside the straight portion 94a than for the insulating member 17 disposed inside the hole portion 94b. Also, by the etching, the insulating member 17 that is deposited on the upper surface of the stacked body 15 is removed.

Figure 59:
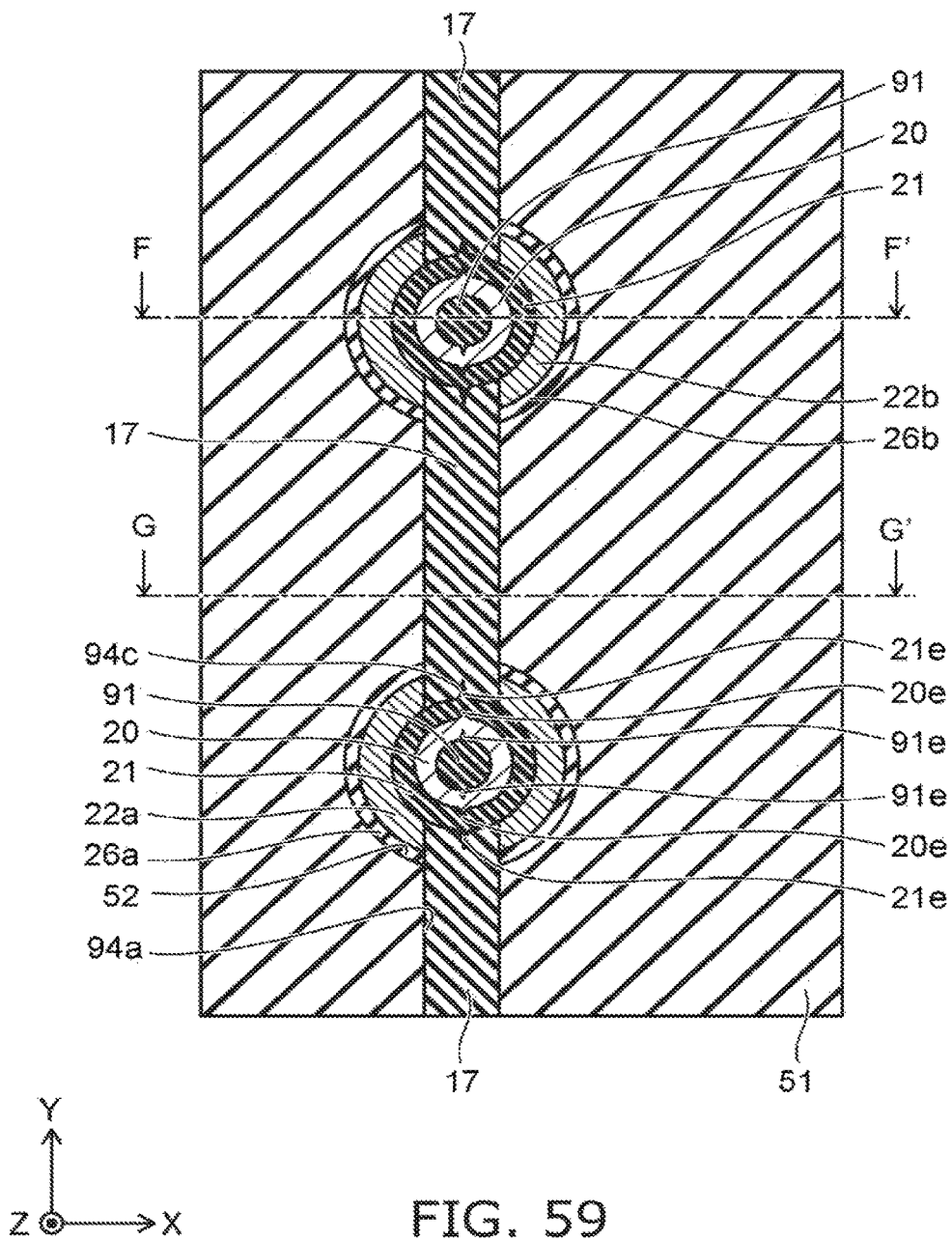
Figure 60A:
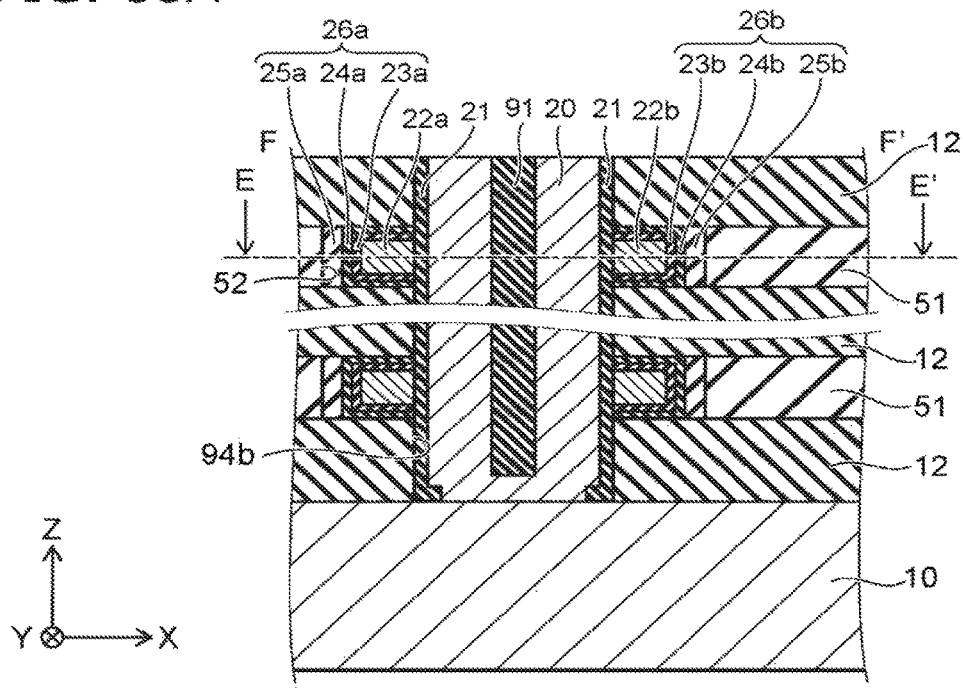
Figure 60B:
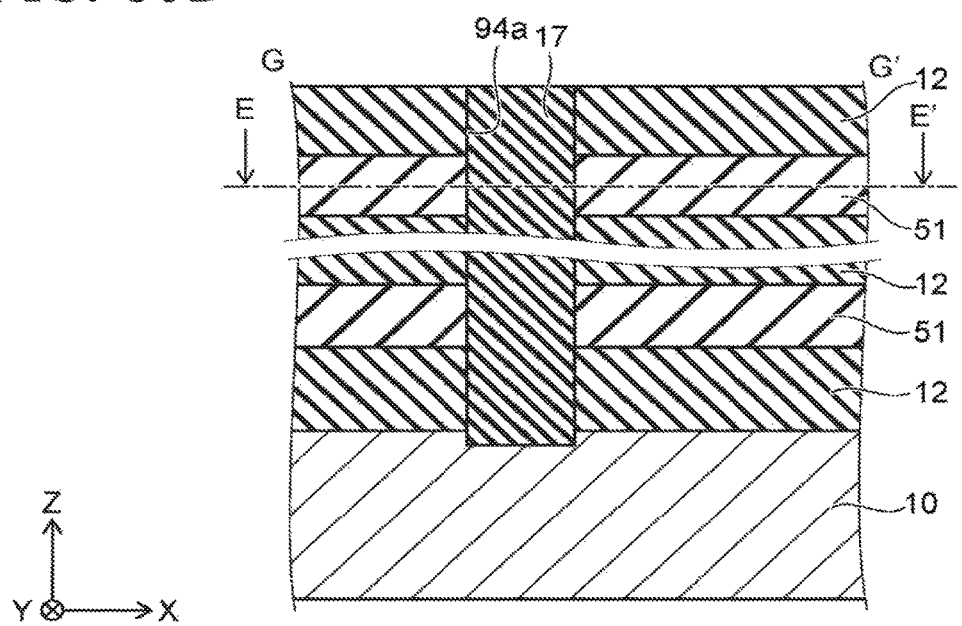

Then, as shown in FIG. 59, FIG. 60A, and FIG. 60B, the sacrificial films 51 are recessed via the hole portion 94b. Thereby, the recesses 52 that have semicircular ring configurations are formed in the regions of the inner surface of the hole portion 94b where the sacrificial films 51 are exposed. Then, the silicon oxide layers 25a and 25b are formed by oxidizing the sacrificial films 51 exposed at the back surfaces of the recesses 52. The hafnium silicon oxide layer 24, the silicon nitride layer 23, and the silicon film 22 are formed inside the recesses 52 and inside the hole portion 94b. Then, etching is performed; and the silicon film 22 and the hafnium silicon oxide layer 25 are removed from the interior of the hole portion 94b and caused to remain inside the recesses 52. Thereby, the blocking insulating films 26a and 26b and the floating gate electrodes 22a and 22b are formed inside the recesses 52.

Then, the tunneling insulating film 21 and the silicon pillar 20 are formed on the inner surface of the hole portion 94b; and subsequently, the core member 91 is filled. At this time, reflecting the recesses 94c of the hole portion 94b, the protruding portions 21e are formed at the two Y-direction end portions of the tunneling insulating film 21; the protruding portions 20e are formed at the two Y-direction end portions of the silicon pillar 20; and the protruding portions 91e are formed at the two Y-direction end portions of the core member 91.

Figure 61:
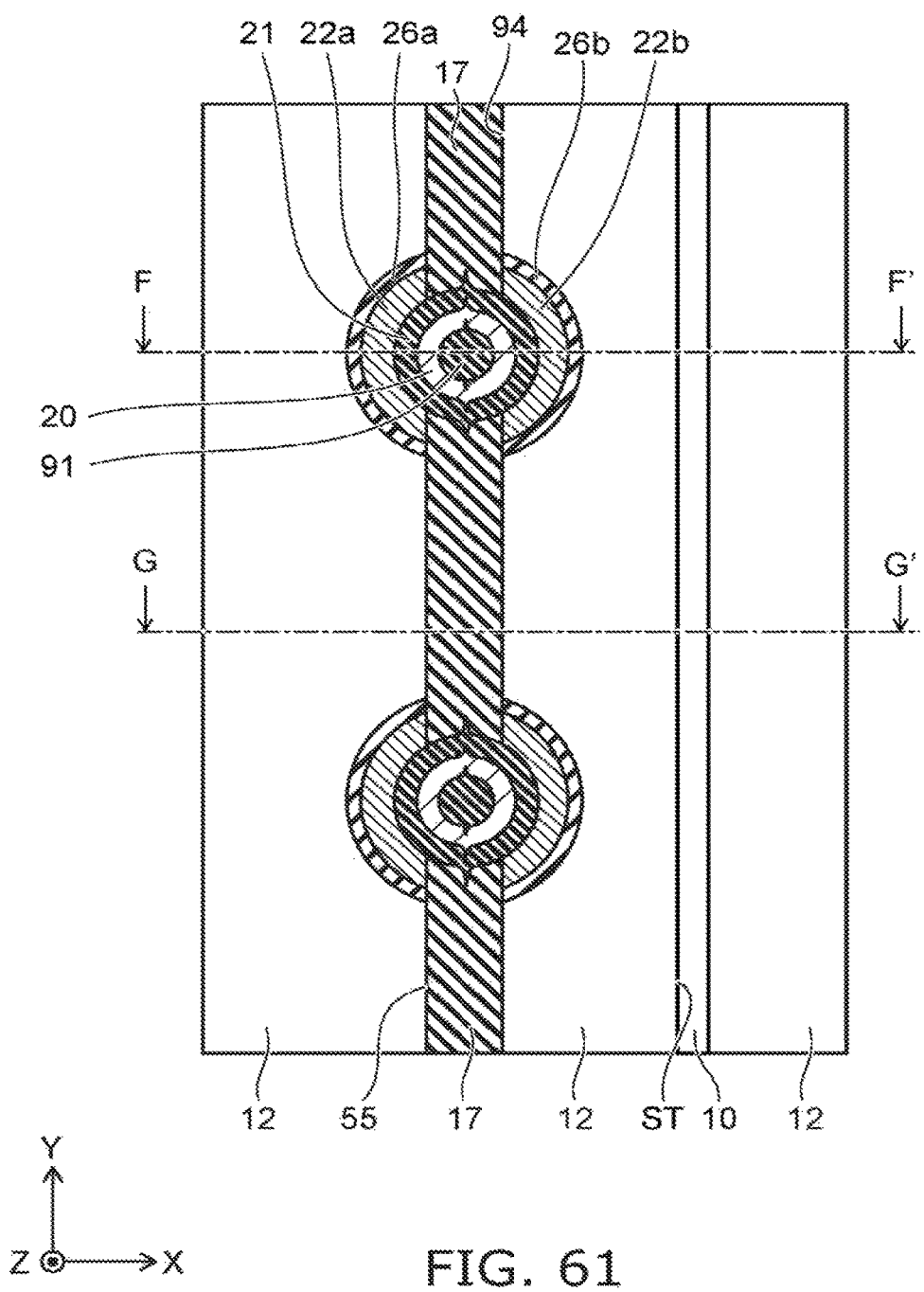
Figure 62A:
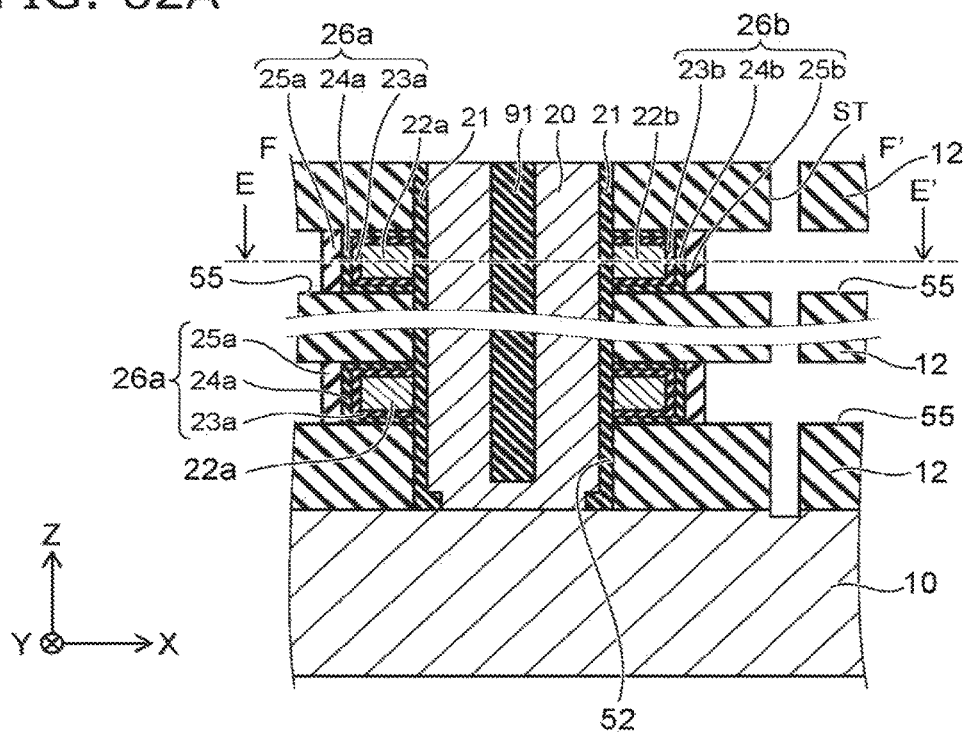
Figure 62B:
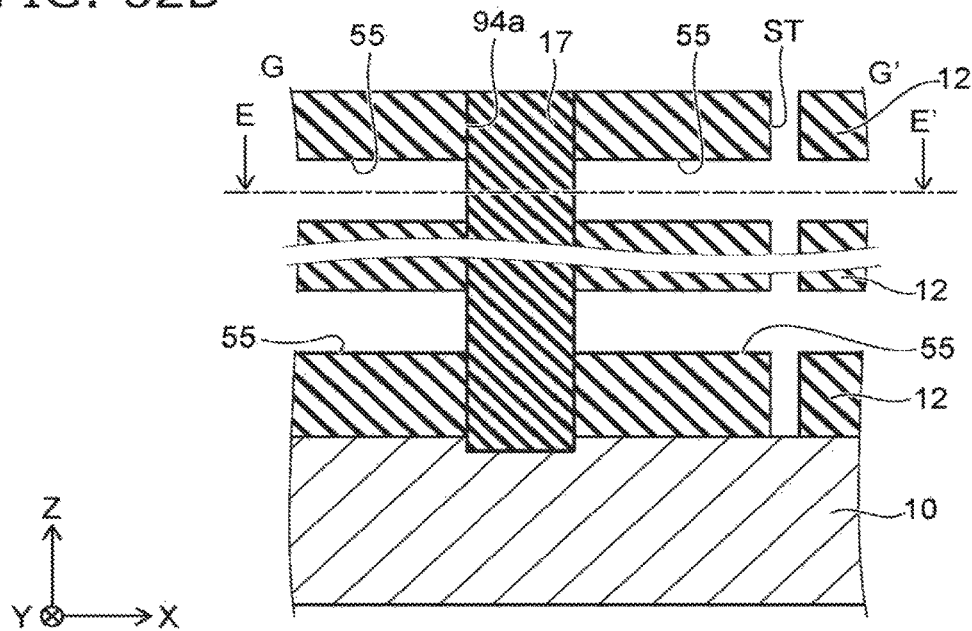

Then, as shown in FIG. 61, FIG. 62A, and FIG. 62B, the slit ST that extends in the Y-direction is formed in a portion of the stacked body between the trenches 94. The slits ST and the trenches 94 are arranged alternately in the X-direction. Then, the sacrificial films 51 (referring to FIG. 60A and FIG. 60B) are removed by etching via the slits ST. As a result, the spaces 55 are formed between the insulating films 12 adjacent to each other in the Z-direction.

Then, as shown in FIG. 52A and FIG. 52B, the electrode film 13 is formed inside the spaces 55 by depositing a conductive material such as tungsten, etc., via the slit ST. Then, the portion of the electrode film 13 formed inside the slit ST is removed by performing etching. Then, the insulating plate 16 is formed by filling silicon oxide into the slit ST. The method thereafter is similar to that of the first embodiment described above. Thereby, the semiconductor memory device 7 according to the embodiment is manufactured.

Effects of the embodiment will now be described.

In the embodiment, by forming the trench 94 having the straight portion 94a and the hole portion 94b in the processes shown in FIG. 53, FIG. 54A, and FIG. 54B, a subsequent series of processes can be performed to fill the insulating member 17 into the straight portion 94a and form the silicon pillar 20, etc., inside the hole portion 94b. Therefore, the number of processes can be reduced; and the manufacturing cost of the semiconductor memory device 7 can be reduced.

Otherwise, the configuration, the manufacturing method, and the effects of the embodiment are similar to those of the third embodiment described above.

Although an example is shown in the embodiments described above in which the blocking films 26a and 26b are, for example, five-layer films of (SiN/SiO/SiN/SiO/SiN), this is not limited thereto; and the blocking insulating films may be, for example, three-layer films of (SiO/SiN/SiO) and may include a high dielectric constant layer such as a hafnium oxide layer (HfO), etc.

According to the embodiments described above, a semiconductor memory device that has high integration can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

(Notes)
Note 1
A method for manufacturing a semiconductor memory device, including:
forming a stacked body by stacking a first insulating film and a first film alternately along a first direction on a substrate;
forming a hole in the stacked body, the hole extending in the first direction;
forming recesses by removing exposed portions of the first films on an inner surface of the hole;
forming a second insulating film on inner surfaces of the recesses;
forming a first conductive film inside the recesses;
forming a third insulating film on a surface of the first conductive film;
forming a semiconductor member on a surface of the third insulating film;
subdividing the second insulating film, the first conductive film, the third insulating film, and the semiconductor member each into two by forming a trench in the stacked body, the trench extending in a second direction crossing the first direction;
forming a first insulating member inside the trench;
forming an opening in the stacked body;
forming spaces by removing the first films via the opening; and
forming an electrode film inside the spaces via the opening.
Note 2
The method for manufacturing the semiconductor memory device according to Note 1, further including:
forming a second trench in the stacked body, the second trench extending in the second direction, a length in a third direction of the second trench being longer than a length in the third direction of the first trench, the third direction crossing a plane including the first direction and the second direction; and
forming a second insulating member inside the second trench,
the hole being formed to divide the second insulating member along the second direction.
Note 3
The method for manufacturing the semiconductor memory device according to Note 1, wherein the opening is formed by causing a portion of the first insulating member contacting the first conductive film and the semiconductor member to remain and by removing a portion of the first insulating member contacting the first film.
Note 4
The method for manufacturing the semiconductor memory device according to Note 1, wherein the opening extends in the second direction.
Note 5
A method for manufacturing a semiconductor memory device, including:
forming a stacked body by stacking a first insulating film and a first film alternately along a first direction on a substrate;
forming a hole in the stacked body, the hole extending in the first direction;
forming recesses by removing exposed portions of the first films on an inner surface of the hole;
forming a second insulating film on inner surfaces of the recesses;
forming a first conductive film inside the recesses;
forming a third insulating film on a surface of the first conductive film;
forming a semiconductor member on a surface of the third insulating film;

subdividing the second insulating film, the first conductive film, the third insulating film, and the semiconductor member each into two by forming a trench in the stacked body, the trench extending in a second direction crossing the first direction;

forming spaces by removing the first films via the trench;

forming a fourth insulating film on an inner surface of the trench; and forming an electrode film inside the spaces via the opening.

Note 6

A method for manufacturing a semiconductor memory device, including:

forming a stacked body by stacking a first insulating film and a first film alternately along a first direction on a substrate;

forming a hole in the stacked body, the hole extending in the first direction, the hole including a major portion and two sub portions, the two sub portions being disposed on two second-direction sides of the major portion and being linked to the major portion, a length of the major portion in a third direction being longer than lengths of the sub portions in the third direction, the second direction crossing the first direction, the third direction crossing a plane including the first direction and the second direction;

forming recesses by removing exposed portions of the first films on an inner surface of the hole;

forming a second insulating film on inner surfaces of the recesses;

forming a first conductive film inside the recesses and on the inner surface of the hole;

removing a portion of the first conductive film formed inside the major portion and inside portions of the recesses facing the major portion while causing a portion of the first conductive film formed inside portions of the recesses facing the sub portions to remain;

forming a third insulating film on an inner surface of the hole;

forming a second conductive film on a surface of the third insulating film;

removing a portion of the second conductive film formed inside the major portion while causing portions of the second conductive film formed inside the sub portions to remain;

forming an insulating member inside the major portion;

forming an opening in the stacked body;

forming spaces by removing the first films via the opening; and forming an electrode film inside the spaces via the opening.

What is claimed is:

1. A semiconductor memory device, comprising:
a first semiconductor member and a second semiconductor member being separated in a first direction and extending in a second direction, the second direction crossing the first direction;
an insulating member provided between the first semiconductor member and the second semiconductor member;
a plurality of electrode films arranged to be separated from each other along the second direction, each of the electrode films surrounding the first semiconductor member, the second semiconductor member, and the insulating member when viewed from the second direction;
a first electrode provided between the first semiconductor member and one of the plurality of electrode films; and
a second electrode provided between the second semiconductor member and the one of the plurality of electrode films.

2. The device according to claim 1, wherein
the first electrode is disposed also at two sides of the first semiconductor member in a third direction, the third direction crossing a plane including the first direction and the second direction,
the second electrode is disposed also at two sides of the second semiconductor member in the third direction, and
the insulating member is disposed also between the first electrode and the second electrode at the two sides of the first semiconductor member in the third direction and the two sides of the second semiconductor member in the third direction.

3. The device according to claim 2, further comprising:
a third semiconductor member extending in the second direction and being arranged in the third direction when viewed from the first semiconductor member; and
a fourth semiconductor member extending in the second direction, being arranged in the third direction when viewed from the second semiconductor member, and being arranged in the first direction when viewed from the third semiconductor member,
one portion of the insulating member being disposed between the third semiconductor member and the fourth semiconductor member,
each of the electrode films surrounding the first semiconductor member, the second semiconductor member, the third semiconductor member, the fourth semiconductor member, and the insulating member when viewed from the second direction.

4. The device according to claim 3, wherein a length in the first direction of a first portion of the insulating member is longer than a length in the first direction of a second portion of the insulating member, the first portion being a portion positioned between the second portion and a third portion, the second portion being disposed between the first semiconductor member and the second semiconductor member, the third portion being disposed between the third semiconductor member and the fourth semiconductor member.

5. The device according to claim 1, wherein an outer edge of the first semiconductor member on the electrode film side and an outer edge of the second semiconductor member on the electrode film side when viewed from the second direction are portions of one circle.

6. The device according to claim 1, wherein an outer edge of the first electrode on the electrode film side and an outer edge of the second electrode on the electrode film side when viewed from the second direction are portions of one circle.

7. The device according to claim 1, wherein a distance between the first electrode and the second electrode is longer than a distance between the first semiconductor member and the second semiconductor member.

8. The device according to claim 1, further comprising:
a first interconnect connected to the first semiconductor member but not connected to the second semiconductor member; and
a second interconnect connected to the second semiconductor member but not connected to the first semiconductor member.

9. The device according to claim 1, wherein when viewed from the second direction, an interface between the insulating member and the first semiconductor member and an interface between the insulating member and the first electrode are disposed on a first straight line, and an interface between the insulating member and the second semiconductor member and an interface between the insulating member and the second electrode are disposed on a second straight line.

10. A semiconductor memory device, comprising:
an electrode film including a first portion and a second portion separated from each other along a first direction;
a first insulating member disposed between the first portion and the second portion;
a first semiconductor member and a second semiconductor member extending in a second direction and being disposed at positions having the first insulating member interposed between the positions, the second direction crossing the first direction;
a first electrode disposed between the first portion and the first semiconductor member; and
a second electrode disposed between the second portion and the second semiconductor member,
when viewed from the second direction, an interface between the first insulating member and the first semiconductor member and an interface between the first insulating member and the first electrode being disposed on a first straight line, and an interface between the first insulating member and the second semiconductor member and an interface between the first insulating member and the second electrode being disposed on a second straight line.

11. The device according to claim 10, wherein an outer edge of the first semiconductor member on the first portion side and an outer edge of the second semiconductor member on the second portion side when viewed from the second direction are portions of the same circle.

12. The device according to claim 10, wherein an outer edge of the first electrode on the first portion side and an outer edge of the second electrode on the second portion side when viewed from the second direction are portions of the same circle.

13. The device according to claim 10, further comprising a second insulating member extending in the second direction, contacting the first insulating member, and being arranged in a third direction when viewed from the first insulating member, the third direction crossing a plane including the first direction and the second direction,
a length in the first direction of the second insulating member being longer than a length in the first direction of the first insulating member.

14. The device according to claim 13, wherein a protruding portion is formed in an end portion in the third direction of the second insulating member, a ridgeline of the protruding portion extending in the second direction.

15. A semiconductor memory device, comprising:
a first semiconductor member and a second semiconductor member being separated from each other along a first direction, and extending in a second direction, the second direction crossing the first direction;
an insulating member provided between the first semiconductor member and the second semiconductor member, a length in a third direction of the insulating member being longer than a length in the third direction of the first semiconductor member and longer than a length in the third direction of the second semiconductor member, the third direction crossing a plane including the first direction and the second direction;
an electrode film surrounding a first structure body when viewed from the second direction, the first structure body being made of the first semiconductor member, the insulating member, and the second semiconductor member;
a first electrode provided between the first semiconductor member and the electrode film; and
a second electrode provided between the second semiconductor member and the electrode film.

16. The device according to claim 15, wherein
the first electrode covers, when viewed from the second direction, a region of a side surface of the first semiconductor member other than a region of the side surface of the first semiconductor member opposing the insulating member, and
the second electrode covers, when viewed from the second direction, a region of a side surface of the second semiconductor member other than a region of the side surface of the second semiconductor member opposing the insulating member.

17. The device according to claim 15, further comprising:
a first insulating film disposed between the first structure body and the electrode film, between the first structure body and the first electrode, and between the first structure body and the second electrode; and
a second insulating film provided between a second structure body and the electrode film, the second structure body being made of the first structure body, the first insulating film, the first electrode, and the second electrode.

18. The device according to claim 17, wherein
a third structure body is made of the second structure body and the second insulating film and is multiply arranged to be separated from each other along a plane including the first direction and the third direction,
the electrode film is multiply provided to be separated from each other along the second direction; and
the plurality of third structure bodies pierces the plurality of electrode films.

19. The device according to claim 15, further comprising an insulating plate spreading along a plane and being disposed on the third direction side when viewed from the electrode film, the plane including the first direction and the second direction.

20. A semiconductor memory device, comprising:
an electrode film including a first portion and a second portion being separated from each other along a first direction, and extending along a second direction, the second direction crossing the first direction;
a semiconductor member and an insulating member arranged along the second direction between the first portion and the second portion;
a first charge storage member provided between the first portion and the semiconductor member; and
a second charge storage member provided between the second portion and the semiconductor member,
a protruding portion being provided in an end portion in the second direction of the semiconductor member, the protruding portion extending in the second direction.

21. The device according to claim 20, wherein the protruding portion has two side surfaces curved in concave configurations, and a ridgeline forms a boundary line between the two side surfaces and extends in a third direction, the third direction crossing a plane including the first direction and the second direction.

* * * * *